(12) United States Patent
Ohtsuka et al.

(10) Patent No.: US 8,402,413 B2
(45) Date of Patent: Mar. 19, 2013

(54) WIRING DESIGN APPARATUS AND METHOD

(75) Inventors: Ikuo Ohtsuka, Kawasaki (JP); Takao Yamaguchi, Kawasaki (JP); Eiichi Konno, Kawasaki (JP); Toshiyasu Sakata, Kawasaki (JP); Takahiko Orita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 338 days.

(21) Appl. No.: 12/721,716

(22) Filed: Mar. 11, 2010

(65) Prior Publication Data

US 2010/0235804 A1    Sep. 16, 2010

(30) Foreign Application Priority Data

Mar. 12, 2009   (JP) ................................ 2009-059997

(51) Int. Cl.
*G06F 17/50* (2006.01)
(52) U.S. Cl. ......... 716/126; 716/129; 716/130; 716/137
(58) Field of Classification Search .................. 716/126, 716/129, 130, 137
See application file for complete search history.

(56) References Cited

U.S. PATENT DOCUMENTS

| 4,500,963 | A | * | 2/1985 | Smith et al. ................... 716/103 |
| 2001/0014965 | A1 | | 8/2001 | Hiraga |
| 2001/0047508 | A1 | * | 11/2001 | Miura et al. ...................... 716/8 |

FOREIGN PATENT DOCUMENTS

| JP | 05-183054 | 7/1993 |
| JP | 09-153083 | 6/1997 |
| JP | 11-328247 | 11/1999 |
| JP | 3063828 | 5/2000 |

\* cited by examiner

*Primary Examiner* — Vuthe Siek
(74) *Attorney, Agent, or Firm* — Squire Sanders (US) LLP

(57) ABSTRACT

A wiring design apparatus for designing a plurality of wiring lines of a printed circuit board including a plurality of connection posts arranged in a matrix, includes a processor, the processor providing an orthogonal grid including a plurality of rows and columns running over and between the connection posts, providing a plurality of diagonal paths each connecting at least one of the rows with at least one of the columns each running between each of adjacent pairs of the connection posts, and determining a route for each of the wiring lines by exclusively allocating to each of the wiring lines a selected part of the rows, the columns and the paths so that the selected part connects both ends of each of the wiring lines.

7 Claims, 55 Drawing Sheets

```
CELL DATA {
    attr;    //CELL ATTRIBUTE [S||D||EP||V||H||SB]
    netID;   //NET ID
    exitF;   //EXIT FLAG [true||false]
    x;       //x COORDINATE
    y;       //y COORDINATE
    iN;      //NODE ID OF ENTRY NODE
    oN;      //NODE ID OF EXIT NODE
    cap;     //CAPACITY
    r;       //ROW NUMBER OF CELL
    c;       //COLUMN NUMBER OF CELL
}
```

FIG. 13

```
NODE DATA{
    pID;          //LABEL PROPAGATION SOURCE NODE ID
    dist;         //SHORTEST PATH LENGTH
    cellID;       //CELL ID OF OWNER CELL
    attr;         //NODE ATTRIBUTE [in||out]
    bros;         //BRO NODE ID
    sFlag;        //SOURCE FLAG [true||false]
    tFlag;        //TARGET FLAG [true||false]
    eBros;        //DIRECTED EDGE WITH BRO NODE
    eE;           //DIRECTED EDGE WITH NODE ADJACENT IN EAST
    eW;           //DIRECTED EDGE WITH NODE ADJACENT IN WEST
    eS;           //DIRECTED EDGE WITH NODE ADJACENT IN SOUTH
    eN;           //DIRECTED EDGE WITH NODE ADJACENT IN NORTH
    eNE;          //DIRECTED EDGE WITH NORTH EAST NODE
    eNW;          //DIRECTED EDGE WITH NORTH WEST NODE
    eSE;          //DIRECTED EDGE WITH SOUTH EAST NODE
    eSW;          //DIRECTED EDGE WITH SOUTH WEST NODE
    sourceEdgeList; //LIST OF DIRECTED EDGES FROM SOURCE NODE S
    targetEdgeList; //LIST OF DIRECTED EDGES TO TARGET NODE T
    lFrontF;      //LABEL FRONT FLAG [true||false]
}
```

Fig.24
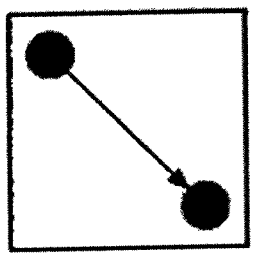 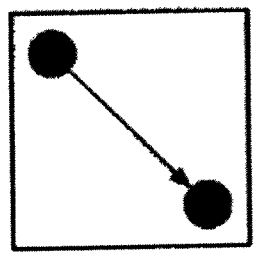 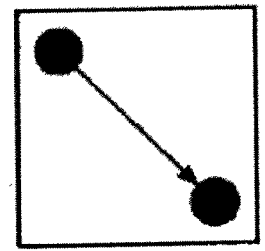
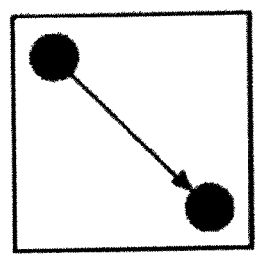 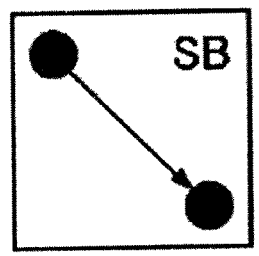 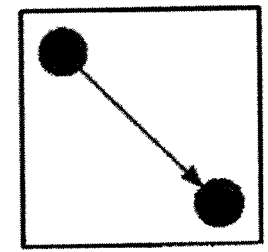
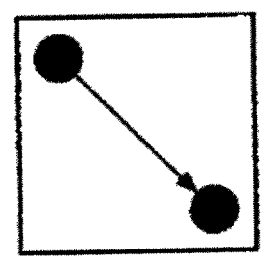 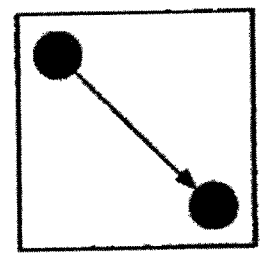 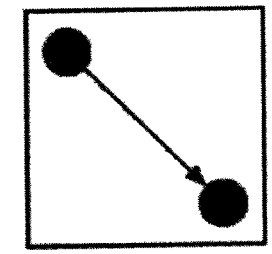

```
EDGE DATA {
    sN;    //START POINT NODE ID
    eN;    //END POINT NODE ID
    eLen;  //EDGE LENGTH
    cap;   //CAPACITY
    flow;  //FLOW
    res;   //RESIDUAL ID
}
```

Fig.28
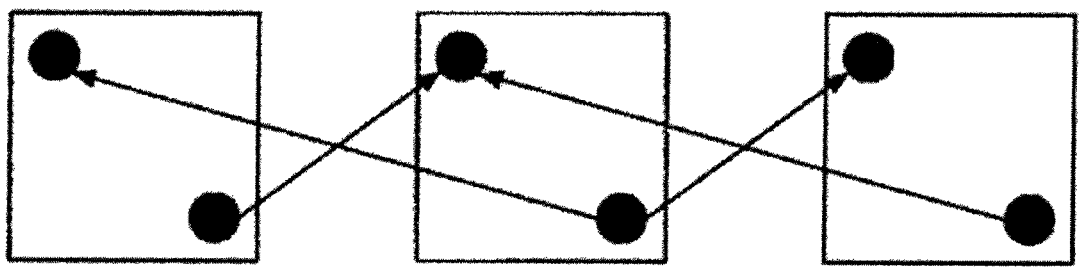
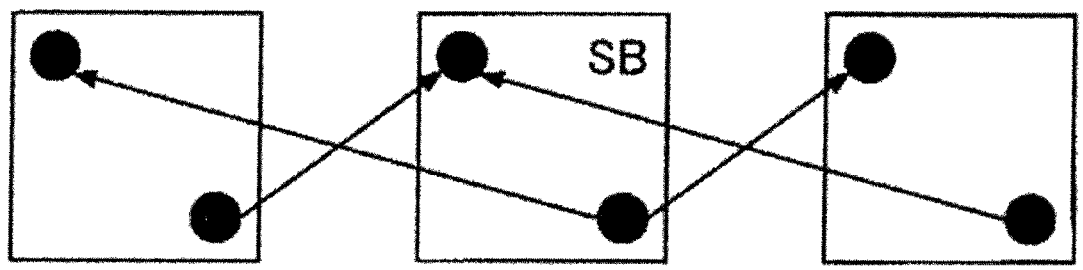
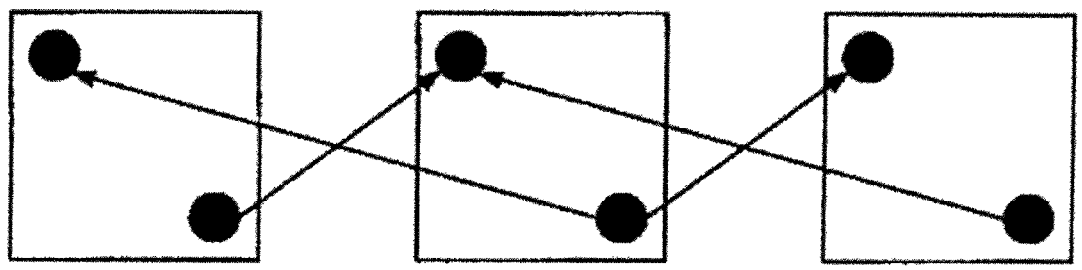

Fig.29
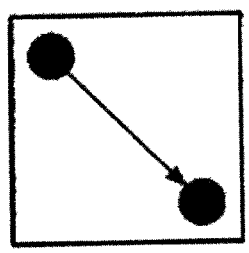
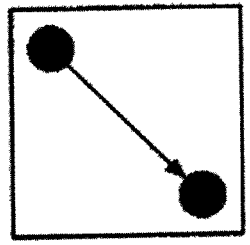
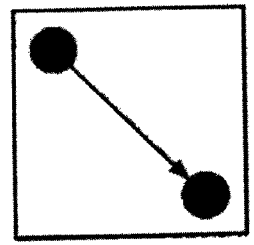
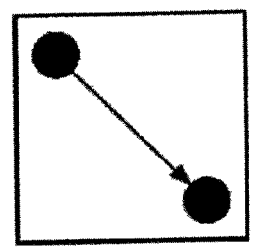
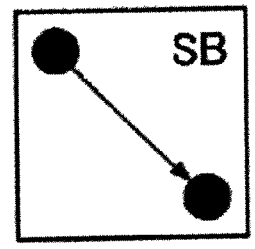
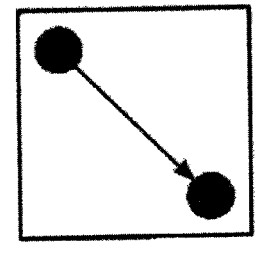
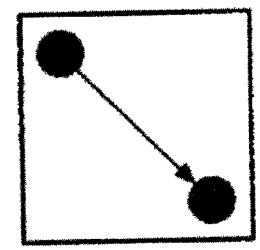
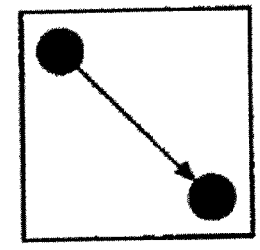
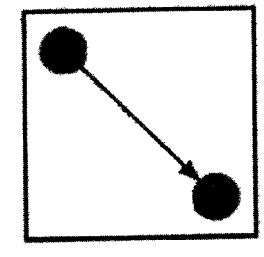

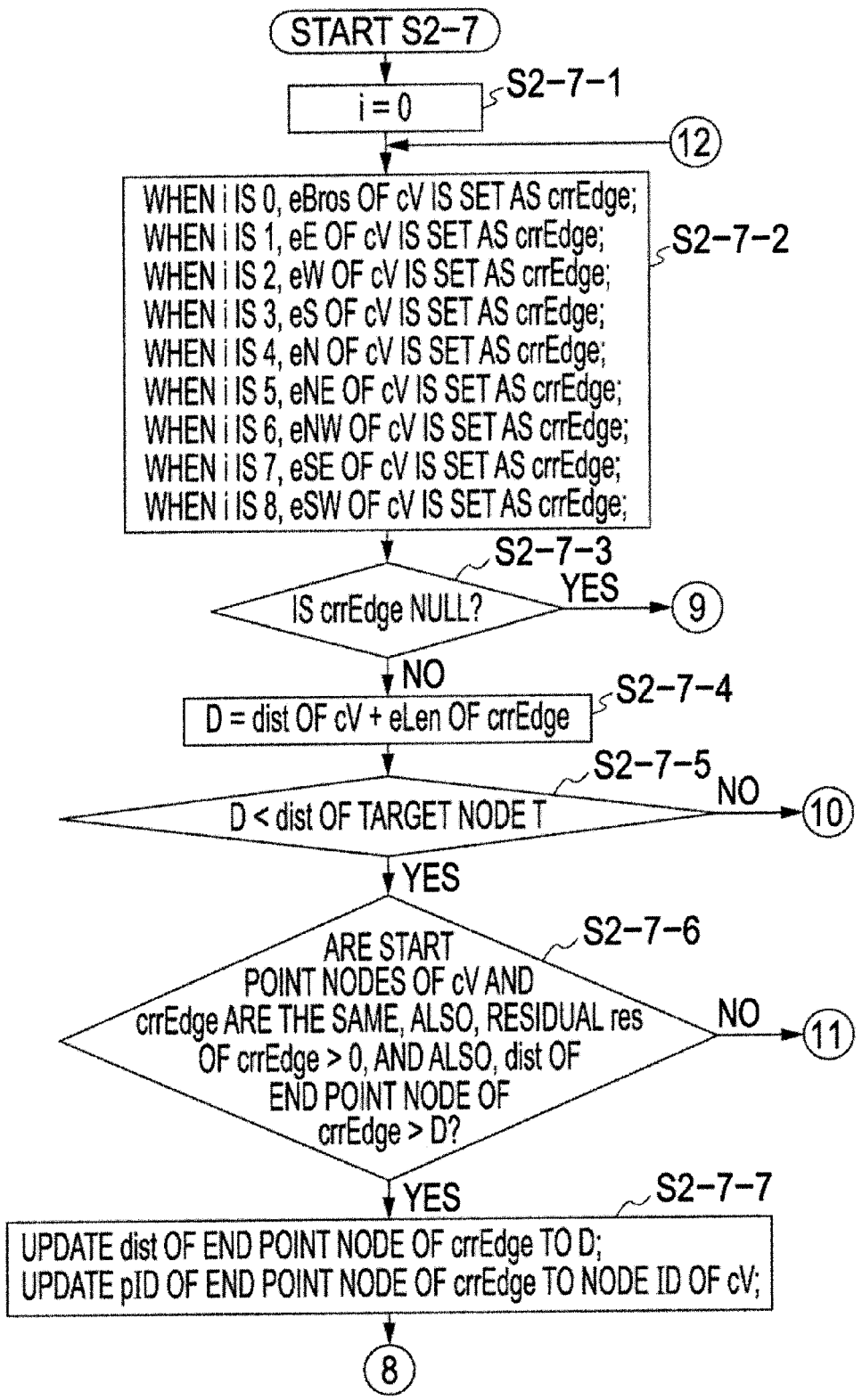

FIG. 46

```
LEADING-OUT ORDER DATA {
    netID;   //NET ID
    order;   //LEADING-OUT ORDER
}
```

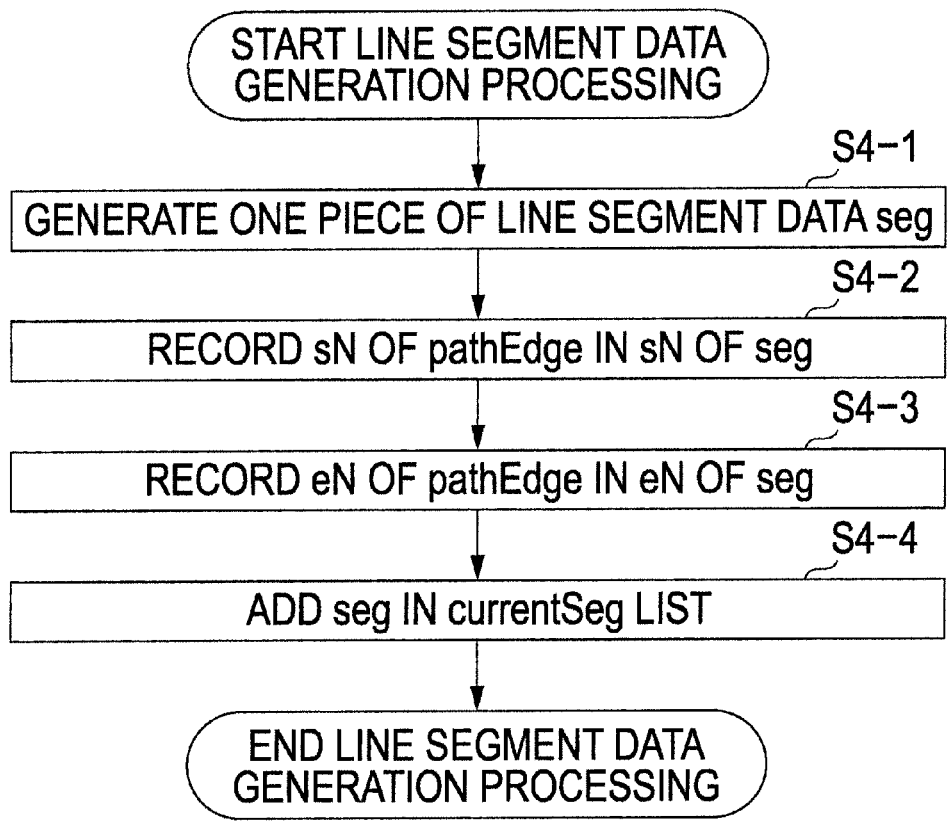

WIRING DESIGN APPARATUS AND METHOD

CROSS-REFERENCE TO RELATED APPLICATION

This application is based upon and claims the benefit of priority of the prior Japanese Patent Application No. 2009-059997, filed on Mar. 12, 2009, the entire contents of which are incorporated herein by reference.

FIELD

The present embodiment relates to a wiring apparatus and method.

BACKGROUND

BGA (Ball Grid Array) is one type of integrated circuit packages. The BGA has a high density of terminals, and therefore a merit of realizing miniaturization even for an integrated circuit having a large number of I/O terminals (pins) is obtained. On the other hand, because of the high density of the terminals, a space between the terminals may be narrow, and a problem occurs that wirings that may be led mutually scramble for the space between the terminals. Such a problem is more prominent as the density of the terminals is higher.

Incidentally, an operation of routing the wirings of the mutual integrated circuit packages on a printed circuit board (PCB) and a routing operation inside the integrated circuit packages are roughly divided into global routing and detailed routing. In the global routing, between which pins the respective wirings pass through, relative positional relations of the respective wirings, and the like are decided. In the detailed routing, on the basis of a result of the global routing, actual routing paths are decided. Hereinafter, the routing path created in the global routing is referred to as "global path".

FIGS. 1A to 1C respectively show methods for the global routing in related art. In the same drawings, respective circles are pins on the BGA. As shown in FIG. 1A, in related art, a wiring area 200 is divided in horizontal and vertical directions in a grid manner while following a certain rule, and the global paths for the wirings are created along this grid. Hereinafter, it may be noted that in the drawings, circles 210, 211, 212, and 213 represent pins, and a grid point 220 with a small circle represents a grid point through which the global paths can pass.

FIG. 1A illustrates a routing example in which two lines of global paths 201 and 202 are created along this grid. However, in this example, no more global paths can be created along this grid. However, if a routing at an angle of 45 or 135 degrees is set for these global paths as shown in FIG. 1B, creation of a third line of a global path 203a indicated by the dotted line can be realized. (Global paths 201a and 202a)

Also, as shown in FIG. 1C, by chipping shapes of pins 210a, 211a, 212a, and 213a in conformity to a shape of the grid, the number of grid points 220 allowing the global routing can be increased. In this case, furthermore, as shown in FIG. 1D, it is also possible to create global paths 201c, 202c, 203c, and 204c corresponding to diagonal paths.

However, according to the method shown in FIGS. 1C and 1D, a problem takes place that a processing of chipping the pins is complicated. Also, the number of the grid points to be searched for is increased in accordance with increase in the number of allowable routings between the pins, and a problem arises that degradation of performance is conspicuous because of increase in memory consumption or calculation amount.

In this manner, the maximum number of wiring lines that can physically pass through between the terminals on the BGA varies depending on routing rules, places where the wirings pass, positional relations of surrounding pins, directions of wirings, and the like, and it is difficult to correctly associate the number of wiring lines that can pass with empty spaces.

SUMMARY

According to an aspect of the embodiment, a wiring design apparatus for designing a plurality of wiring lines of a printed circuit board including a plurality of connection posts arranged in a matrix, includes a processor, the processor providing an orthogonal grid including a plurality of rows and columns running over and between the connection posts, providing a plurality of diagonal paths each connecting at least one of the rows with at least one of the columns each running between each of adjacent pairs of the connection posts, and determining a route for each of the wiring lines by exclusively allocating to each of the wiring lines a selected part of the rows, the columns and the paths so that the selected part connects both ends of each of the wiring lines.

A routing path creation supporting method according to an aspect of the present embodiments includes a bottleneck arrangement procedure for setting at least respective pins of an integrated package, locations between respective horizontal pins, locations between respective vertical pins, and locations between respective diagonal pins as bottleneck locations for wirings and assigning the respective bottleneck locations with wiring capacities in accordance with the locations between respective horizontal pins, the locations between respective vertical pins, or the locations between respective diagonal pins, a node generation procedure for generating two nodes including an entry node and an exit node for each of the bottleneck locations, and a directed graph (Flow network) generation procedure for generating, for each of the bottleneck locations, a directed edge from the entry node to the exit node in the same bottleneck location, generating directed edges reciprocally from the exit nodes on one side to the entry nodes on the other side between the bottleneck locations adjacent in a vertical or horizontal direction, generating directed edges reciprocally from the exit node on one side to the entry node on the other side between the bottleneck locations between the diagonal pins and all the obliquely adjacent bottleneck locations between the diagonal pins, and a directed graph generation procedure for assigning all the generated directed edges with a smallest value of the wiring capacities allocated to the bottleneck locations to which the nodes connected by the directed edges belong as an edge capacity.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 10 illustrates a state in which the cells area generated at the bottleneck locations.

FIG. 11 illustrates a configuration example of cell data.

FIG. 13 illustrates a configuration example of node data.

FIG. 24 illustrates directed edges from entry nodes to exit node of cells.

FIG. 28 illustrates directed edges from the exit nodes to the entry nodes of the cells adjacent in the east and west direction.

FIG. 29 illustrates directed edges from the exit nodes to the entry nodes of the cells adjacent in the north and south direction.

FIG. 46 illustrates a configuration example of leading-out order data.

FIG. 48 is a flow chart for describing a processing procedure of a generation processing for line segment data.

FIG. 49 illustrates a configuration example of the line segment data.

DESCRIPTION OF EMBODIMENT

Figure 1A:
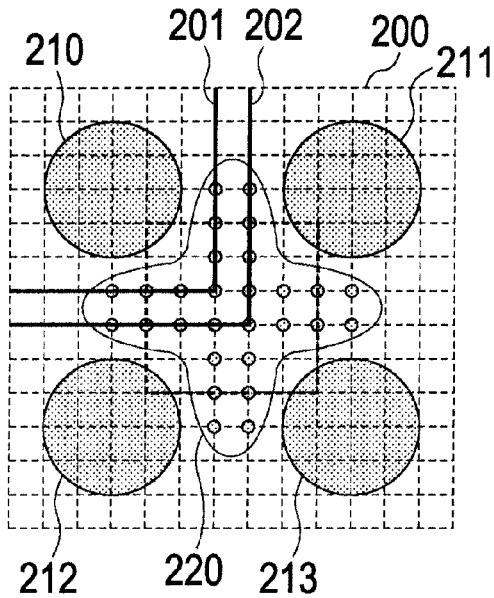
FIG. 1A illustrates a method for a global routing in related art.
Figure 1B:
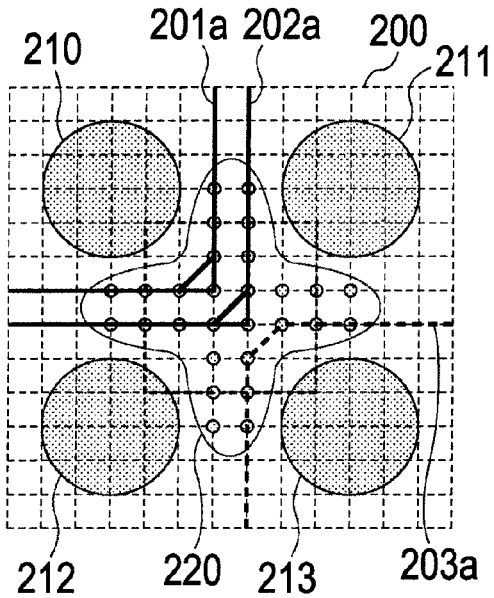
FIG. 1B illustrates a method for the global routing in related art.
Figure 1C:
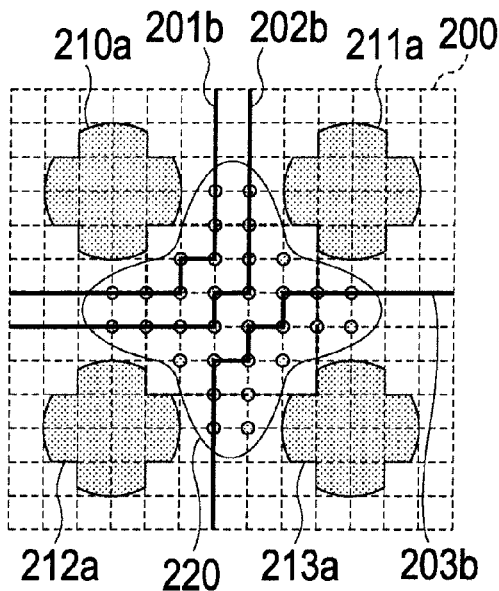
FIG. 1C illustrates a method for the global routing in related art.
Figure 1D:
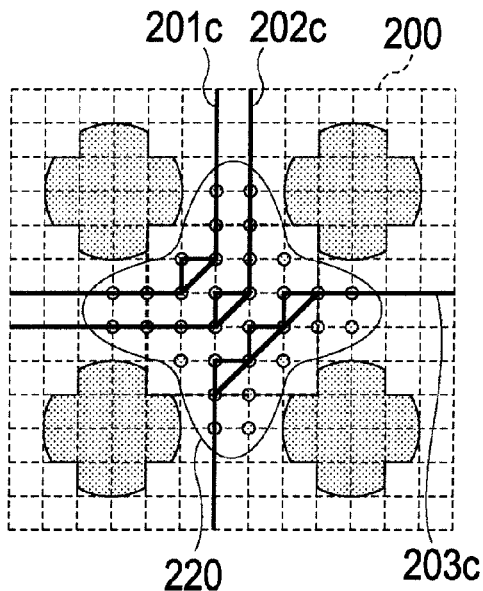
FIG. 1D illustrates a method for the global routing in related art.
Figure 2:
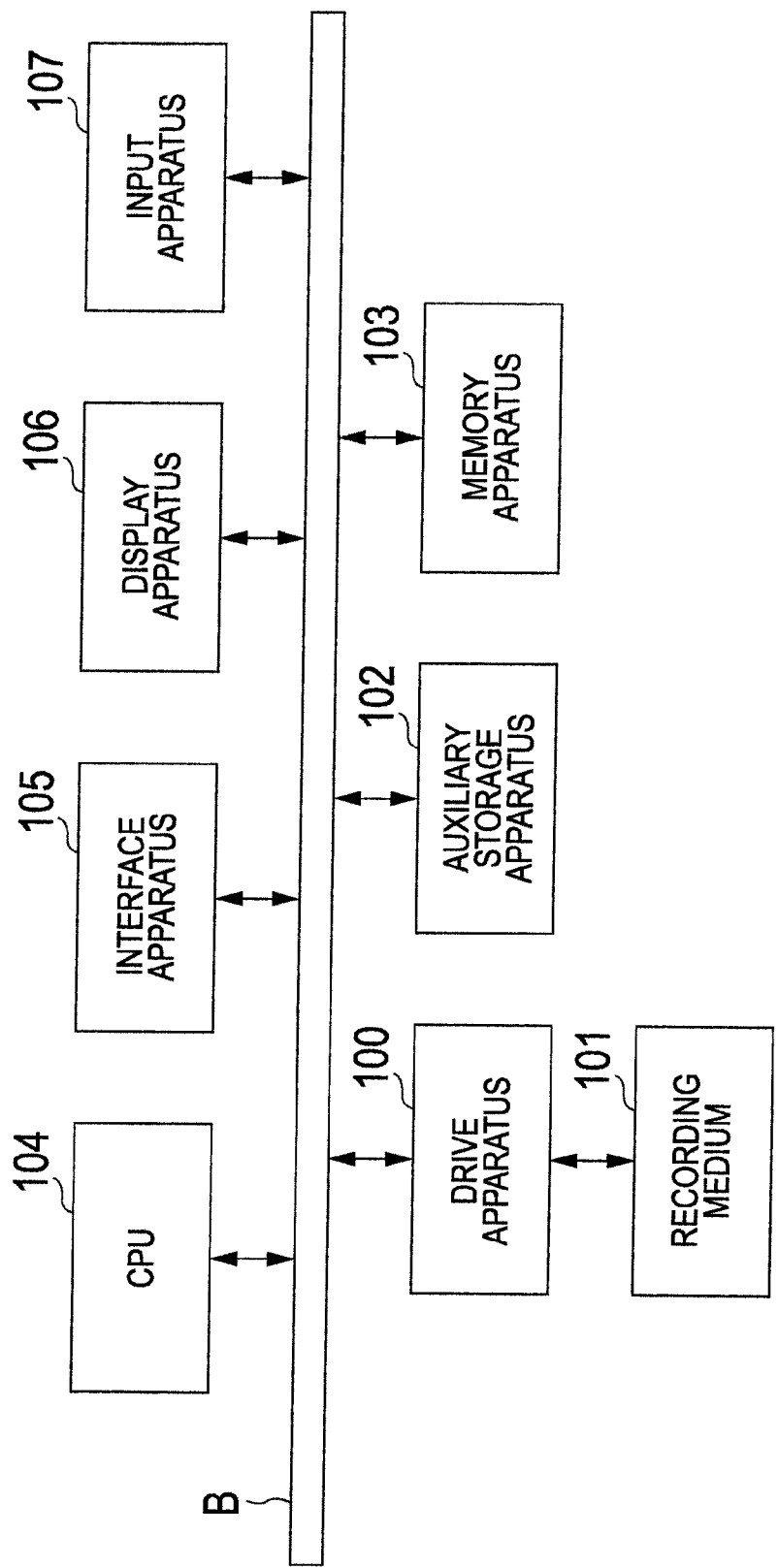
FIG. 2 illustrates a hardware configuration example of a routing path creation supporting apparatus according to an embodiment.

Hereinafter, embodiments will be described on the basis of the drawings. FIG. 2 illustrates a hardware configuration example of a routing path creation supporting apparatus according to an embodiment. A routing path creation supporting apparatus 10 of FIG. 2 includes a drive apparatus 100, an auxiliary storage apparatus 102, a memory apparatus 103, a CPU 104, an interface apparatus 105, a display apparatus 106, and an input apparatus 107 which are mutually connected via a bus B.

A program for realizing a processing in the routing path creation supporting apparatus 10 is provided by way of recording medium 101 such as a CD-ROM. When the recording medium 101 on which the program is recorded is set in the drive apparatus 100, the program is installed from the recording medium 101 via the drive apparatus 100 into the auxiliary storage apparatus 102. It is however noted that install of the program is not necessarily performed by the recording medium 101, and the program may be downloaded from another computer via a network. The auxiliary storage apparatus 102 stores the installed program, files, data, and the like.

In a case where an activation instruction for the program is issued, the memory apparatus 103 reads out the program from the auxiliary storage apparatus 102 to be stored. While following the program stored in the memory apparatus 103, the CPU 104 realizes a function related to the routing path creation supporting apparatus 10. The interface apparatus 105 is used as an interface for connection to the network. The display apparatus 106 is a display apparatus such as a CRT display or a liquid crystal display. The input apparatus 107 is composed of a key board, a mouse, and the like and used for inputting various operational instructions.

Figure 3:
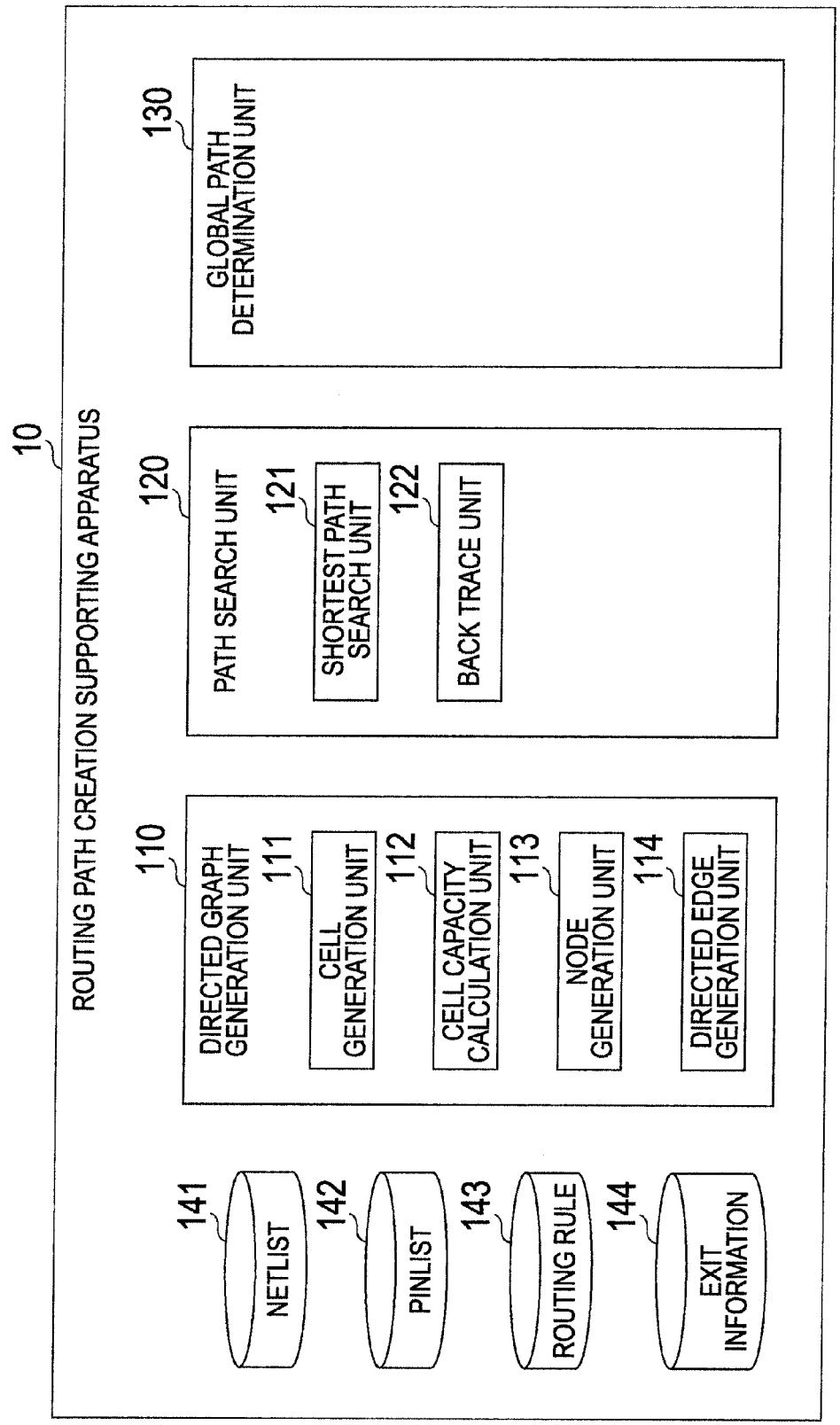
FIG. 3 illustrates a functional configuration example of the routing path creation supporting apparatus according to the embodiment.

FIG. 3 illustrates a functional configuration example of the routing path creation supporting apparatus according to the embodiment. In the same drawing, the routing path creation supporting apparatus 10 includes a directed graph generation unit 110, a path search unit 120, a global path determination unit 130, a net list 141, a pin list 142, a routing rule 143, exit information 144, and the like.

The directed graph generation unit 110 generates a network flow model-based directed graph (Flow network) for executing the global routing. That is, the routing path creation supporting apparatus 10 executes the global routing by applying the network flow model against a routing problem of the BGA (Ball Grid Array). When the network flow model is applied to the routing problem of the BGA, the directed graph generation unit 110 arranges at least bottlenecks (limitations on the number of wirings) for regulating the number of wiring passages at pins (or also referred to as terminals, and hereinafter the terms are unified as "pin"), between horizontal pins (an area sandwiched by two pins adjacent in the horizontal direction also including empty pins), between vertical pins (an area sandwiched by two pins adjacent in the vertical direction also including empty pins), and between diagonal pins (an area surrounded by four pins also including empty pins) on the routing subject BGA. Also, in a case where the empty pin (a part where the pin is not arranged) exists, the bottleneck is also provided at the empty pin. The bottlenecks are subjected to modeling as shown in FIG. 4.

Figure 4:
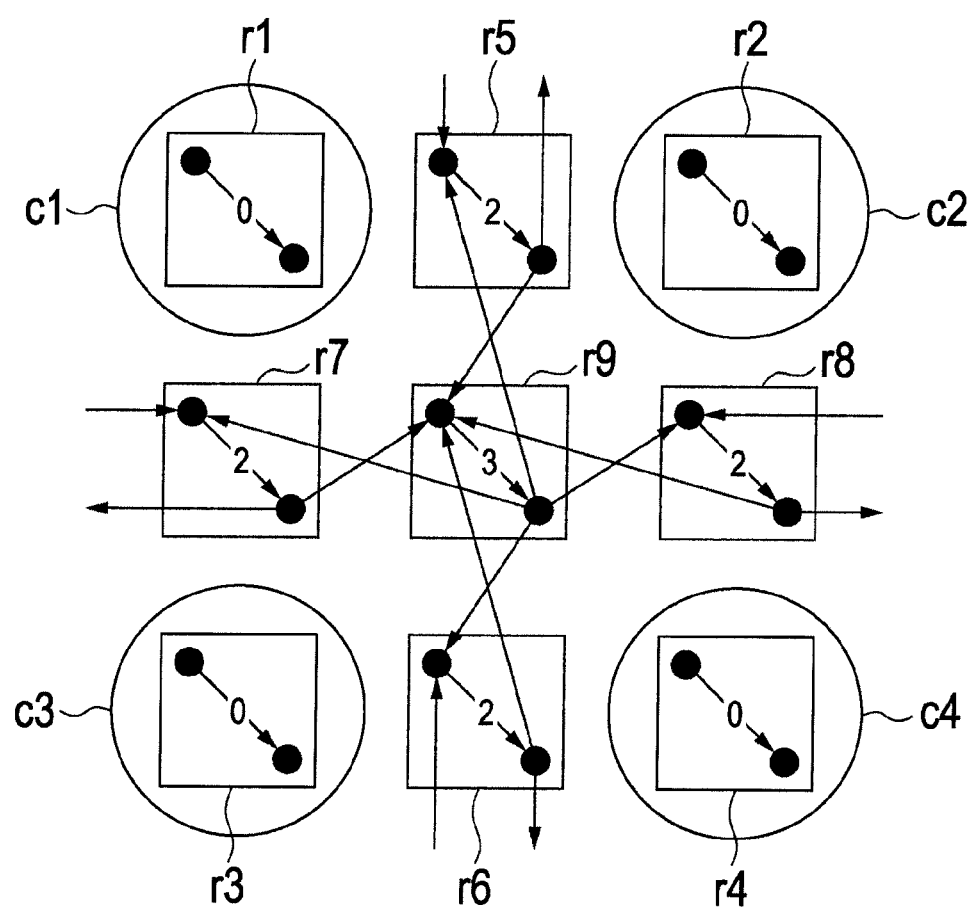
FIG. 4 illustrates a modeling example of bottlenecks provided on the BGA.

FIG. 4 illustrates a modeling example of bottlenecks provided on the BGA. In the same drawing, a part of the BGA is illustrated.

Circles c1 to c4 in the same drawing represent the pins of the BGA model. Rectangles provided at the respective pins (r1 to r4), rectangles (r5 and r6) provided between the horizontal pins, rectangles between the vertical pins (r7 and r8), and rectangles provided between the diagonal pins (r9) represent locations for the bottlenecks. According to the present embodiment, each rectangle is referred to as "cell". The respective cells are assigned with capacities (wiring passage allowable numbers). In the drawing, numeric values in the respective cells denote the capacities assigned to the cells.

The respective cells have two nodes on the diagonal line. The node on the upper left is an entry node, and the node on the lower right is an exit node. While following a predetermined rule, the directed graph generation unit 110 generates directed edges which connect the respective nodes. In the drawing, an arrow connecting between the nodes represents the directed edge. As the directed edges are generated, the directed graph (Flow network) for executing the global routing is generated.

The directed graph generation unit 110 includes a cell generation unit 111, a cell capacity calculation unit 112, a node generation unit 113, a directed edge generation unit 114, and the like. Functions of the respective units will be described with reference to FIG. 9.

The path search unit 120 searches for a shortest path for each of all the leading-out subject wirings in the directed graph (Flow network) generated by the directed graph generation unit 110. The path search unit 120 includes a shortest path search unit 121, a back trace unit 122, and the like. Functions of the respective units will be described with reference to FIGS. 40 and 41.

The global path determination unit 130 distributes the respective paths searched for by the path search unit to the respective routings, so that the leading-out paths (global paths) for the global routing are determined.

The net list 141, the pin list 142, the routing rule 143, the exit information 144, and the like are input information in the global routing and are saved, for example, in the auxiliary storage apparatus 102. The net list 141 includes list information on identifiers of the leading-out subject pins. The pin list 142 includes information on all pins arranged on the routing subject BGA. The routing rule 143 includes various parameters for regulating routing available areas. The exit information 144 includes information for identifying the exit locations for the wirings in the routing subject BGA.

Figure 5:
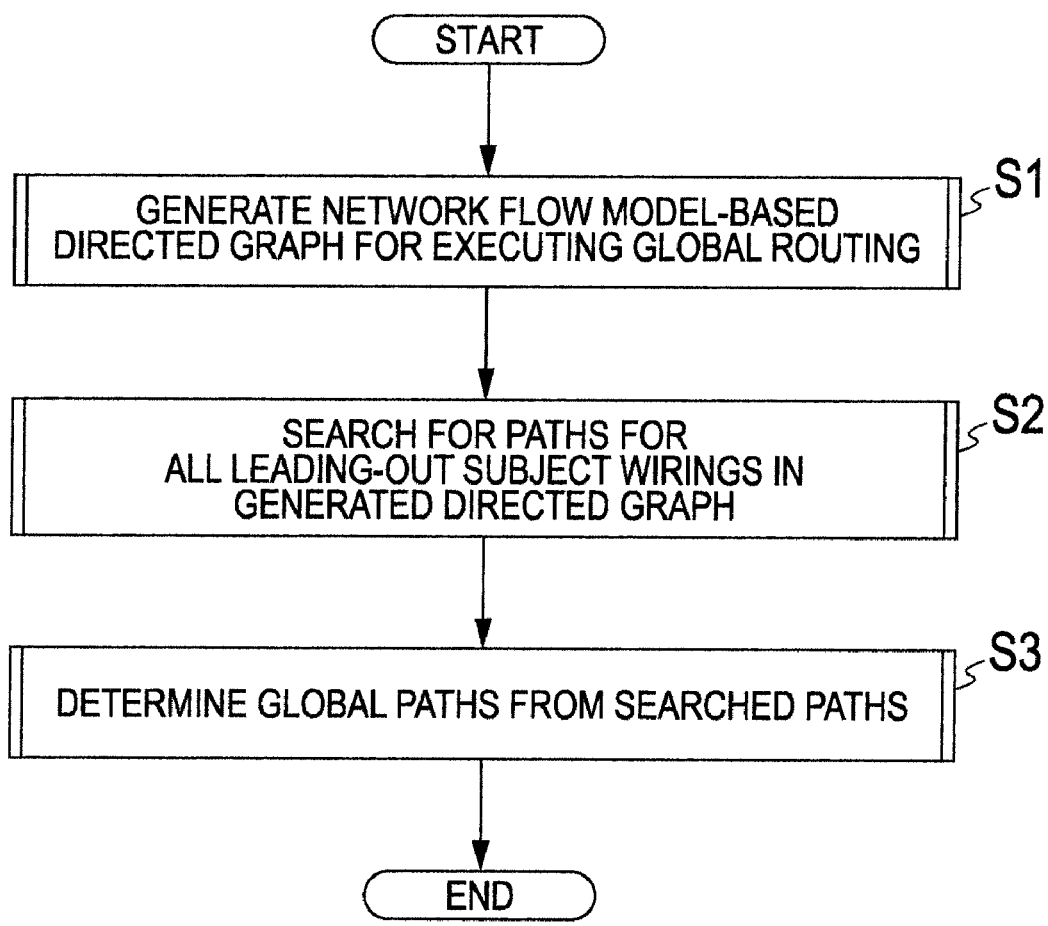
FIG. 5 is a flow chart for describing a processing outline by the routing path creation supporting apparatus.

Process procedure by the routing path creation supporting apparatus will be described. FIG. 5 is a flow chart for describing a processing outline by the routing path creation supporting apparatus.

In step S1, the directed graph generation unit 110 generates a network flow model-based directed graph (Flow network) for executing the global routing.

Figure 6:
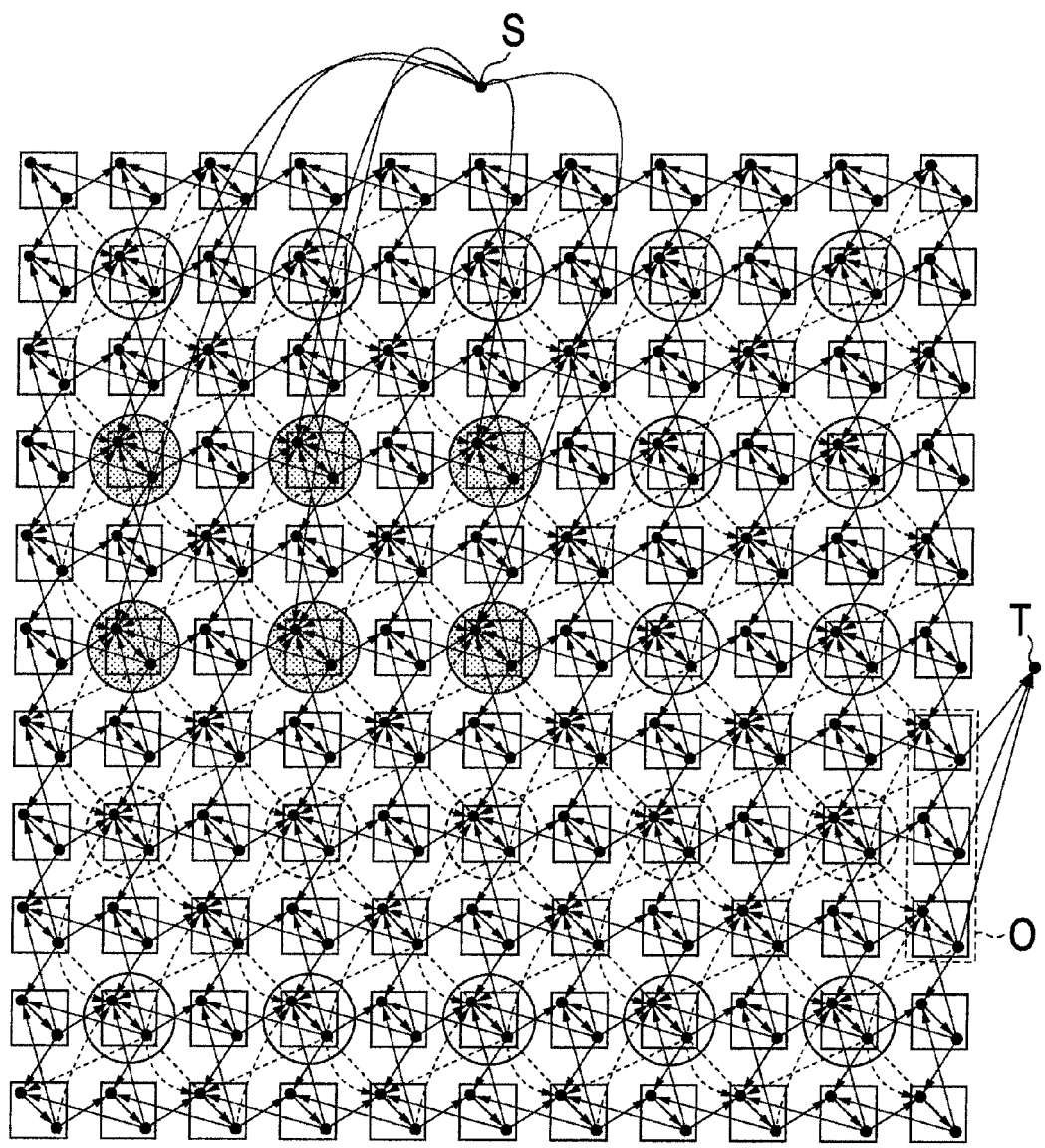
FIG. 6 illustrates an example of a directed graph (Flow network) generated by a directed graph generation unit.

FIG. 6 illustrates an example of the directed graph (Flow network) generated by the directed graph generation unit. That is, the same drawing illustrates processing results of step S1.

In the same drawing, a full line circle represents the pin. A gray circle represents the pin of a wiring leading-out subject (leading-out source) (hereinafter, the pin of a wiring leading-out subject will be referred to as "leading-out subject pin".). A broken line circle represents the empty pin. Also, respective rectangles represent the cells. The same drawing illustrates a generation state of the directed graph (Flow network) in a case where the exit locations for the wirings are limited to exit locations O surrounded by broken lines. The cell included in the exit location O will be hereinafter referred to as "exit cell". In this manner, as the directed edge having a direction from the entry node to the exit node in the cell and the directed edge having from the exit node to the entry node in adjacent another cell are generated, the directed graph (Flow network) is generated. In the drawing, a source node S is a node provided as a start point of the directed graph (Flow network). A target node T is a node provided as an end point of the directed graph (Flow network). It may be noted that the respective edges have capacities in accordance with the capacity of the cell to which the node connected to the relevant directed edge belongs.

Following step S1, the flow advances to step S2, where the path search unit 120 searches for the shortest route for each of all the leading-out subject wirings in the directed graph (Flow network) generated by the directed graph generation unit 110.

Figure 7:
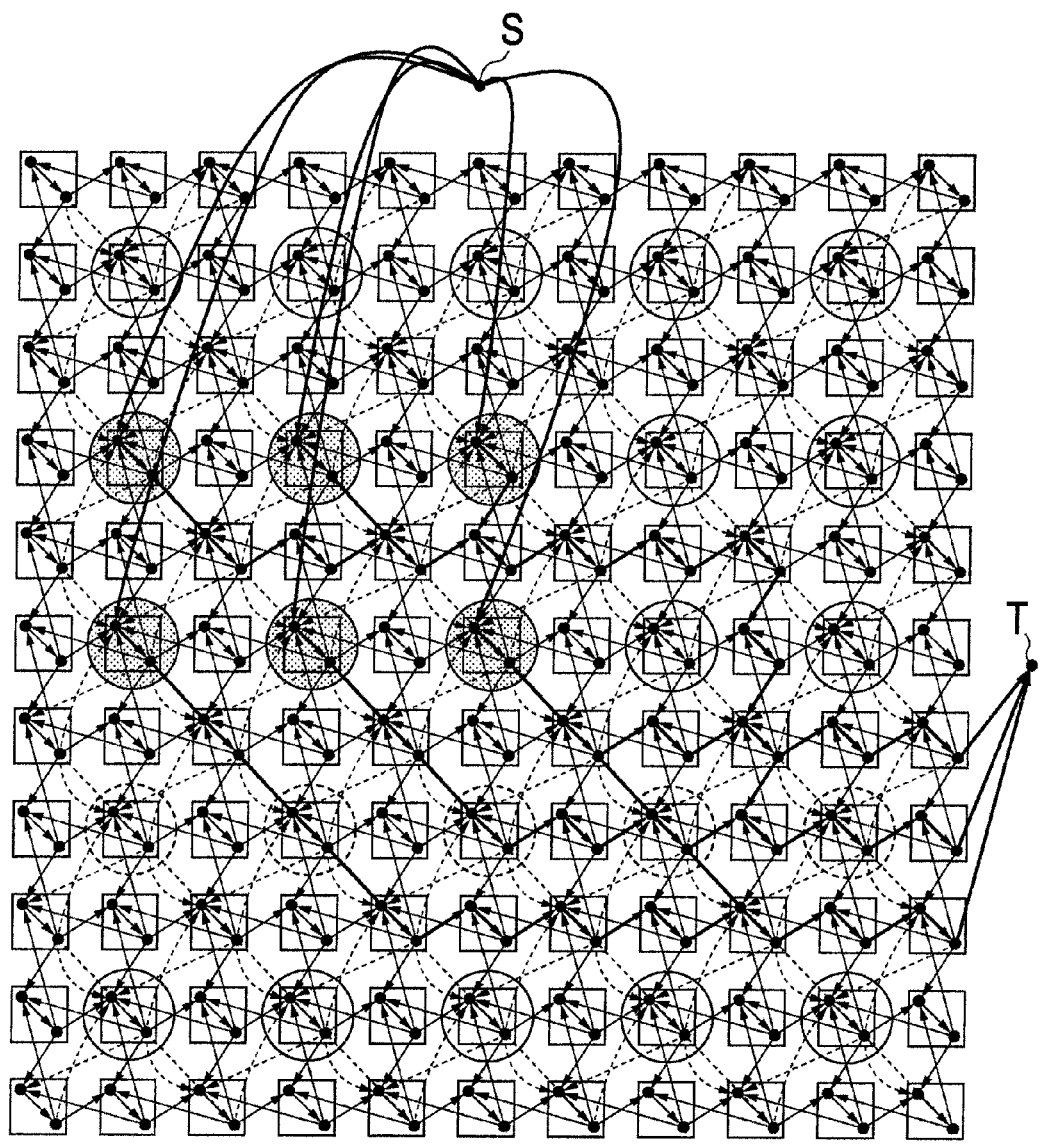
FIG. 7 illustrates an example of a path searched for by a path search unit.

FIG. 7 illustrates an example of a path searched for by the path search unit. That is, the same drawing illustrates a processing result of step S2.

In the same drawing, a thick full line represents a path searched for by the path search unit. According to the present embodiment, a case in which six wirings are demanded is described as an example. Therefore, the paths shown in the same drawing represent paths for six routes. The respective paths starts from the source node S via the entry node of the leading-out subject pin and further via the exit node of the exit cell to reach the target node T. It may be noted that at the termination time of step S2, it is not decided yet as to which wirings own the respective directed edges belonging to the respective paths.

Following step S2, the flow advances to step S3, where the global path determination unit 130 distributes the respective paths searched for by the path search unit 120 to the respective routings and determines the leading-out paths (global paths) of the global routing.

Figure 8:
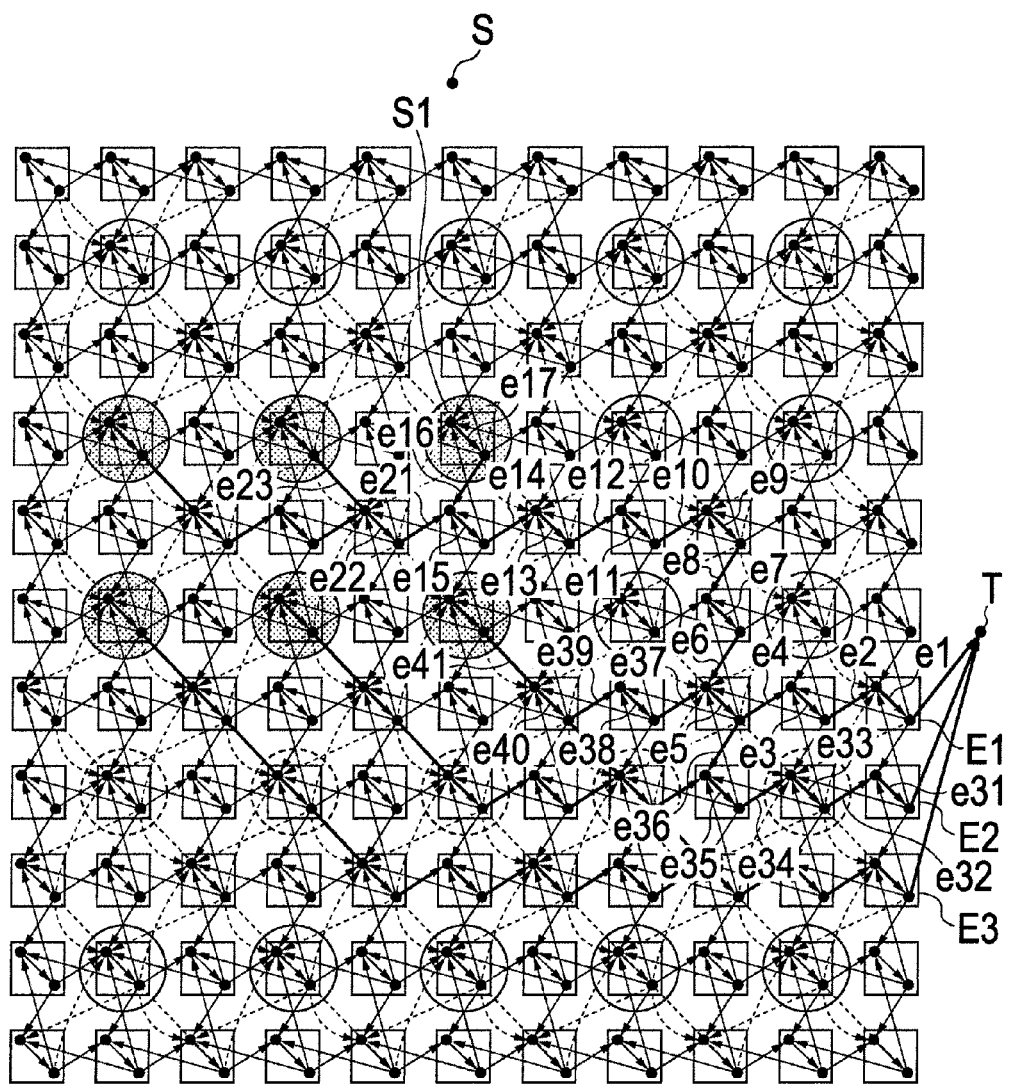
FIG. 8 illustrates an example of a global path determined by a path determination unit.

FIG. 8 illustrates an example of the global path determined by the path determination unit. That is, the same drawing illustrates a processing result of step S3. In the same drawing, the directed edge assigned with a symbol en (n is an integer) is a directed edge through which the determined global path passes. For convenience, the same drawing illustrates a state in which three global paths are determined.

With the above-mentioned processing procedure, the routing path creation supporting apparatus 10 automatically executes the global routing of the BGA. Hereinafter, a description will be given of details of the respective steps.

Figure 9:
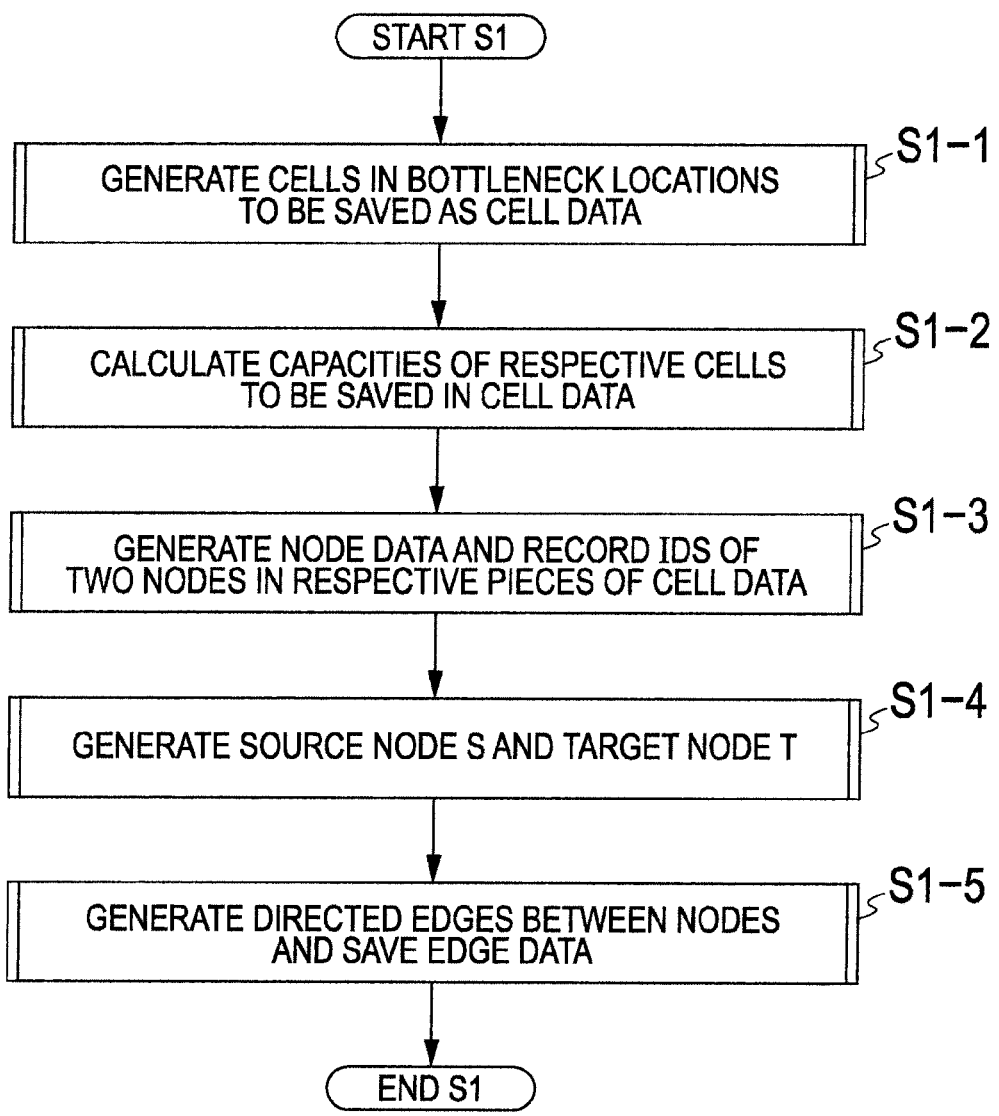
FIG. 9 is a flow chart for describing a processing procedure of a directed graph (Flow network) generation processing by the directed graph generation unit.

First, a description will be given of a detail of step S1. FIG. 9 is a flow chart for describing a processing procedure of the directed graph (Flow network) generation processing by the directed graph generation unit.

In step S1-1, the cell generation unit 111 generates the cells in the bottleneck locations on the BGA and saves data indicating the cells (cell data) in the auxiliary storage apparatus 102. According to the present embodiment, the bottleneck locations correspond to the pins, the locations between the horizontal pins, the locations between the vertical pins, the locations between the diagonal pins, and the empty pins. Therefore, the cell data corresponding to these locations is generated.

Figure 10:
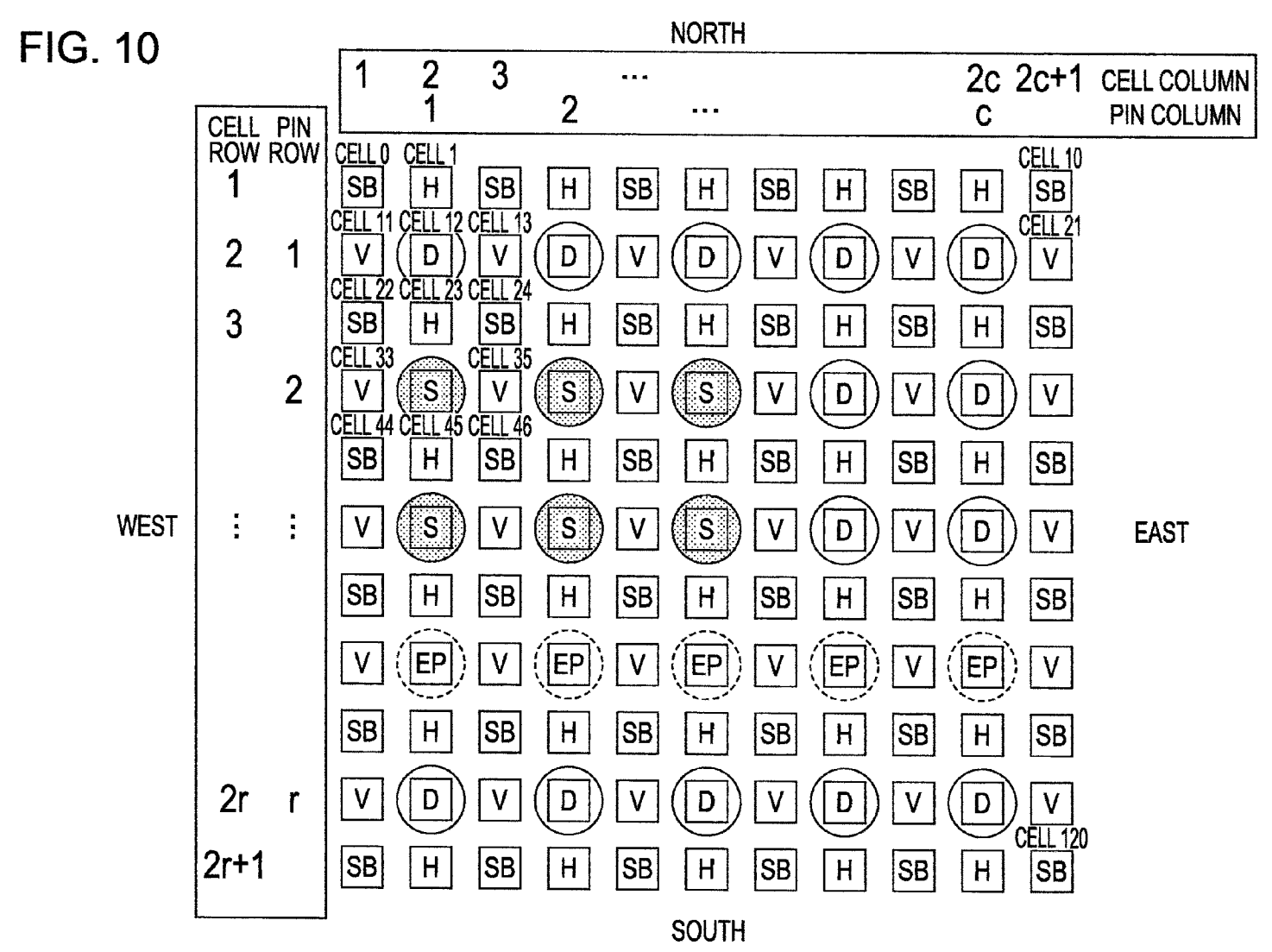

FIG. 10 illustrates a state in which the cells area generated at the bottleneck locations. A notational system of the same drawing is similar to that of FIG. 6. In the same drawing, row numbers and column numbers in cell rows and cell columns (cell matrix) and pin rows and pin columns (pin matrix) are illustrated. That is, the positions of the respective cells are managed by the row numbers of the cell rows and the column numbers of the cell columns. Also, the positions of the respective pins are managed by the row numbers of the pin rows and the values of the pin columns. It may be noted that according to the present embodiment, directions of the cell matrix or the pin array are distinguished by north, south, east and west. In the drawing, the right direction is set as east, the left direction is set as west, the up direction is set as north, and the down direction is set as south. It is however noted that such orientation is for relative and also descriptive purposes, and north, south, east and west may be allocated to any directions.

FIG. 11 illustrates a configuration example of the cell data. In the same drawing, the cell data is defined as a structure. It may be appropriately selected as to which substance realizes the cell data and other data without limiting the structure to the cell data.

In the same drawing, the cell data includes member variables (data items) such as a cell attribute (attr), a net ID (netID), an exit flag (exitF), an x coordinate (x), a y coordinate (y), a node ID of the entry node (iN), a node ID of the exit node (oN), a capacity (cap), a row number of the cell (r), and a column number of the cell (c) (a member variable name is described in parentheses.).

The cell attribute (attr) is an attribute indicating which one of the bottleneck locations the respective cells correspond to. "S" denotes a cell located at the leading-out subject pin. "EP" denotes a cell located at the empty pin. "D" denotes a cell located at the ordinary pin (pin except for the leading-out subject pin or the empty pin). "V" denotes a cell located between the horizontal pins. "H" denotes a cell located between the vertical pins. "SB" denotes a cell located between the diagonal pins. In the respective cells of FIG. 10, values of the cell attribute are described. As also apparent from FIG. 10, according to the present embodiment, a location (cell) adjacent in the east of the pin in the east end column (cell) and a location (cell) adjacent in the west of the pin in the west end column are also set as the location between the horizontal pins (V). Also, a location (cell) adjacent in the north of the pin in the north end row and a location (cell) adjacent in the south of the pin in the south end row are also set as the location between the vertical pins (H). Also, an (obliquely adjacent) location (cell) obliquely in contact with the outer circumferential side of the BGA with respect to the pin in the east end column, the pin in the west end column, the pin in the north end row, or the pin in the south end row is also set as the location between the diagonal pins (SB). It may be noted that according to the present embodiment, a reason for indicating the location between the horizontal pins by "V" and the location between the vertical pins by "H" is that for the arrangement of the cells, the locations between the horizontal pins are arranged in the vertical direction and the locations between the vertical pins are arranged in the horizontal direction.

The net ID (netID) is a member variable which is valid regarding the cell located at the leading-out subject pin, and an identifier (net ID) of the wiring led out from the relevant leading-out subject pin is registered. The exit flag (exitF) is a member variable indicating whether or not the cell is an outer circumferential cell in the cell matrix of FIG. 10. For the cell located on the outer circumference, true is registered, and the cell which is not located on the outer circumference, false is registered. The x coordinate (x) is an x coordinate value at a predetermined position (for example, upper left apex) of the cell in a relative coordinate system on the BGA. The y coordinate (y) is a y coordinate value at a predetermined position of the cell in the relative coordinate system on the BGA. It may be noted that the relative coordinate system on the BGA is, for example, a coordinate system in which the upper left apex of the BGA is set as an origin and the unit is set as millimeter. The node ID of the entry node (iN) is an identifier of the entry node of the cell (node ID). The node ID of the exit node (oN) is an identifier of the exit node of the cell (node ID). The capacity (cap) is a capacity of the cell, that is, the wiring passage allowable number. The row number of the cell (r) is a row number of the cell row where the cell is located. The column number of the cell (c) is a column number of the cell column where the cell is located.

One piece of the cell data corresponds to one cell. Therefore, in step S1-1, the cell data is generated by the number corresponding to the number of the cells.

Then, the cell capacity calculation unit 112 calculates the capacities of the respective cells on the basis of the routing rule 143 or the like and records a calculation result in the capacity (cap) of the cell data (S1-2).

Then, the node generation unit 113 generates data indicating nodes for each cell (node data) in the auxiliary storage apparatus 102 and records node IDs of the respective pieces of node data corresponding the node ID of the entry node and the node ID of the exit node of the respective pieces of the cell data (S1-3). Then, the node generation unit 113 generates node data on the source node S and node data on the target node T (S1-4).

Figure 12:
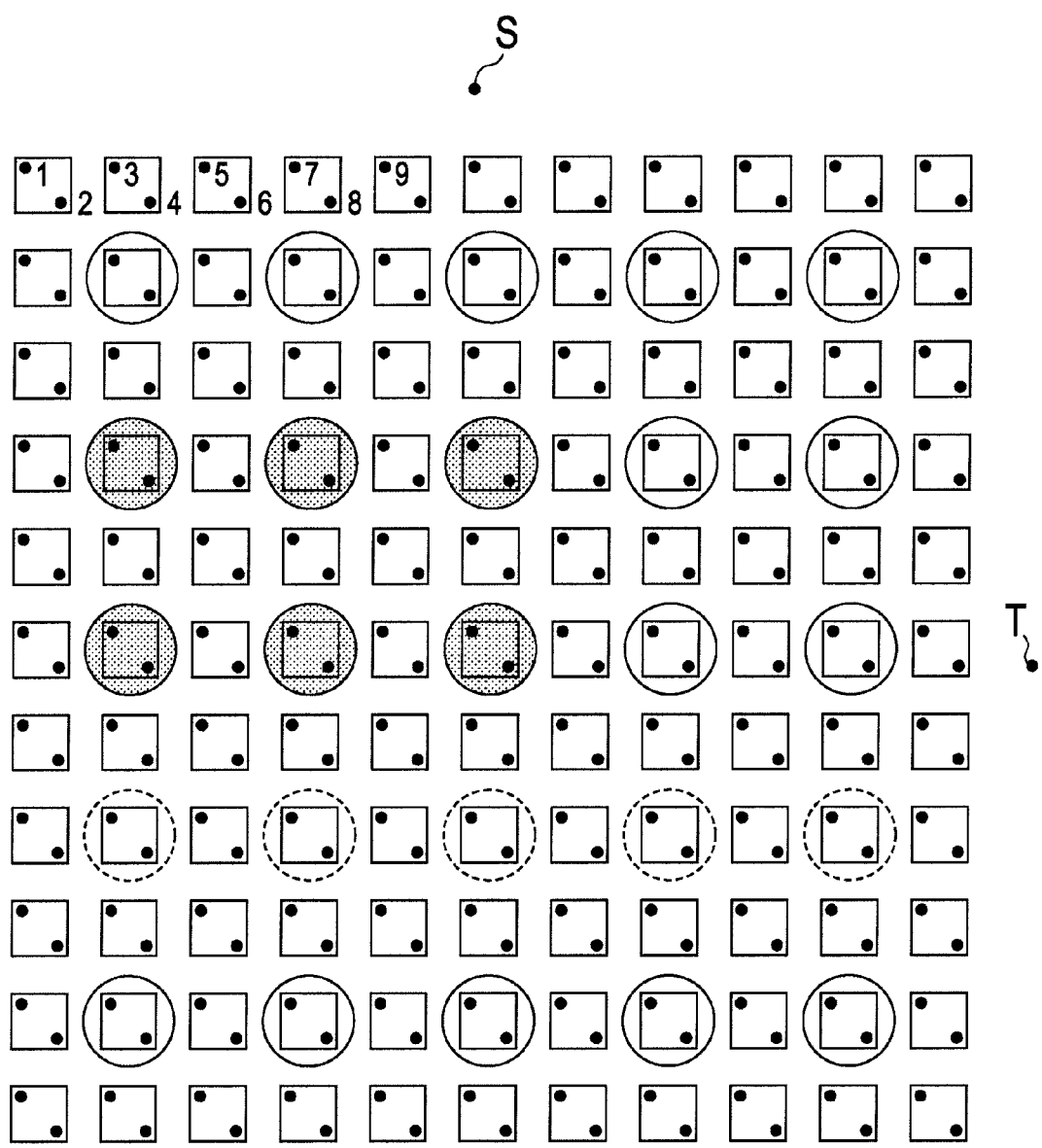
FIG. 12 illustrates a state in which nodes are generated.

FIG. 12 illustrates a state in which nodes are generated. In the same drawing, points respectively representing the entry nodes and the exit nodes of the respective cells are illustrated. Also, points respectively representing the source node S and the target node T are illustrated.

Also, FIG. 13 illustrates a configuration example of node data. In the same drawing, the node data includes member variables (data items) such as a label propagation source node ID (pID), a shortest path length (dist), a cell ID of an owner cell (cellID), a node attribute (attr), a bro node ID (bros), a source flag (sFlag), a target flag (tFlag), a directed edge with the bro node (eBros), a directed edge with the node of the cell adjacent in the east (eE), a directed edge with the node of the cell adjacent in the west (eW), a directed edge with the node of the cell adjacent in the south (eS), a directed edge with the node of the cell adjacent in the north (eN), a directed edge with the node of the north east cell (eNE), a directed edge with the node of the north west cell (eNW), a directed edge with the node of the south east cell (eSE), a directed edge with the node of the south west cell (eSW), a list of the directed edges from the source node S (sourceEdgeList), a list of the directed edges to the target node T (targetEdgeList), and a label front flag (lFrontF).

The label propagation source node ID (pID) is a node ID of a propagation source of the label in the path search (parent node). The shortest path length (dist) is a shortest path length from the entry node of the leading-out subject cell to the relevant node. The cell ID of the owner cell (cellID) is an identifier of a cell (owner cell) to which the relevant node belongs (cell ID). The node attribute (attr) is an attribute indicating the entry node or the exit node where "in" indicates the entry node and "out" indicates the exit node. The bro node ID (bros) is a node ID of the other node (bro node) in the same cell. The source flag (sFlag) is a member variable indicating whether the node is the entry node of the source node S or the leading-out cell (true) or not (false). The target flag (tFlag) is a member variable indicating whether the node is the target node T or the exit node of the exit cell (true) or not (false).

The edge with the bro node (eBros) is data on the directed edge generated with the bro node (edge data). The directed edge with the node of the cell adjacent in the east (eE) is data on the directed edge generated with the cell adjacent on the east side (east adjoining cell). The directed edge with the node of the cell adjacent in the west (eW) is data on the directed edge generated with the cell adjacent on the west side (west adjoining cell). The directed edge with the node of the cell adjacent in the south (eS) is data on the directed edge generated with the cell adjacent on the south side (south adjoining cell). The directed edge with the node of the cell adjacent in the north (eN) is data on the directed edge generated with the cell adjacent on the north side (north adjoining cell). The directed edge with the node of the north east cell (eNE) is data on the directed edge generated with the cell adjacent on the north east side (north east cell). The directed edge with the node of the north west cell (eNW) is data on the directed edge generated with the cell adjacent on the north west side (north west cell). The directed edge with the node of the south east cell (eSE) is data on the directed edge generated with the cell adjacent on the south east side (south east cell). The directed edge with the node of the south west cell (eSW) is data on the directed edge generated with the cell adjacent on the south west side (south west cell).

The list of the directed edges from the source node S (sourceEdgeList) is a list of the edge data on the directed edges from the source node S to the entry node of the leading-out subject cell, and this list is valid in the node data on the source node S. The list of the directed edges to the target node T (targetEdgeList) is a list of the edge data on the directed edges from the exit node of the exit cell to the target node T, and this list is valid in the node data on the target node T. The label front flag (lFrontF) is a flag indicating whether or not the node is a node at a forefront (label front) of the path search.

Then, the directed edge generation unit 114 generates the directed edge between the nodes and saves the edge data indicating on the relevant directed edge in the auxiliary storage apparatus 102 (S1-5). When step S1-5 is ended, a state shown in FIG. 6 is established.

Figure 14:
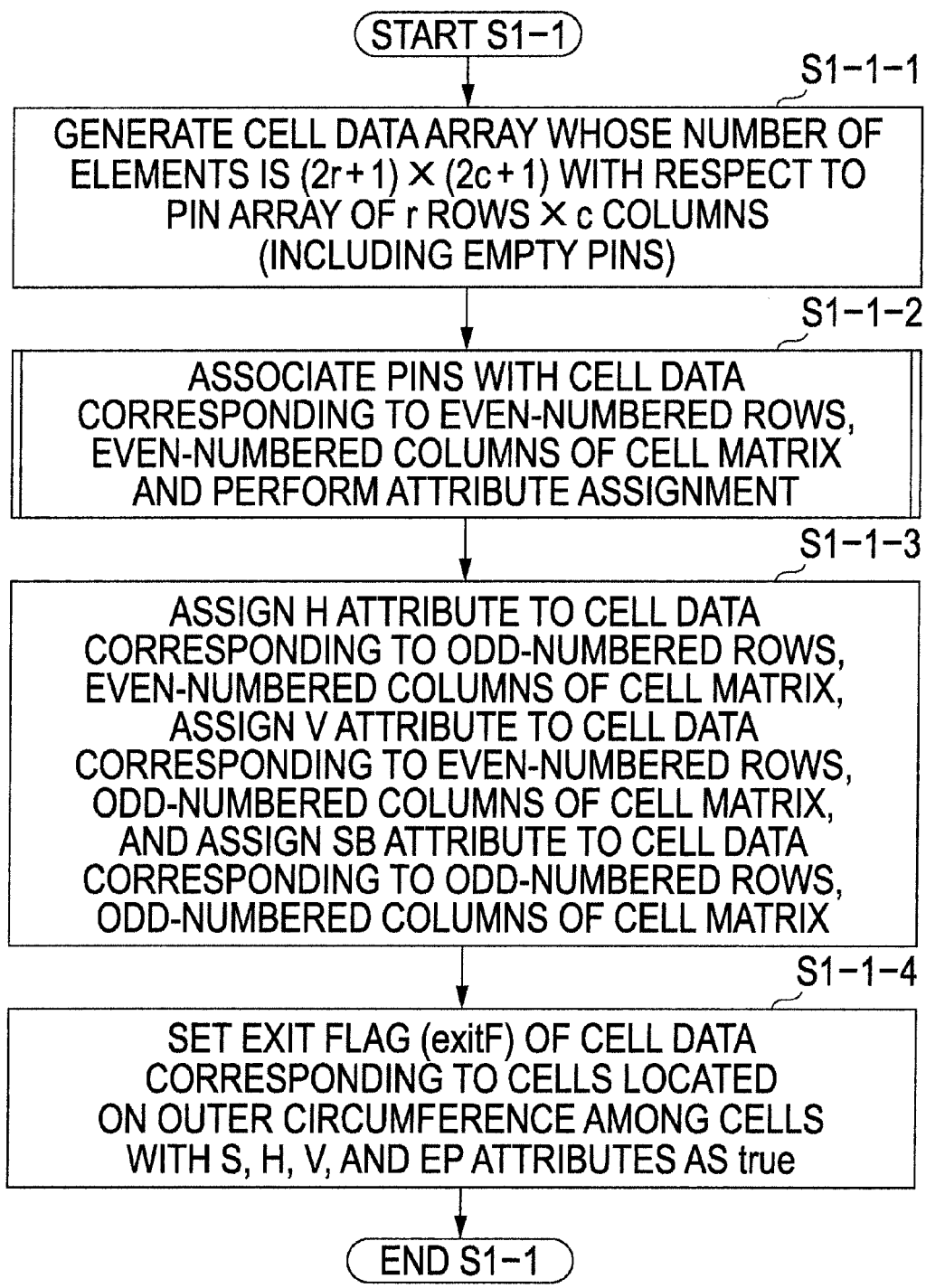
FIG. 14 is a flow chart for describing a processing procedure of a generation processing for a cell.

Subsequently, a description will be given of a detail of step S1-1. FIG. 14 is a flow chart for describing a processing procedure of a generation processing for the cell.

In step S1-1-1, the cell generation unit 111 generates an array of cell data (cell data array "cell") in the auxiliary storage apparatus 102. The number of elements in the cell data array cell is set as $(2r+1) \times (2c+1)$ in a case where the number of rows of the pins is r and the number of columns of the pins is c. The number of rows and the number of columns of the pins are judged on the basis of the pin list 142. The cell generation unit 111 records the row number of the cell (r) and the column number of the cell (r) in the respective pieces of cell data included in the cell data array cell as an element. It may be noted that the cell data array cell may be a two-dimensional array, but according to the present embodiment, is set as a one-dimensional array. Also, for convenience, the cell data in a processing described below refers to cell data generated in the auxiliary storage apparatus 102, but the cell data may be generated in the memory apparatus 103 while taking into account a processing performance, and the relevant cell data may be set as a processing subject. In this case, the cell data may be saved in the auxiliary storage apparatus 102 until the end of step S3. A manner of dealing with the node data and the edge data is also similar.

Then, the cell generation unit 111 associates the cell data on the cell located in an even-numbered row, an even-numbered column of the cell array with the pins (also including the empty pins.) to assign the cell attribute (S1-1-2).

Then, the cell generation unit 111 assigns the cell data on the respective cells located in an odd-numbered row, an even-numbered column, an even-numbered row, an odd-numbered column, and an odd-numbered row, an odd-numbered column of the cell array with an H attribute, a V attribute, or SB attribute (S1-1-3). That is, in the cell attribute of the cell data on the cell in an odd-numbered row, an even-numbered column, "H (between the vertical pins)" is recorded. Also, in the cell attribute of the cell data on the cell in an even-numbered row, an odd-numbered column, "V (between the horizontal pins)" is recorded. Furthermore, in the cell attribute of the cell data on the cell in an odd-numbered row, an odd-numbered column, "SB (between the diagonal pins)" is recorded.

Then, the cell generation unit 111 sets the value of the exit flag of the cell data (exitF) corresponding to the cell located on the outer circumference in the cell array as true and sets the value of the exit flag of the cell data (exitF) corresponding to the cell which is not located on the outer circumference as false in the cell data where the value of the cell attribute is "S", "H", "V", or "EP" among the cells (S1-1-4).

Figure 15:
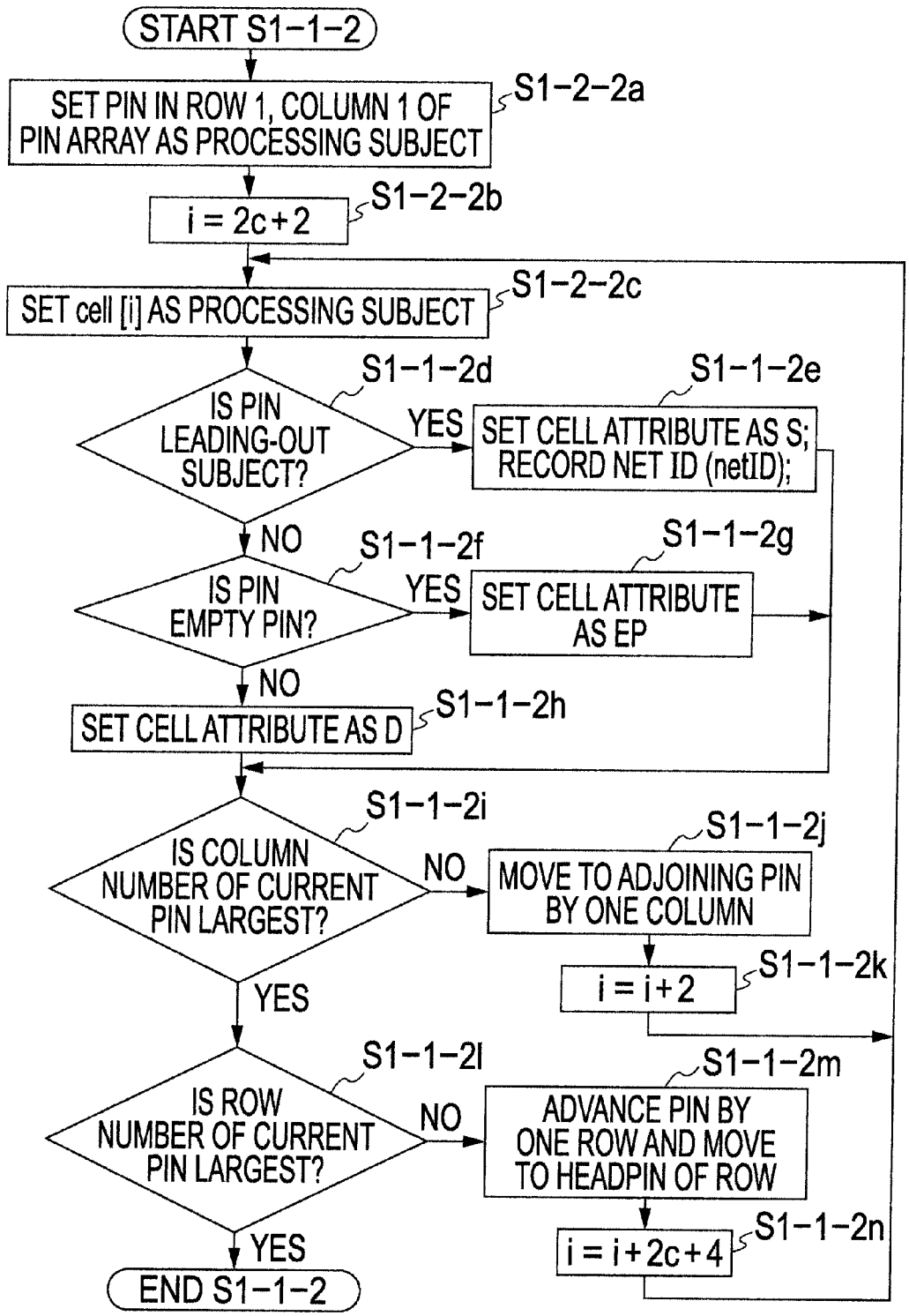
FIG. 15 is a flow chart for describing a processing procedure of a processing on cell data on the cell located in an even-numbered row, an even-numbered column.

Then, a description will be given of a detail of step S1-1-2. FIG. 15 is a flow chart for describing a processing procedure of a processing on cell data on the cell located in an even-numbered row, an even-numbered column.

In step S1-1-2a, the cell generation unit 111 obtains the pin data corresponding to row 1, column 1 of the pin array from the pin data registered in the pin list 142 to be set as the processing subject. In the pin list 142, the pin data is registered for each of the pins on the routing subject BGA. Each piece of the pin data includes the identifier of the pin (pin ID), the position on the pin matrix (the row number and the column number), the position in the relative coordinate system on the BGA (the x coordinate and the y coordinate), information on whether or not the pin is an empty pin, and the like. Also, the pin data corresponding to the leading-out subject pin includes the net ID (identifier of the leading-out wiring).

Then, the cell generation unit 111 initializes the value of the variable i to 2c+2 (S1-1-2b). Herein, c is the number of columns of the pins. Therefore, 2c+1 corresponds to the number of columns of the cells. In that case, 2c+2 is a suffix with respect to the element (cell data) in row 2, column 2 in the cell data array cell. It may be noted that an origination of the suffix is set as 0 (0 origin). Then, the cell generation unit 111 sets the element (cell data) whose suffix is i in the cell data array cell as the processing subject (S1-1-2c).

Then, the cell generation unit 111 judges whether or not the pin related to the relevant pin data is a leading-out subject on the basis of the pin data of the processing subject and the net list 141 (S1-1-2d). In the net list 141, a list of the pin IDs of the leading-out subject pins is registered. Therefore, the cell generation unit 111 can perform the above-mentioned judgment depending on whether or not the pin ID of the pin data of the processing subject is registered in the net list 141 as the pin ID of the leading-out subject pin.

In a case where the pin related to the pin data of the processing subject is the leading-out subject pin (S1-1-2d: Yes), the cell generation unit 111 records "S (the leading-out subject pin)" in the cell attribute (attr) of the processing subject cell data and records the net ID registered in the pin data of the processing subject in the net ID (netID) (S1-1-2e). In a case where the pin related to the pin data of the processing subject is not the leading-out subject pin (S1-1-2d: No), the cell generation unit 111 judges whether or not the relevant pin is an empty pin on the basis of the relevant pin data (S1-1-2f). In a case where the relevant pin is the empty pin (S1-1-2f: Yes), the cell generation unit 111 records "EP (empty pin)" in the cell attribute (attr) of the processing subject cell data (S1-1-2g). In a case where the pin related to the pin data of the processing subject is not the empty pin (S1-1-2f: No), the cell generation unit 111 records "D (pin)" in the cell attribute (attr) of the processing subject cell data (S1-1-2h).

Following step S1-1-2g or S1-1-2h, the cell generation unit 111 judges whether or not the column number of the processing subject pin data reaches the maximum value (the number of columns of the pins) (S1-1-2i). In a case where the column number of the pin data is not the maximum value (S1-1-2i: No), the cell generation unit 111 sets the pin data related to the pin adjacent by one column on the east side in the pin columns (that is, the pin data having the one larger column number) as the processing subject (S1-1-2j). Also, the cell generation unit 111 adds 2 to the variable i (S1-1-2k). That is, the processing subject cell data is shifted by two columns on the east side in the cell columns.

On the other hand, in a case where the column number of the pin data is the maximum value (S1-1-2i: No), the cell generation unit 111 judges whether or not the row number of the relevant pin data reaches the maximum value (the number of rows of the pins) (1-1-2l). In a case where the row number of the pin data is not the maximum value (S1-1-2l: No), the cell generation unit 111 sets the pin data corresponding to the headpin in the next pin row (row on the south side) as the processing subject (S1-1-2m). Also, the cell generation unit 111 adds 2c+4 to the variable i (S1-1-2k). That is, the cell data corresponding to the cell in the second column which is two rows ahead on the south side in the cell array (that is, next even-numbered row) is set as the processing subject.

Following step S1-1-2k or S1-1-2n, for the next cell (cell data) in an even-numbered row, an even-numbered column, the processing in step S1-1-2c and afterward is repeatedly performed. When all the pins are processed (S1-1-2l: Yes), the processing of FIG. 15 is ended.

Figure 16:
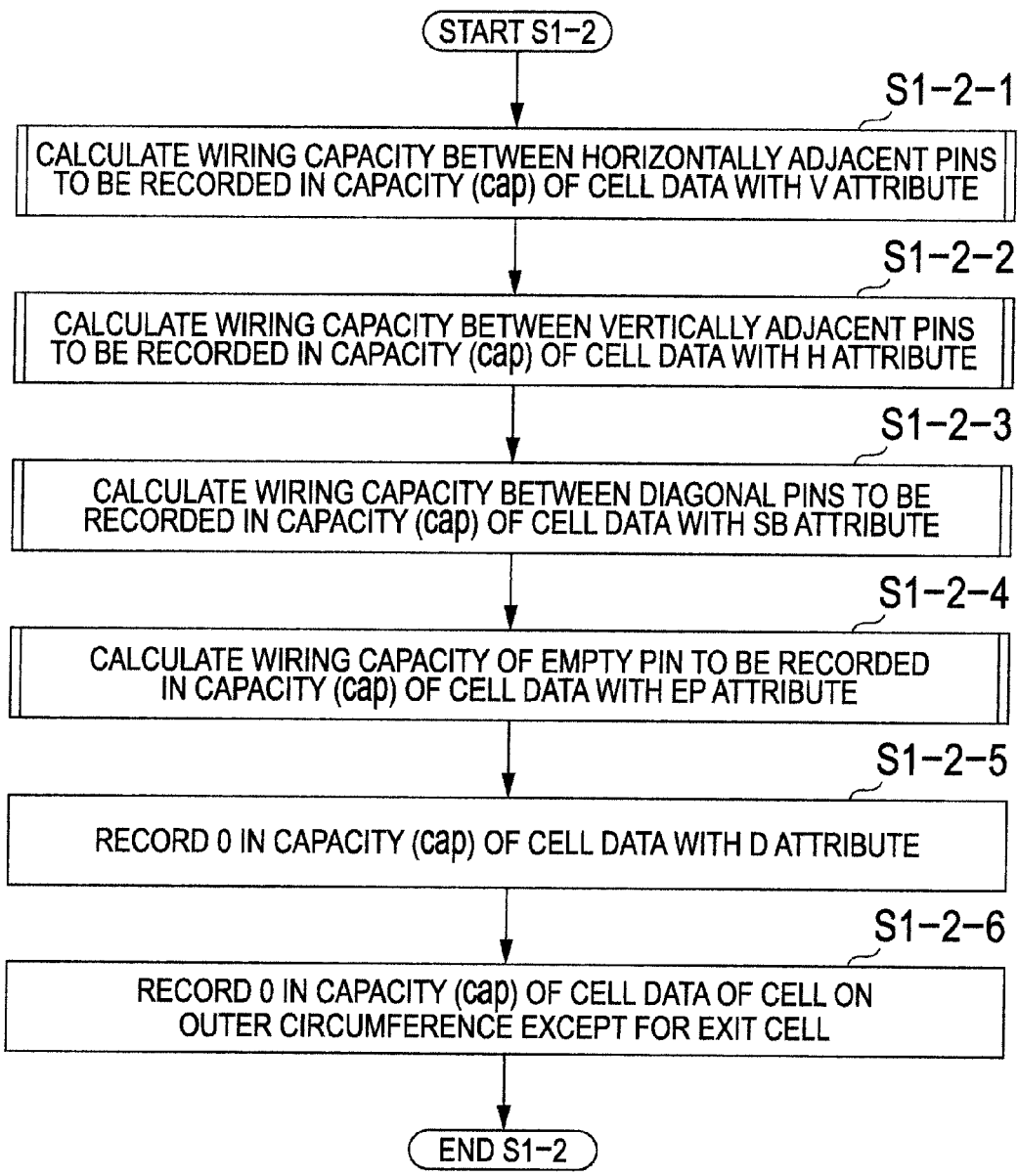
FIG. 16 is a flow chart for describing a processing procedure of a calculation processing for a capacity of the cell.

Thus far, the description is ended with regard to step S1-1 in FIG. 9. Then, a description will be given of a detail of step S1-2 in FIG. 9. FIG. 16 is a flow chart for describing a processing procedure of a calculation processing for a capacity of the cell.

In step S1-2-1, the cell capacity calculation unit 112 calculates the wiring capacity between the pins adjacent in the horizontal direction (east and west direction) and records the calculation result in the capacity (cap) of the cell data with the V attribute (the cell data whose the value of the cell attribute is "V"). Then, the cell capacity calculation unit 112 calculates the wiring capacity between the pins adjacent in the vertical direction (south and north direction) and records the calculation result in the capacity of the cell data with the H attribute (S1-2-2). Then, the cell capacity calculation unit 112 calculates the wiring capacity between the diagonal pins and records the calculation result in the capacity of the cell data with the SB attribute (S1-2-3). Then, the cell capacity calculation unit 112 calculates the wiring capacity of the empty pin and records the calculation result in the capacity of the cell data with the EP attribute (S1-2-4). Then, the cell capacity calculation unit 112 records 0 (zero) in the capacity of the cell data with the D attribute (S1-2-5). Then, the cell capacity calculation unit 112 records 0 in the capacity of the cell data on the outer circumferential cell except for the exit cell in the cell array (S1-2-6). By recording 0 in the capacity of the relevant cell data, the exit of the global routing can be limited to the exit cell. It may be noted that whether or not the cell is the exit cell is judged on the basis of the exit information 144 and the cell data. The exit information 144 includes coordinate information indicating a range of the exit location O (see FIG. 6). Therefore, by collating the coordinate values of the cell data with the coordinate information with respect to the exit location O, it is possible to judge whether or not the cell related to the relevant cell data is the exit cell. It may be noted that in FIG. 6, the exit location O is set as surface information (two-dimensional information). It is however noted that the exit location O may also be identified, for example, by the start point and the end point of a part on the outer circumference on the BGA.

Incidentally, the routing rule 143 is utilized for calculating the capacities of the respective cells. In the routing rule 143, parameters shown in FIG. 17 are registered.

Figure 17:
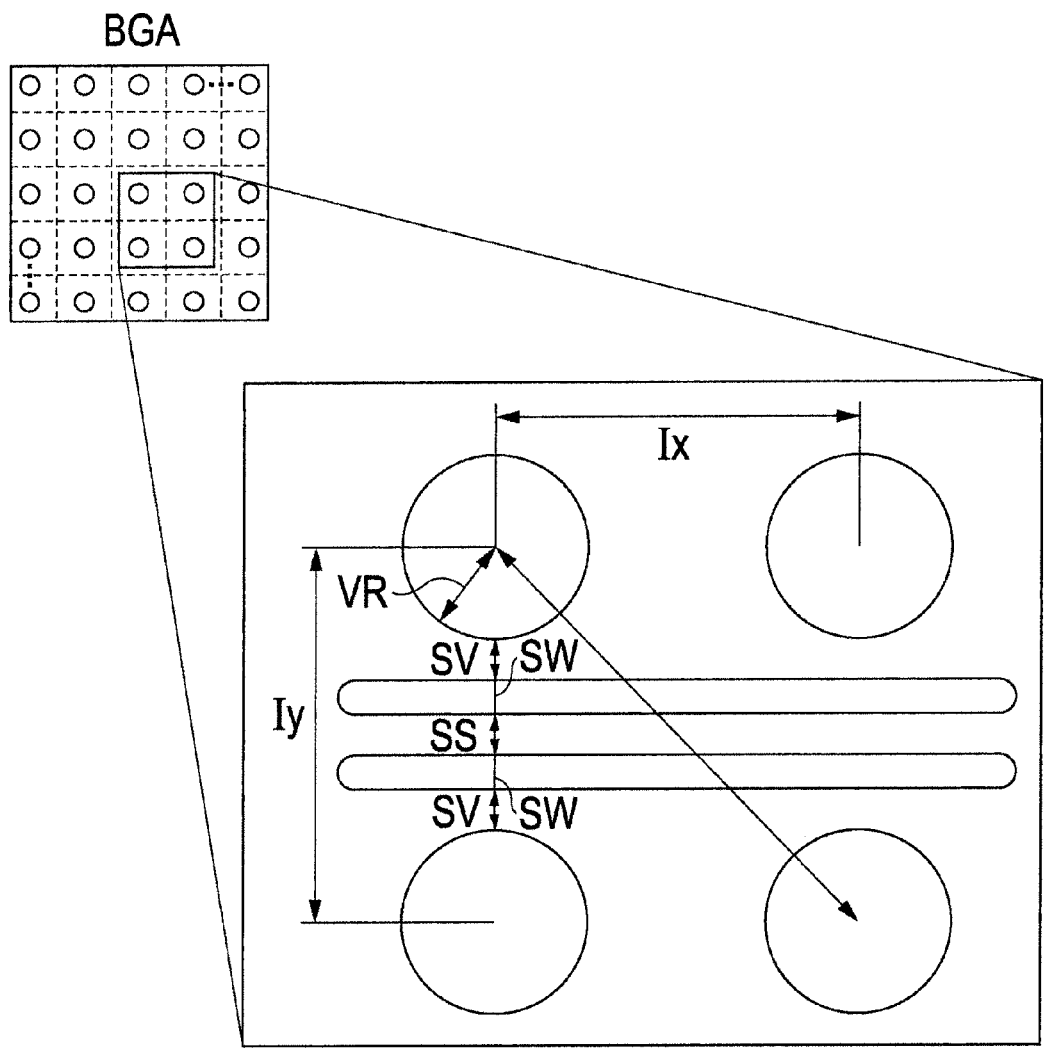
FIG. 17 is an explanatory diagram for describing a parameter registered in a routing rule.

FIG. 17 is an explanatory diagram for describing a parameter registered in a routing rule. In the same drawing, a circle indicates a pin. Also, tow lines in the horizontal direction indicate wirings. As shown in the same drawing, values of the parameters such as lx, ly, VR, SV, SW, and SS area registered in the routing rule 143.

Denoted by lx is a distance between the centers in the horizontal direction of the pins. ly denotes a distance between the centers in the vertical direction of the pins. VR denotes a radius of the pin. SV denotes an interval between the wiring and the terminal. SW denotes a width (thickness) of the wiring. SS denotes an interval between two wirings.

While utilizing the above-mentioned parameters, a description will be given of details of the respective steps in FIG. 16. It may be noted that the processing in FIG. 16 may be previously executed. In this case, it suffices if the values obtained as the execution result of the relevant processing (capacities in accordance with the respective bottleneck locations) are recoded as the routing rule 143.

Figure 18:
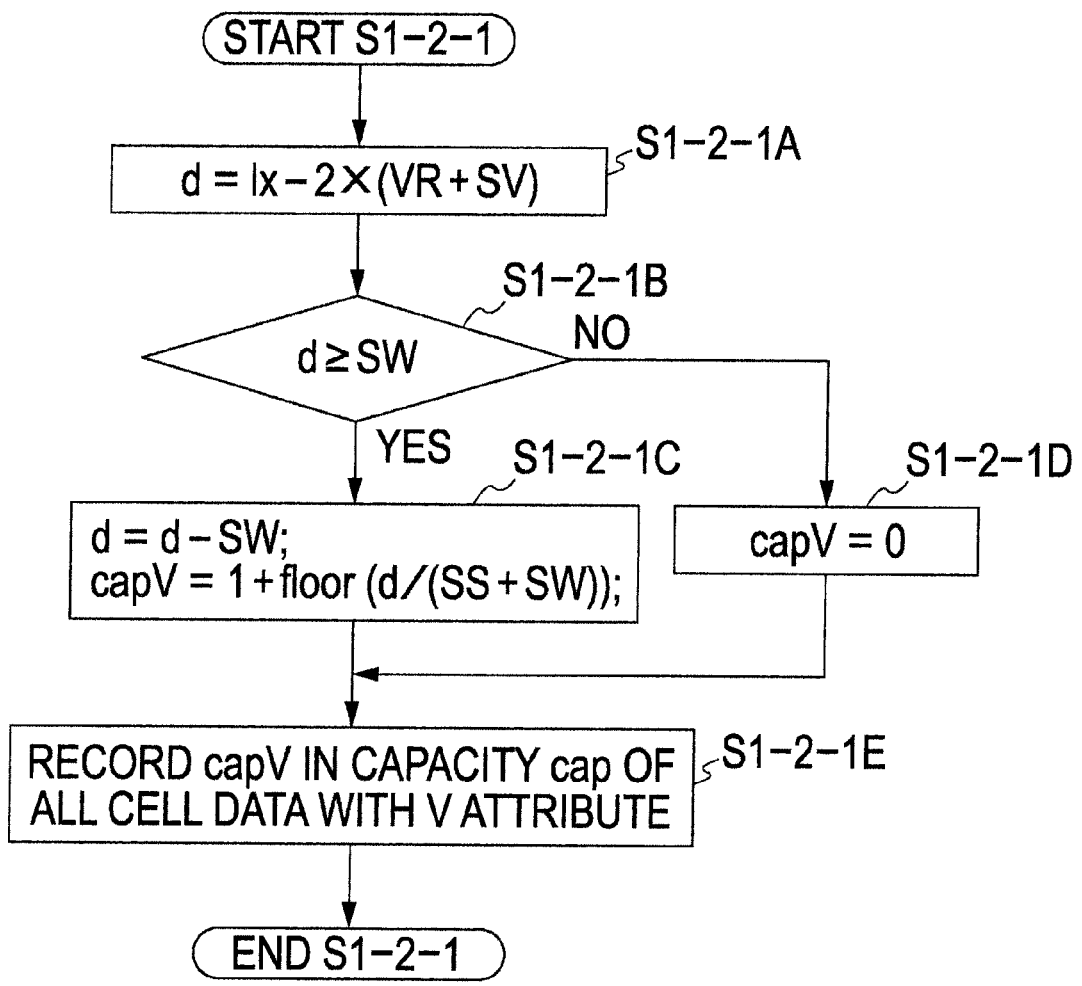
FIG. 18 is a flow chart for describing a processing procedure of a calculation processing for a wiring capacity between the cells adjacent in the horizontal direction.

First, a description will be given of a detail of step S1-2-1. FIG. 18 is a flow chart for describing a processing procedure of a calculation processing for a wiring capacity between the cells adjacent in the horizontal direction.

In step S1-2-1A, the cell capacity calculation unit 112 calculates d=lx−2×(VR+SV). A calculation result d is a maximum distance that can be utilized for the wiring between the pins in the horizontal direction. Then, the cell capacity calculation unit 112 judges whether or not d is equal to or larger than a wiring width SW (S1-2-1B). In a case where d is equal to or larger than the wiring width SW (S1-2-1B: Yes), the cell capacity calculation unit 112 calculates d=d−SW and then calculates capV=1+floor(d/(SS+SW)) (S1-2-1C). The calculation result d of d=d−SW indicates a distance left over by one line of the wiring. Also, a calculation result capV of capV=1+floor (d/(SS+SW)) denotes the number of the number of available wirings between the pins in the horizontal direction. It may be noted that floor function is a function for calculating a maximum integer value of a numeral value set as an argument.

On the other hand, in a case where d is smaller than the wiring width SW (S1-2-1B: No), the cell capacity calculation unit 112 sets the value of capV as 0 (51-2-1D). Following step S1-2-1C or 51-2-1D, the cell capacity calculation unit 112 records the value of capV in the capacity (cap) of all the cell data with the V attribute (51-2-1E).

It may be noted that in step S1-2-2, the description is omitted as apparent from FIG. 18. That is, lx in FIG. 18 is replaced by ly, and the value of capV may be recorded in the capacity of the cell data with the H attribute.

Figure 19:
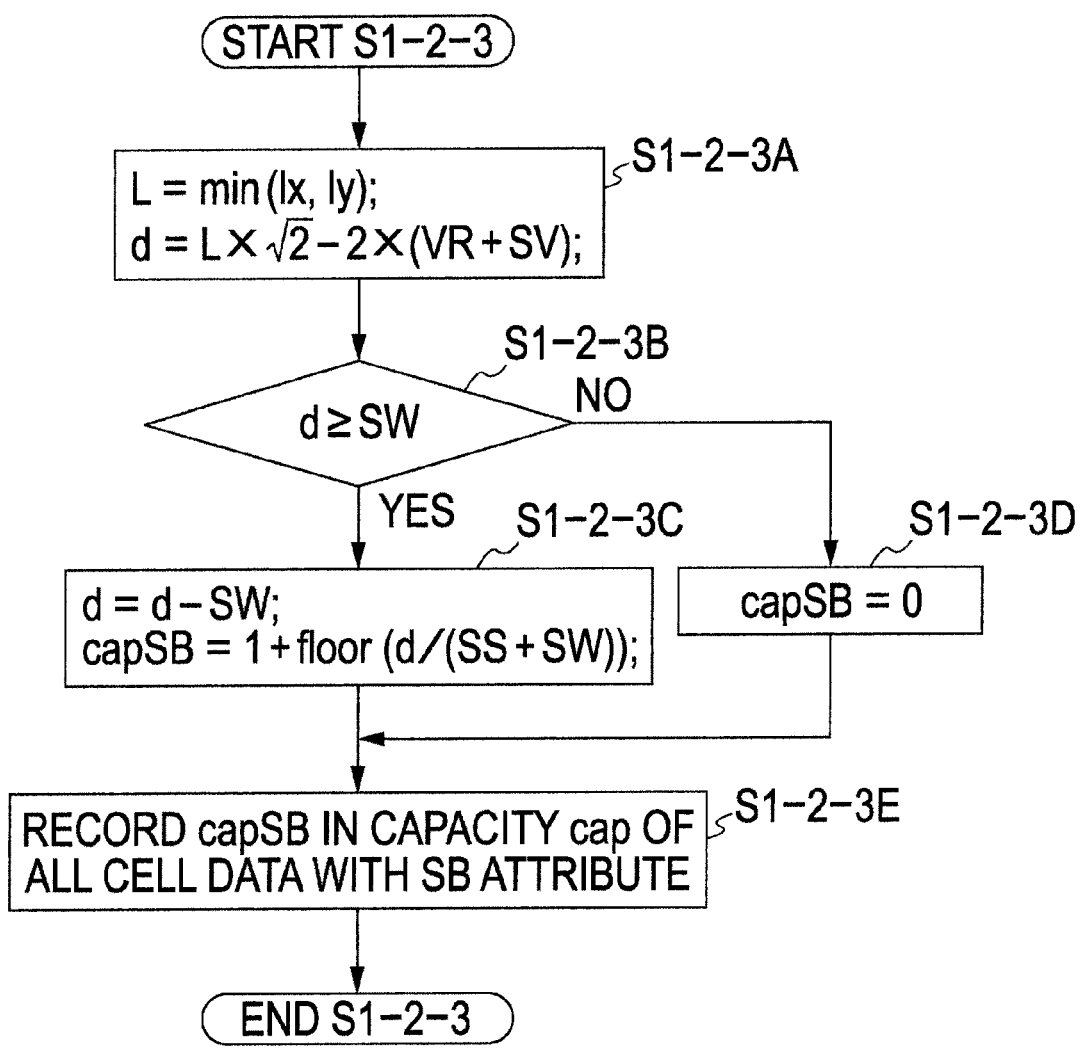
FIG. 19 is a flow chart for describing a processing procedure of a calculation processing for a wiring capacity between the diagonal cells.

Then, a description will be given of a detail of step S1-2-3. FIG. 19 is a flow chart for describing a processing procedure of a calculation processing for a wiring capacity between the diagonal cells.

In step S1-2-3A, the cell capacity calculation unit 112 calculates L=min (lx, ly) and then calculates d=L×√2−2× (VR+SV). A calculation result L of L=min (lx,ly) is a minimum value of lx and ly. A calculation result of d=L×√2−2× (VR+SV) is a maximum distance that can be utilized for the wiring between the diagonal pins.

Then, the cell capacity calculation unit 112 judges whether or not d is equal to or larger than the wiring width SW (S1-2-3B). In a case where d is equal to or larger than the wiring width SW (S1-2-3B: Yes), the cell capacity calculation unit 112 calculates d=d−SW and then, capSB=1+floor (d/ (SS+SW))(S1-2-3C). The calculation result d of d=d−SW indicates a distance left over by one line of the wiring. Also, a calculation result capSB of capSB=1+floor (d/(SS+SW)) indicates the number of available wirings between the diagonal cells.

On the other hand, in a case where d is smaller than the wiring width SW (S1-2-3B: No), the cell capacity calculation unit 112 sets the value of capSB as 0 (S1-2-3D). Following step S1-2-3C or S1-2-3D, the cell capacity calculation unit 112 records the value of capSB in the capacity of all the cell data with the SB attributes (cap) (S1-2-3E).

Figure 20:
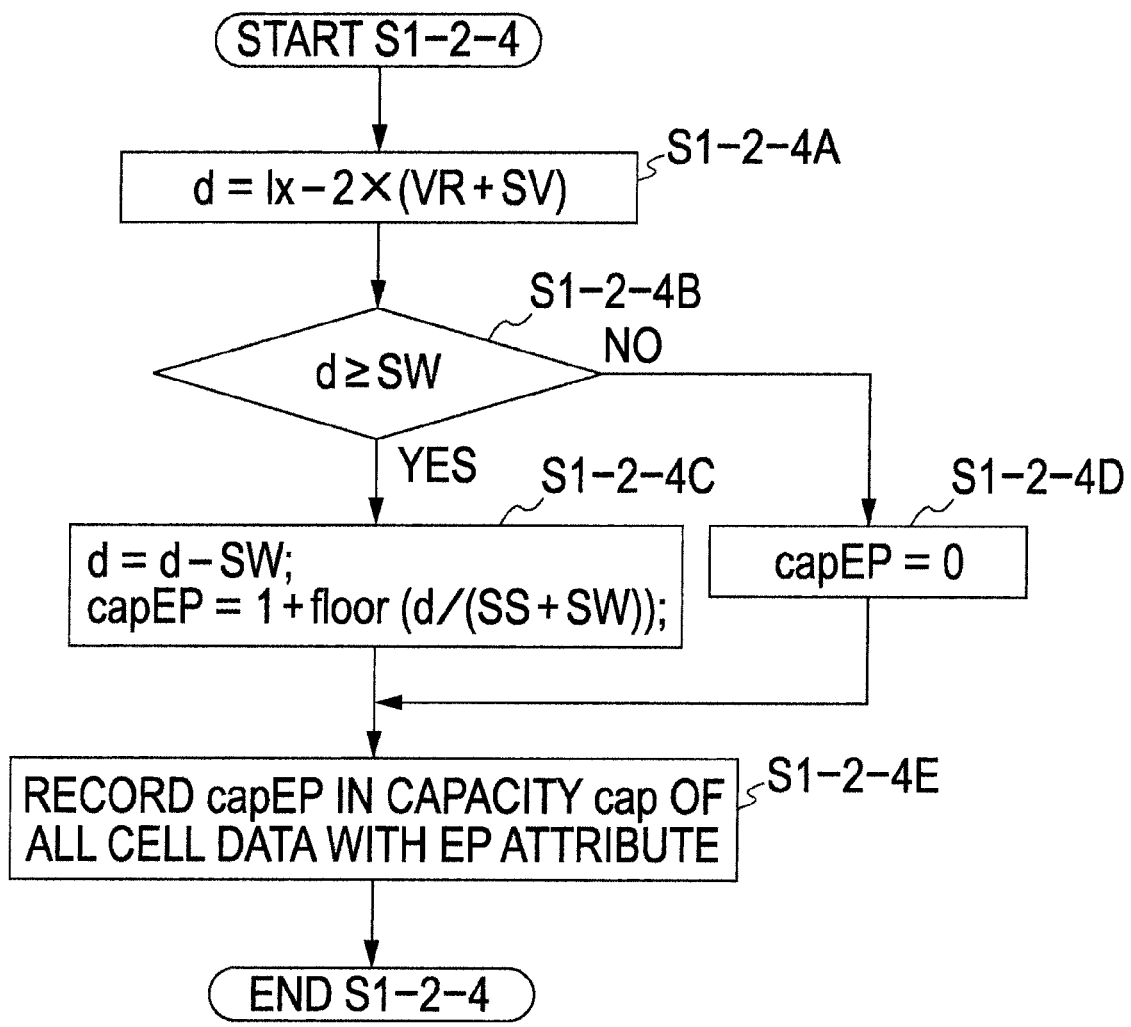
FIG. 20 is a flow chart for describing a processing procedure of a calculation processing for a wiring capacity of an empty pin.

Then, a description will be given of a detail of step S1-2-4. FIG. 20 is a flow chart for describing a processing procedure of a calculation processing for a wiring capacity of the empty pin.

In step S1-2-4A, the cell capacity calculation unit 112 calculates d=2×VR. The calculation result d of d=2×VR is a diameter of the pin. Then, the cell capacity calculation unit 112 judges whether or not d is equal to or larger than the wiring width SW (S1-2-4B). In a case where d is equal to or larger than the wiring width SW (S1-2-4B: Yes), the cell capacity calculation unit 112 calculates d=d−SW and then calculates capEP=1+floor(d/(SS+SW))(S1-2-4C). The calculation result d of d=d−SW indicates a distance left over by one line of the wiring. Also, a calculation result capEP of capEP=1+floor(d/(SS+SW)) indicates the number of available wirings in the empty pin.

On the other hand, in a case where d is smaller than the wiring width SW (S1-2-4B: No), the cell capacity calculation unit 112 sets the value of capEP as 0 (S1-2-4D). Following step S1-2-4C or S1-2-4D, the cell capacity calculation unit 112 records the value of capEP in the capacity (cap) of all the cell data with the EP attribute (S1-2-4E).

Figure 21:
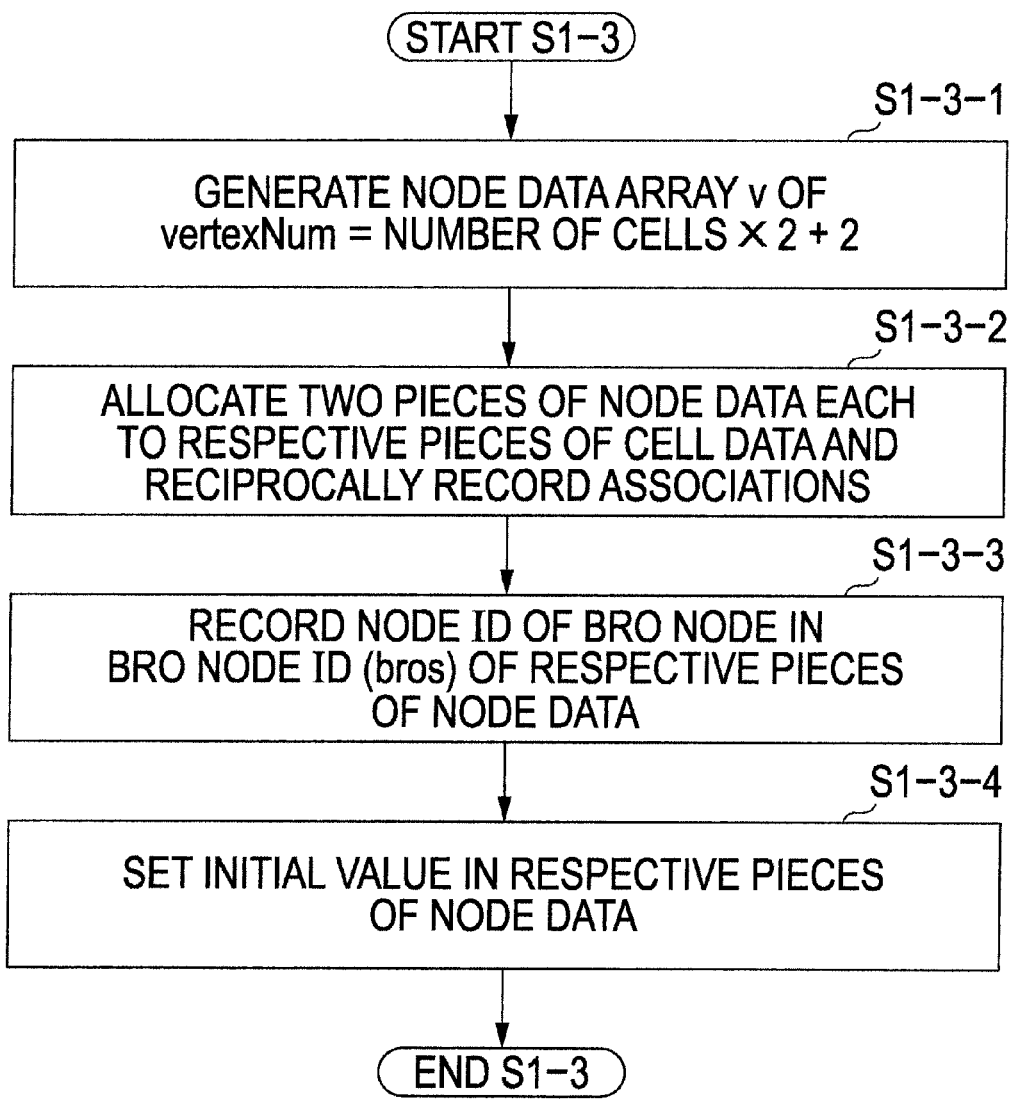
FIG. 21 is a flow chart for describing a processing procedure of a generation processing for a node.

Thus far, the description is ended with regard to step S1-2 of FIG. 9. Then, a description will be given of a detail of step S1-3 in FIG. 9. FIG. 21 is a flow chart for describing a processing procedure of a generation processing for the node.

In step S1-3-1, the node generation unit 113 generates a node data array having elements by the number of the cells× 2+2 (node data array v) in the auxiliary storage apparatus 102. The node data array v is an array for storing two pieces of node data and the node data on each of the source node S and the target node T for the respective cells. It may be noted that a first element (v[0]) of the node data array v corresponds to the source node S. Also, a last element (v[vertexNum−1]) corresponds to the target node T. Denoted by vertexNum is the number of elements of the node array.

Then, the node generation unit 113 allocates all node data except for the first element and the last element of the node array sequentially pieces each to the respective pieces of cell data two and records bi-directional association between the node data and the cell data (S1-3-2). That is, in each of the node ID of the entry node (iN) and the node ID of the exit node (oN) of the respective pieces of cell data, one node ID of the two pieces of node data allocated to the relevant cell data and the other node ID are recorded. Also, in the cell ID of the owner cell (cellID) of the node data allocated to the cell data, the cell ID of the relevant cell data is recorded. It may be noted that the node ID is a suffix in the node data array. The cell ID is a suffix in the cell data array cell.

Then, the node generation unit 113 records the node ID of the node data of the bro node (the other node allocated in the same cell) in the bro node ID (bros) of all node data except for the first element and the last element of the node array (S1-3-3).

Then, the node generation unit 113 records the initial value in the member variables of the respective pieces of node data (S1-3-4). To be specific, in the label propagation source node ID (pID), NULLID is recorded. NULLID is an ID indicating that no data exists. Also, 0 is recorded in the shortest path length (dist). Also, "in" is recorded in the node attribute (attr) of the node data allocated as the entry node, and "out" is recorded in the node attribute (attr) of the data node allocated as the exit node. Also, false is recorded in each of the source flag (sFlag) and the target flag (tFlag).

Figure 22:
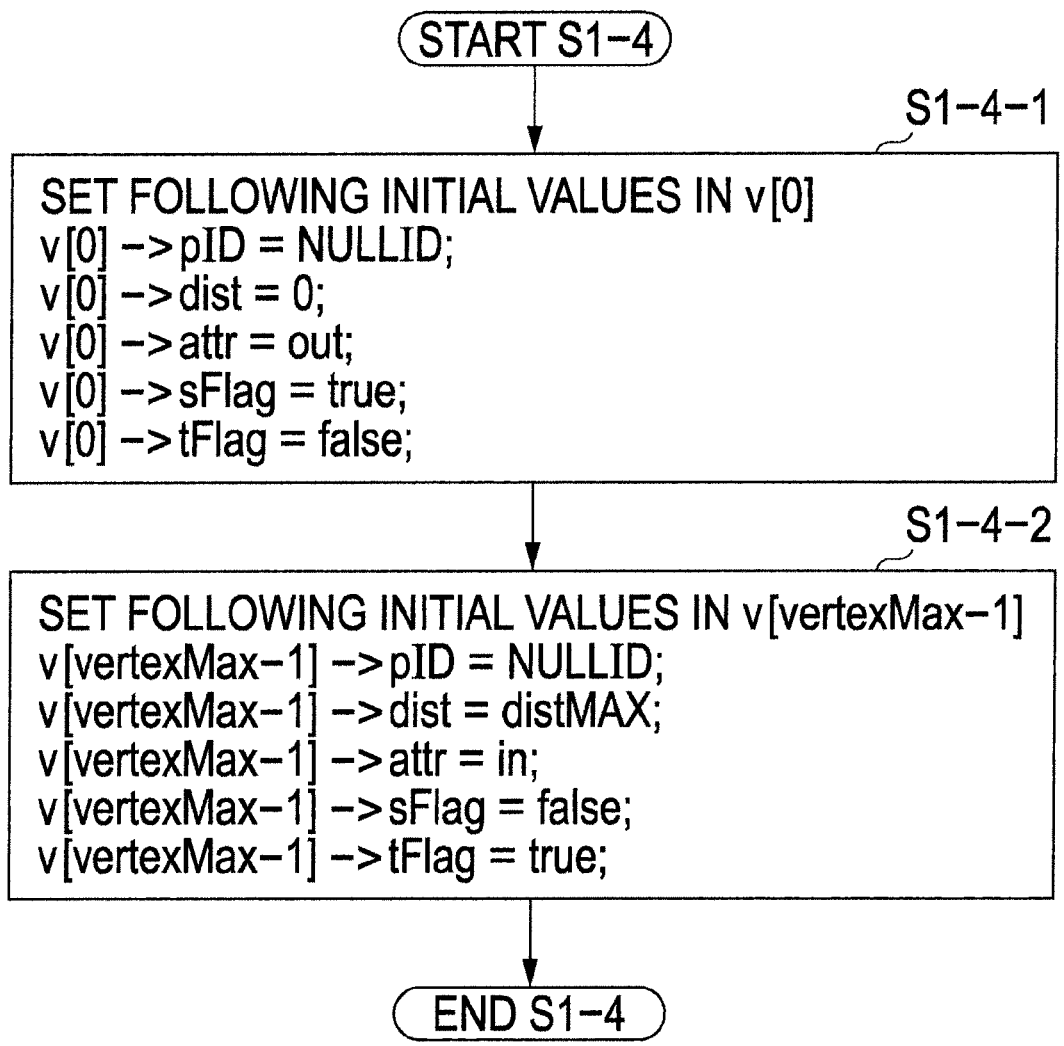
FIG. 22 is a flow chart for describing a processing procedure of a generation processing for a source node and a target node.

Thus far, the description is ended with regard to step S1-3 in FIG. 9. Then, a description will be given of a detail of step S1-4 in FIG. 9. FIG. 22 is a flow chart for describing a processing procedure of a generation processing for the source node and the target node.

In step S1-4-1, the node generation unit 113 records the initial values in the respective member variables of the node data corresponding to the source node S (node data array v[0]). To be specific, NULLID is recorded in the label propagation source node ID (pID). Also, 0 is recorded in the shortest path length (dist). Also, out is recorded in the node attribute (attr). Also, true is recorded in the source flag (sFlag), and false is recorded in the target flag (tFlag).

Then, the node generation unit 113 records the initial values in the respective member variables of the node data corresponding to the target node T (node data array v[vertexNum−1]) (S1-4-2). To be specific, NULLID is recorded in the label propagation source node ID (pID). Also, in the shortest path length (dist), distMax is recorded. distMax is a maximum value of the path length in the path search. Also, in is recorded in the node attribute (attr). Also, false is recorded in the source flag (sFlag), and true is recorded in the target flag (tFlag).

Figure 23:
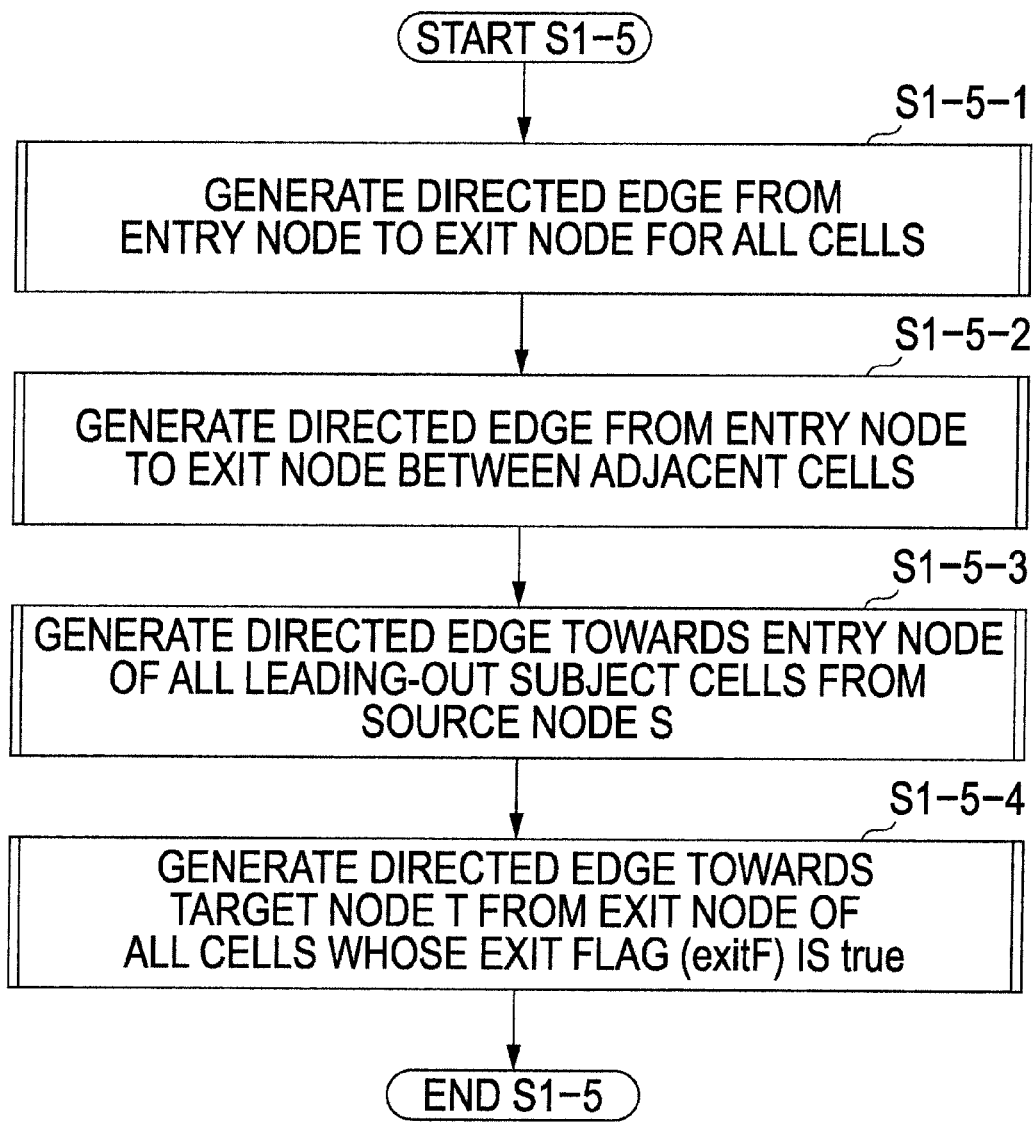
FIG. 23 is a flow chart for describing a processing procedure of a generation processing for a directed edge.

Thus far, the description is ended with regard to step S1-4 in FIG. 9. Then, a description will be given of a detail of step S1-5 in FIG. 9. FIG. 23 is a flow chart for describing a processing procedure of a generation processing for the directed edge.

In step S1-5-1, the directed edge generation unit 114 generates the directed edge from the entry node to the exit node for all the cells.

FIG. 24 illustrates the directed edges from the entry nodes to the exit nodes of the cells. The same drawing illustrates nine cells for convenience. In the respective cells, arrows from a point indicating the entry node to a point indicating the exit node are illustrated. The arrow indicates a directed edge from the entry node to the exit node.

Then, the directed edge generation unit 114 reciprocally generates the directed edge from the exit node to the entry node between the adjacent cells (astride between the cells) (S1-5-2). Then, the directed edge generation unit 114 generates the directed edge to the entry node of the cell corresponding to all the leading-out subject pins (leading-out subject cell) from the source node S (S1-5-3). Then, the directed edge generation unit 114 generates the directed edge from the exit node of all the cells whose exit flag (exitF) is true (that is, the exit cell) to the target node T (S1-5-4).

Figure 25:
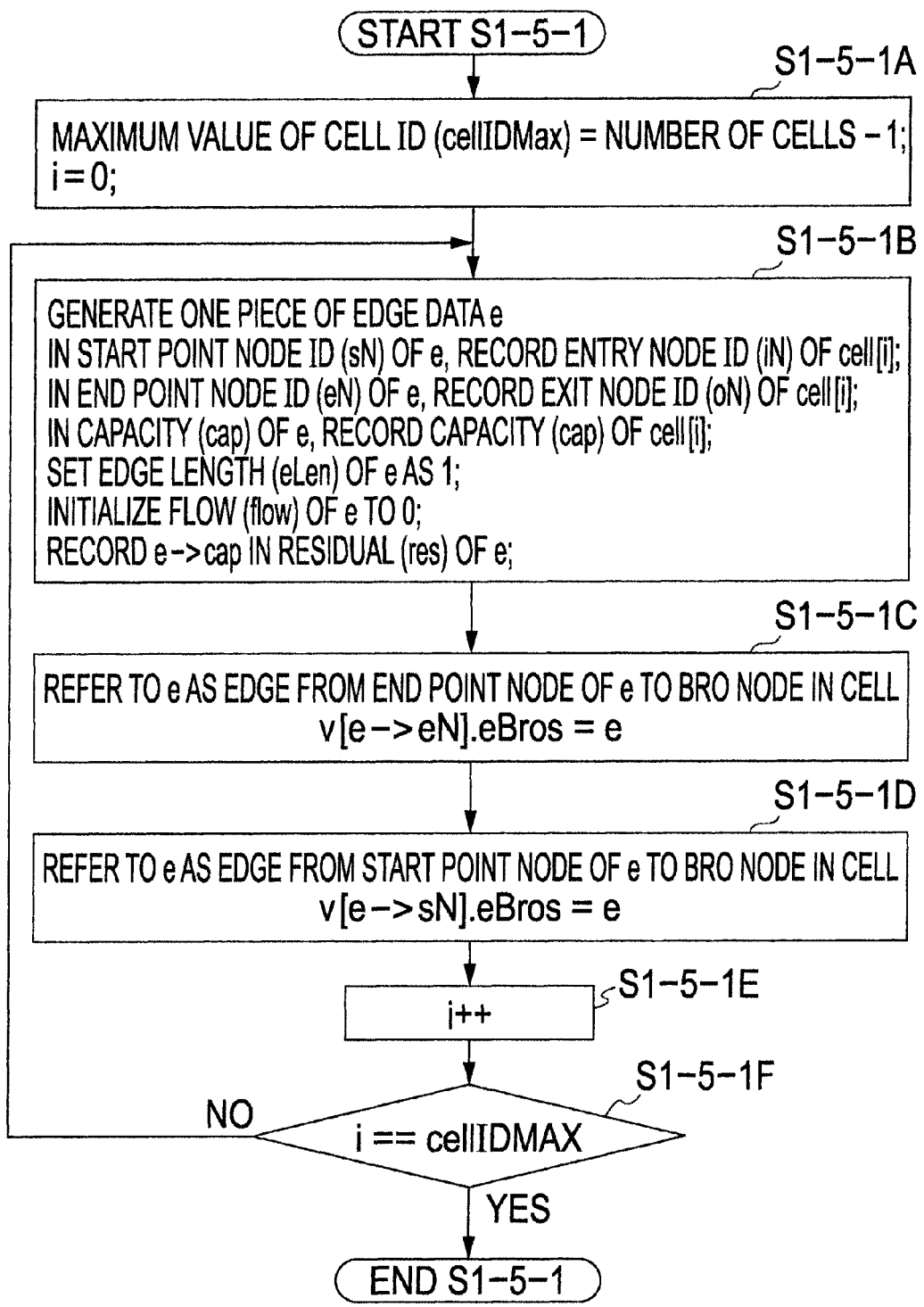
FIG. 25 is a flow chart for describing a processing procedure of a generation processing for the directed edge from the entry node to the exit node of the cell.

Then, a description will be given of a detail of step S1-5-1 in FIG. 23. FIG. 25 is a flow chart for describing a processing procedure of a generation processing for the directed edge from the entry node to the exit node of the cell.

In step S1-5-1A, the directed edge generation unit 114 substitutes the number of cells−1 to a variable cellIDMax. Also, the directed edge generation unit 114 initializes the variable i by 0. Herein, cellIDMax denotes a maximum value of the cell ID (that is, a maximum value of the suffix of the cell data array cell). Also, the variable i is utilized as the suffix of the processing subject element (cell data) in the cell data array cell.

Then, the directed edge generation unit 114 generates one piece of edge data e in the memory apparatus 103 and records the initial value in the member variable of the edge data (S1-5-1B).

Figures 26, 27:
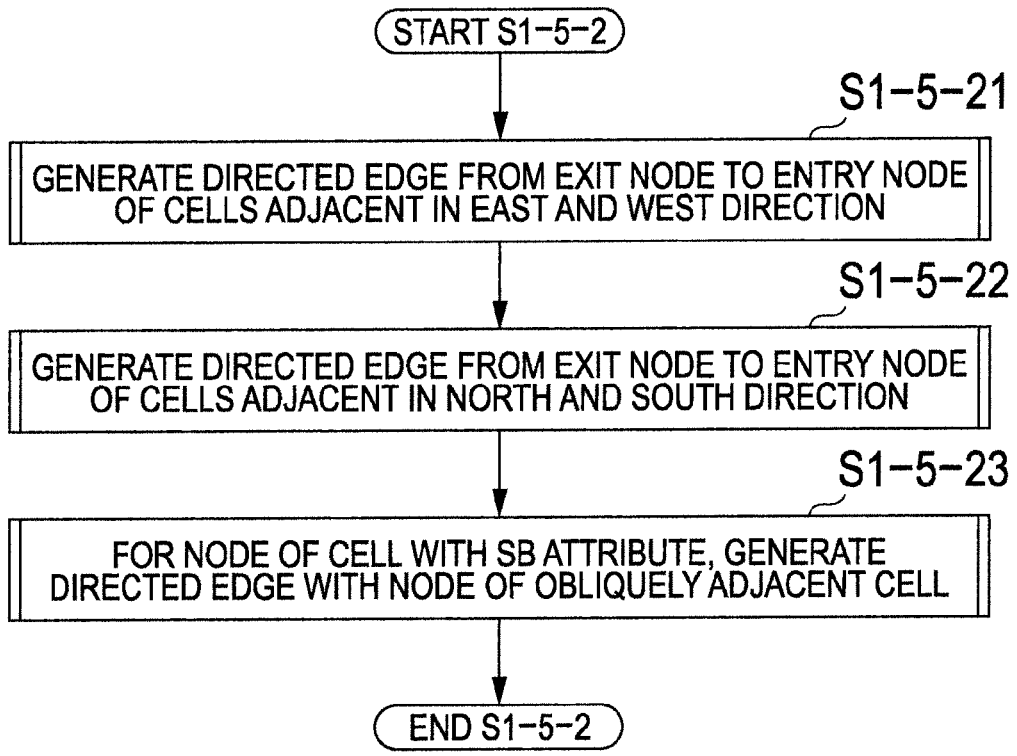
FIG. 26 illustrates a configuration example of edge data.
FIG. 27 is a flow chart for describing a processing procedure of a generation processing for a directed edge from the entry node to the exit node between adjacent cells.

FIG. 26 illustrates a configuration example of the edge data. In the same drawing, the edge data includes member variables (data items) such as a start point node ID (sN), a end point node ID (eN), an edge length (eLen), a capacity (cap), a flow (flow), and a residual (res).

The start point node ID (sN) is a node ID of the node located at the start point of the directed edge to which the edge data corresponds. The end point node ID (eN) a node ID of the node located at the end point of the directed edge to which the edge data corresponds. The edge length (eLen) is a length of the directed edge. According to the present embodiment, all the directed edges have the same length (1). The capacity (cap) is a capacity of the directed edge. The capacity of the directed edge indicates a maximum value of times by which the directed edge can be allocated to the path in the path search. The flow (flow) is the number of times by which the directed edge is allocated to the path (used for the path). The residual (res) is the remaining number of times by which the directed edge can be allocated. That is, a relation of res=cap−flow is established.

In step S1-5-1B, the entry node ID (iN) of the processing subject cell data is recorded in the generated start point node ID (sN) of the edge data e. Also, the exit node ID (oN) of the processing subject cell data is recorded in the end point node ID (eN) of the edge data e. According to this, the edge data e is edge data corresponding to the directed edge from to the entry node of the processing subject cell to the exit node. Also, the capacity (cap) of the processing subject cell data is recorded in the capacity (cap) of the edge data e. That is, the capacity of the directed edge from to the entry node to the exit node of the cell is the same as the capacity of the relevant cell. Also, 1 is recorded in the edge length (eLen) of the edge data e. Also, the initial value 0 is recorded in the flow (flow) of the edge data e. Also, in the residual (res) of the edge data e, the value of the capacity (cap) of the edge data e is recorded.

Then, the directed edge generation unit 114 records the edge data e in the directed edge with the bro node (eBros) of the node data on the end point node of the edge data e (node data array v[e→eN]) (S1-5-1C). Then, the directed edge generation unit 114 records the edge data e in the directed edge with the bro node (eBros) of the node data on the start point of the edge data e (node data array v[e→sN]) (S1-5-1D). Through steps S1-5-1C and S1-5-1D, in each of the node data on the two nodes belonging to the processing subject cell, the edge data on the directed edge with the other node (bro node) is registered.

Then, the directed edge generation unit 114 increments the value of i (S1-5-1E). Then, the directed edge generation unit 114 judges whether or not the value of i reaches cellMax, that is, whether or not the processing is completed for all the cell data (S1-5-1F). In a case where the value of i does not reach cellMax (S1-5-1F: No), the directed edge generation unit 114 repeatedly executes the processing in step S1-5-1B and subsequent steps while the next cell data is set as the processing subject. In a case where the value of i does not reaches cellMax (S1-5-1F: No), the directed edge generation unit 114 ends the processing of FIG. 25. As a result, the directed edges from the entry node to the exit node in all the cells are generated (see FIG. 24).

Then, a description will be given of a detail of step S1-5-2 in FIG. 23. FIG. 27 is a flow chart for describing a processing procedure of a generation processing for the directed edge from the entry node to the exit node between adjacent cells.

In step S1-5-21, the directed edge generation unit 114 reciprocally generates the directed edges from the exit node of the cell adjacent in the east and west direction to the entry node.

FIG. 28 illustrates directed edges from the exit nodes to the entry nodes of the cells adjacent in the east and west direction. As shown in the same drawing, in step S1-5-21, the directed edge from the exit node of the cell on the east side to the entry node of the cell on the west side and the directed edge from the exit node of the cell on the west side to the entry node of the cell on the east side are generated.

Then, the directed edge generation unit 114 reciprocally generates the directed edges from the exit node of the cell adjacent in the south and north direction to the entry node (S1-5-22).

FIG. 29 illustrates directed edges from the exit nodes to the entry nodes of the cells adjacent in the north and south direction. As shown in the same drawing, in step S1-5-22, the directed edge from the exit node of the cell on the south side to the entry node of the cell on the north side and the directed edge from the exit node of the cell on the north side to the entry node of the cell on the south side are generated.

Then, for the node belonging to the cell with the SB attribute (cell between the diagonal pins), the directed edge generation unit 114 reciprocally generates the directed edges with the node belonging to the cell in a diagonal direction (north east direction, north west direction, south east direction, or south west direction) (obliquely adjacent cell) (S1-5-23).

Figure 30:
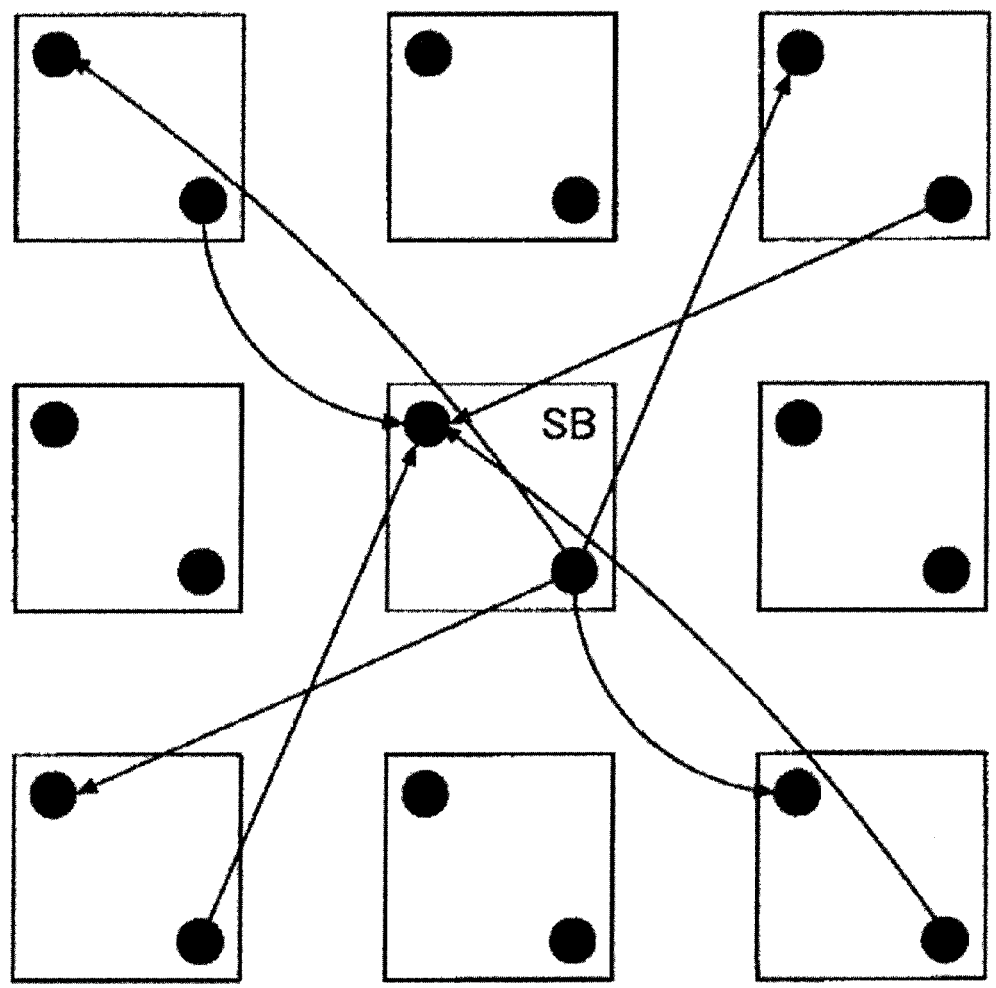
FIG. 30 illustrates a directed edge between the nodes of the obliquely adjacent cells.

FIG. 30 illustrates directed edges between the nodes of the obliquely adjacent cells. As shown in the same drawing, in step S1-5-23, the directed edge from the exit node of the SB cell to the entry node of the entire obliquely adjacent cell and the directed edge from the exit node of the entire obliquely adjacent cell to the entry node of the SB cell are generated.

Figure 31A:
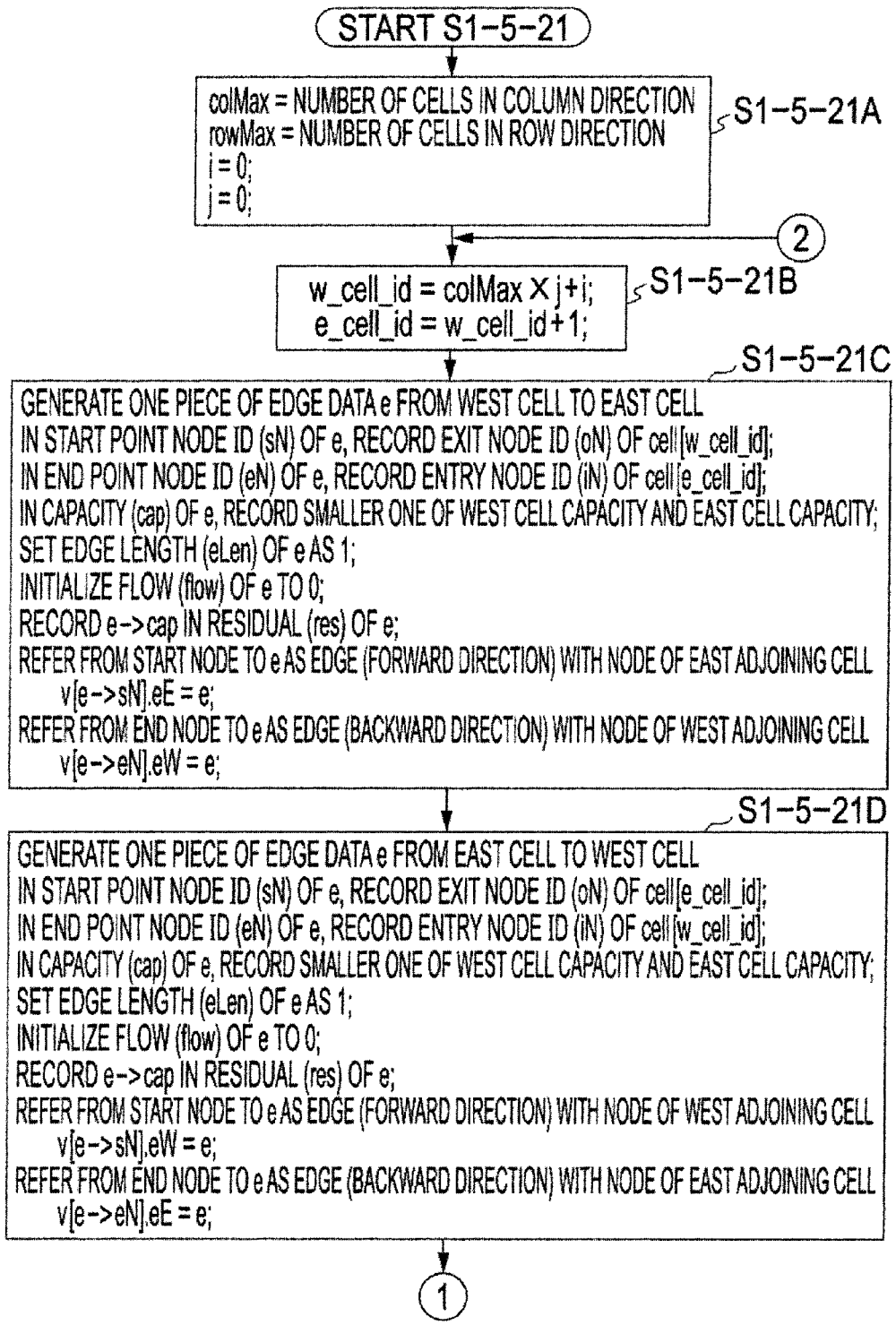
FIGS. 31A and B are flow charts for describing a processing procedure of a generation processing for a directed edge from the exit node to the entry node of the cells adjacent in the east and west direction.
Figure 31B:
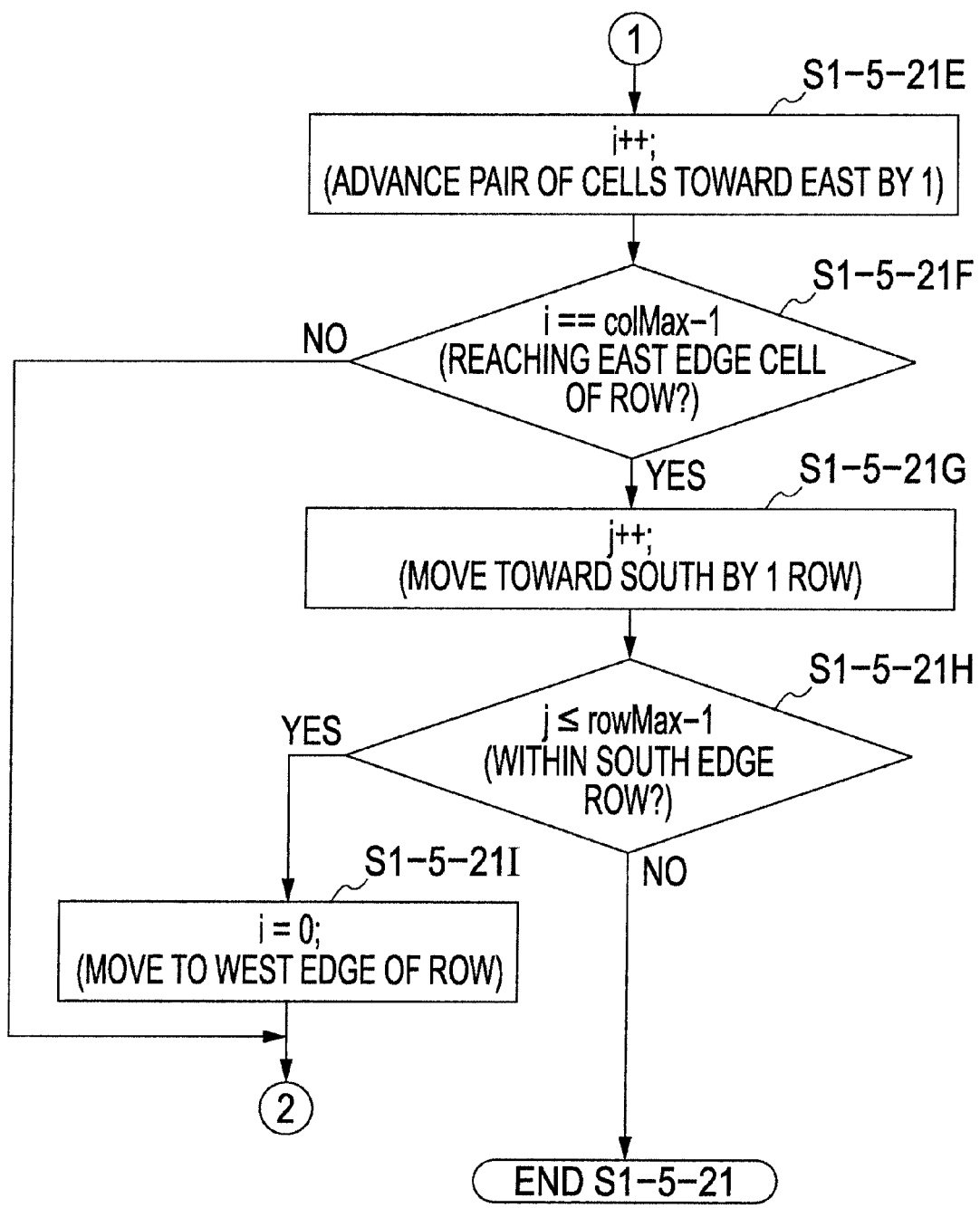

Then, a description will be given of a detail of step S1-5-21 in FIG. 27. FIGS. 31A and B are a flow chart for describing a processing procedure of a generation processing for the directed edge from the exit node to the entry node of the cells adjacent in the east and west direction.

In step S1-5-21A, the directed edge generation unit 114 substitutes the number of cells in the column direction to a variable colMax and the number of cells in the row direction to a variable rowMax. Also, the directed edge generation unit 114 initializes each of the variable i and a variable j by 0. The variable i is utilized as an offset value in the column direction of the cell on the west side among the two processing subject cells adjacent in the east and west. The variable j is utilized as an offset value in the row direction of the two processing subject cells adjacent in the east and west.

Then, the directed edge generation unit 114 calculates w_cell_id=colMax×j+i and further calculates e_cell_id=w_cell_id+1 (S1-5-21B). In the cell data array cell, w_cell_id is a suffix with respect to the element (cell data) corresponding to the processing subject cell on the west side (west cell). Also, e_cell_id is a suffix with respect to the element (cell data) corresponding to the processing subject cell on the east side (east cell). It may be noted that at first, the west cell is a cell in row 1, column 1, and the east cell is a cell in row 1, column 2.

Then, the directed edge generation unit 114 generates one piece of edge data e corresponding to the directed edge from the exit node of the west cell to the entry node of the east cell in the memory apparatus 103 and records the value in the member variable of the edge data e (S1-5-21C). To be specific, in the start point node ID (sN) of the edge data e, the exit node ID (oN) of the cell data on the west cell (cell data array cell[w_cell_id]) is recorded. Also, in the end point node ID (eN) of the edge data e, the entry node ID (iN) of the cell data on the east cell (cell data array cell[e_cell_id]) is recorded. According to this, the edge data e is edge data corresponding to the directed edge from the exit node of the west cell to the entry node of the east cell. Also, a smaller one of the value of the capacity (cap) of the cell data on the west cell and the value of the capacity of the cell data on the east cell is recorded in the capacity (cap) of the edge data e. That is, the capacity of the directed edge from the exit node of the cells adjacent in the east and the west to the entry node is set as the minimum value of the capacities of the adjacent cells. Also, 1 is recorded in the edge length (eLen) of the edge data e. Also, the initial value 0 is recorded in the flow (flow) of the edge data e. Also, the value of the capacity (cap) of the edge data e is recorded in the residual (res) of the edge data e.

Also, the directed edge generation unit 114 records the edge data e in the directed edge with the node of the cell adjacent in the east (eE) of the node data on the start point of the edge data e (node data array v[e→sN]). Also, the directed edge generation unit 114 records the edge data e in the directed edge with the node of the cell adjacent in the west (eW) of the node data on the end point node of the edge data e (node data array v[e→eN]). According to this, in each of the node data on the exit node of the east cell and the node data on the entry node of the west cell, the edge data on the directed edge with the other node is registered.

Then, the directed edge generation unit 114 generates one piece of edge data e corresponding to the directed edge from the exit node of the east cell to the entry node of the west cell in the memory apparatus 103 and records the value in the member variable of the edge data e (S1-5-21D). To be specific, in the start point node ID (sN) of the edge data e, the exit node ID (oN) of the cell data on the east cell (cell data array cell[e_cell_id]) is recorded. Also, in the end point node ID (eN) of the edge data e, the entry node ID (iN) of the cell data on the west cell (cell data array cell[w_cell_id]) is recorded. According to this, the edge data e is edge data corresponding to the directed edge from the exit node of the east cell to the entry node of the west cell. Also, a smaller one of the value of the capacity (cap) of the cell data on the east cell and the value of the capacity of the cell data on the west cell is recorded in the capacity (cap) of the edge data e. Also, 1 is recorded in the edge length (eLen) of the edge data e. Also, the initial value 0 is recorded in the flow (flow) of the edge data e. Also, the value of the capacity (cap) of the edge data e is recorded in the residual (res) of the edge data e.

Also, the directed edge generation unit 114 records the edge data e in the directed edge with the node of the cell adjacent in the west (eW) of the node data on the start point of the edge data e (node data array v[e→sN]). Also, the directed edge generation unit 114 records the edge data e in the directed edge with the node of the cell adjacent in the east (eE) of the node data on the end point node of the edge data e (node data array v[e→eN]). According to this, in each of the node data on the exit node of the west cell and the node data on the entry node of the east cell, the edge data on the directed edge with the other node is registered.

Then, the directed edge generation unit 114 increments the variable i (S1-5-21E). That is, the two processing subject cells adjacent in the east and the west are shifted by one column on the east side in the cell array. Then, the directed edge generation unit 114 judges whether or not the value of the variable i reaches colMax−1, that is, whether or not the processing subject west cell reaches the east edge of the cell array (S1-5-21F). In a case where the value of the variable i does not reach colMax−1 (S1-5-21F: No), the directed edge generation unit 114 sets the cells adjacent in the east and the west which are shifted by one on the east side as the processing subject and executes the processing in step S1-5-21B and subsequent steps.

In a case where the value of the variable i reaches colMax−1 (S1-5-21F: Yes), the directed edge generation unit 114 increments the value of the variable j (S1-5-21G). That is, the two processing subject cells adjacent in the east and the west are shifted by one row on the south side in the cell array. Then, the directed edge generation unit 114 judges whether or not the value of the variable j is equal to or smaller than rowMax−1, that is, whether or not the processing subject cell reaches the south edge of the cell array (S1-5-21H). In a case where the value of the variable j is equal to or smaller than rowMax−1 (S1-5-21H: Yes), the directed edge generation unit 114 sets the value of the variable i as 0 (S1-5-21I) and executes the processing in step S1-5-21B and subsequent steps. By setting the value of the variable i as 0, the processing subject west cell is shifted to the west edge in the cell array. On the other hand, in a case where the value of the variable j exceeds rowMax−1 (S1-5-21H: No), the directed edge generation unit 114 ends the processing of FIGS. 31A and B. The processing result of FIGS. 31A and B are as shown in FIG. 28.

Figure 32A:
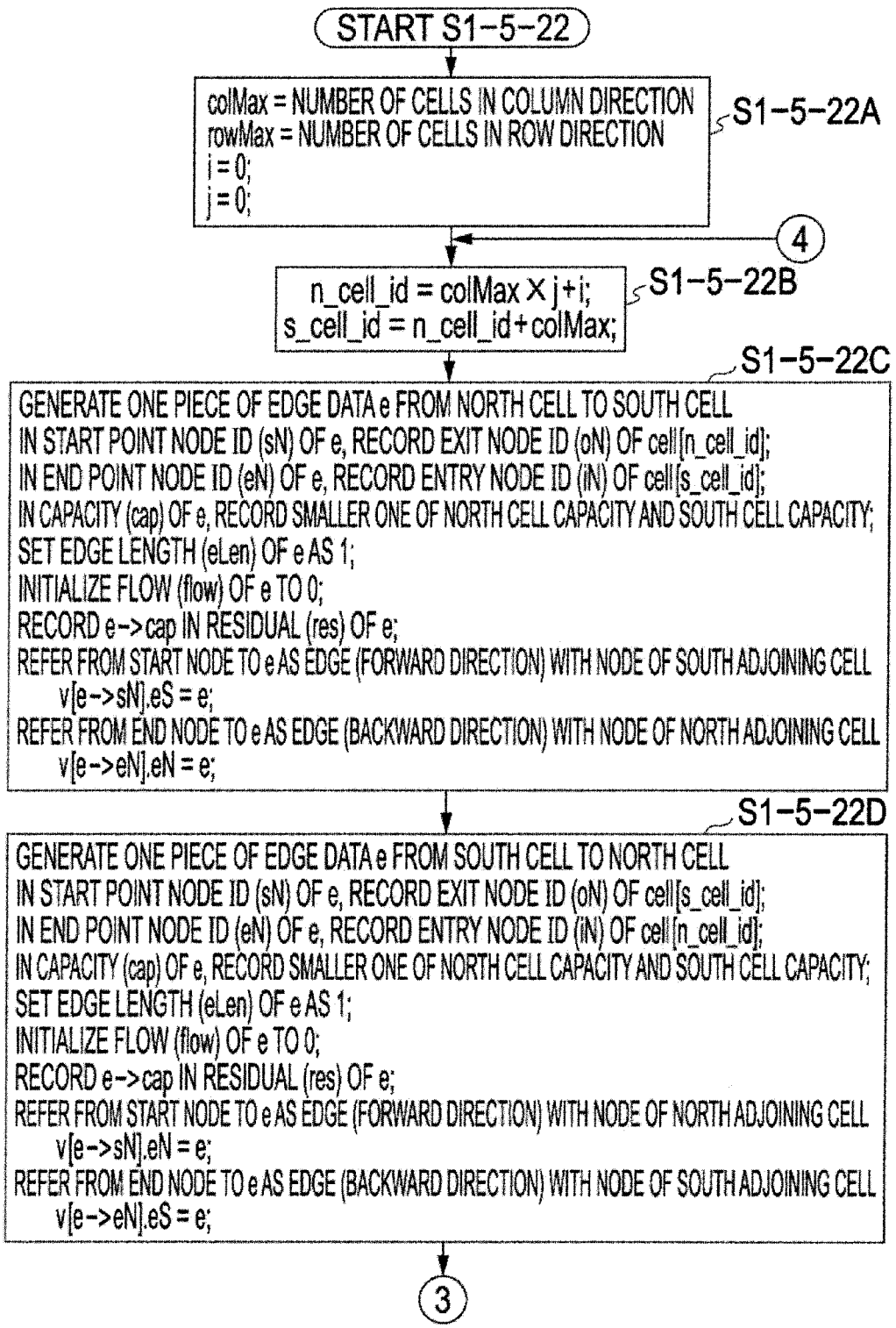
FIGS. 32 A and B are flow charts for describing a processing procedure of a generation processing for a directed edge from the exit node to the entry node of the cells adjacent in the north and south direction.
Figure 32B:
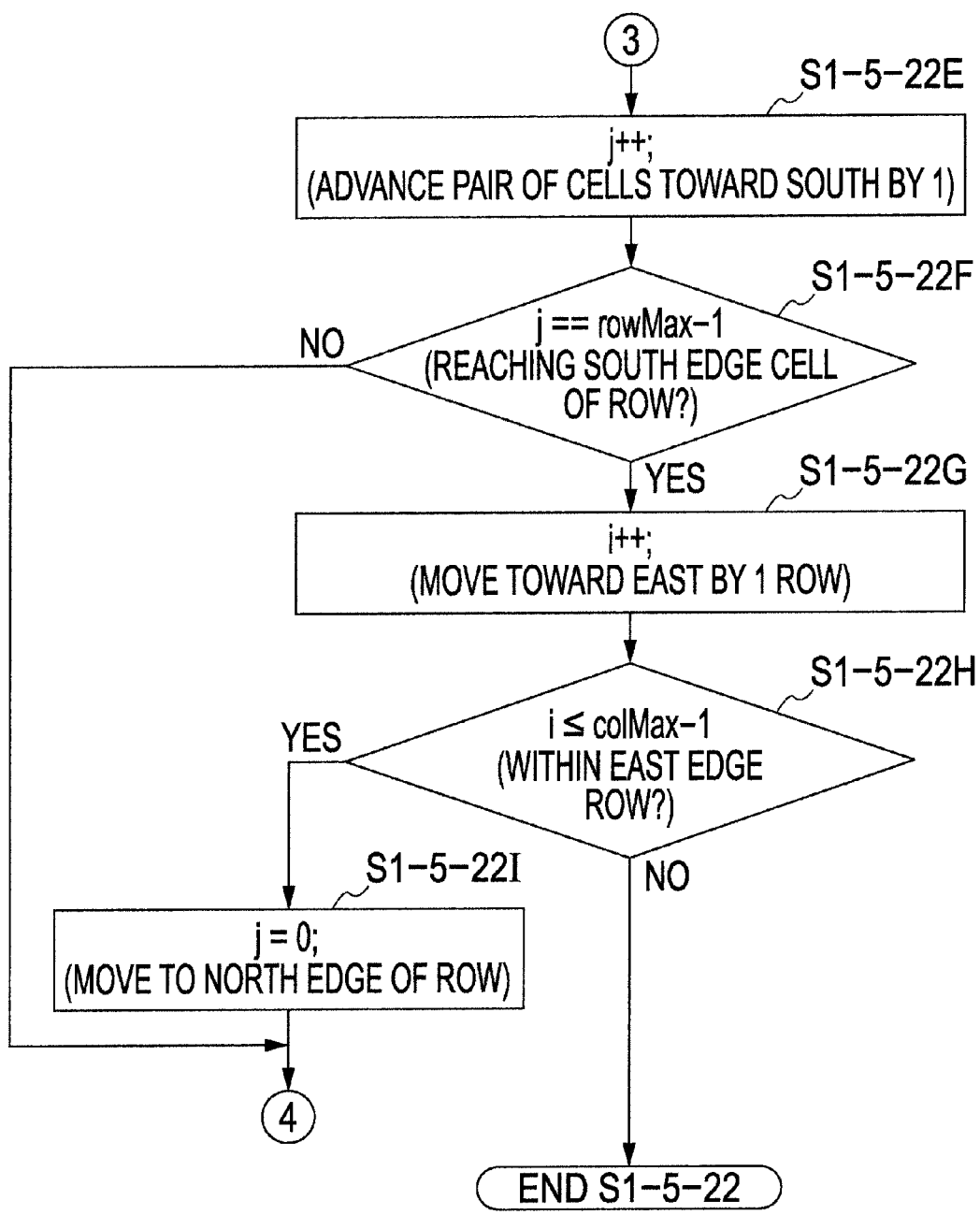

Then, a description will be given of a detail of step S1-5-22 in FIG. 27. FIGS. 32A and B are flow charts for describing a processing procedure of a generation processing for the directed edge from the exit node to the entry node of the cells adjacent in the north and south direction.

In step S1-5-22A, the directed edge generation unit 114 substitutes the number of cells in the column direction to the variable colMax and the number of cells in the row direction to the variable rowMax. Also, the directed edge generation unit 114 initializes each of the variable i and the variable j by 0. The variable i is used as an offset value in the column direction of the two processing subject cells adjacent in the north and the south. The variable j is used as an offset value in the row direction of the cell in the north side among the two processing subject cells adjacent in the north and the south.

Then, the directed edge generation unit 114 calculates n_cell_id=colMax×j+i and further calculates s_cell_id=n_cell_id+colMax (S1-5-22B). In the cell data array cell, n_cell_id is a suffix with respect to the element (cell data) corresponding to the processing subject cell on the north side (north cell). Also, s_cell_id is a suffix with respect to the element (cell data) corresponding to the processing subject cell on the south side (south cell). It may be noted that at first, the north cell is the cell in row 1, column 1, and the south cell is the cell in row 2, column 1.

Then, the directed edge generation unit 114 generates one edge data e corresponding to the directed edge from the exit node of the north cell to the entry node of the south cell in the memory apparatus 103 and records the value in the member variable of the edge data e (S1-5-22C). To be specific, in the start point node ID (sN) of the edge data e, the exit node ID (oN) of the cell data on the north cell (cell data array cell [n_cell_id]) is recorded. Also, in the end point node ID (eN) of the edge data e, the entry node ID (iN) of the cell data on the south cell (cell data array cell[s_cell_id]) is recorded. According to this, the edge data e is edge data corresponding to the directed edge from the exit node of the north cell to the entry node of the south cell. Also, a smaller one of the value of the capacity (cap) of the cell data on the north cell and the value of the capacity of the cell data on the south cell is recorded in the capacity (cap) of the edge data e. That is, the capacity of the directed edge from the exit node of the cells adjacent in the south and the north to the entry node is set as the minimum value of the capacities of the adjacent cells. Also, 1 is recorded in the edge length (eLen) of the edge data e. Also, the initial value 0 is recorded in the flow (flow) of the edge data e. Also, the value of the capacity (cap) of the edge data e is recorded in the residual (res) of the edge data e.

Also, the directed edge generation unit 114 records the edge data e in the directed edge with the node of the cell adjacent in the south (eS) of the node data on the start point of the edge data e (node data array v[e→sN]). Also, the directed edge generation unit 114 records the edge data e in the directed edge with the node of the cell adjacent in the north (eN) of the node data on the end point node of the edge data e (node data array v[e→eN]). According to this, in each of the node data on the exit node of the north cell and the node data on the entry node of the south cell, the edge data on the directed edge with the other node is registered.

Then, the directed edge generation unit 114 generates one edge data e corresponding to the directed edge from the exit node of the south cell to the entry node of the north cell in the memory apparatus 103 and records the value in the member variable of the edge data e (S1-5-22D). To be specific, in the start point node ID (sN) of the edge data e, the exit node ID (oN) of the cell data on the south cell (cell data array cell [s_cell_id]) is recorded. Also, in the end point node ID (eN) of the edge data e, the entry node ID (iN) of the cell data on the north cell (cell data array cell[n_cell_id]) is recorded. According to this, the edge data e is edge data corresponding to the directed edge from the exit node of the south cell to the entry node of the north cell. Also, a smaller one of the value of the capacity (cap) of the cell data on the south cell and the value of the capacity of the cell data on the north cell is recorded in the capacity (cap) of the edge data e. Also, 1 is recorded in the edge length (eLen) of the edge data e. Also, the initial value 0 is recorded in the flow (flow) of the edge data e. Also, the value of the capacity (cap) of the edge data e is recorded in the residual (res) of the edge data e.

Also, the directed edge generation unit 114 records the edge data e in the directed edge with the node of the cell adjacent in the north (eN) of the node data on the start point of the edge data e (node data array v[e→sN]). Also, the directed edge generation unit 114 records the edge data e in the directed edge with the node of the cell adjacent in the south (eS) of the node data on the end point node of the edge data e (node data array v[e→eN]). According to this, the node data on the exit node of the south cell and the node data on the entry node of the north cell, the edge data on the directed edge with the other node is registered.

Then, the directed edge generation unit 114 increments the variable j (S1-5-22E). That is, the two processing subject cells adjacent in the north and the south are shifted by one row on the south side in the cell array. Then, the directed edge generation unit 114 judges whether or not the value of the variable j reaches rowMax−1, that is, whether or not the processing subject north cell reaches the south edge of the cell array (S1-5-22F). In a case where the value of the variable j does not reach rowMax−1 (S1-5-22F: No), the directed edge generation unit 114 sets the cells adjacent in the north and the south which are shifted by one on the south side as the processing subject and executes the processing in step S1-5-22B and subsequent steps.

In a case where the value of the variable j reaches rowMax−1 (S1-5-22F: Yes), the directed edge generation unit 114 increments the value of the variable i (S1-5-22G). That is, the two processing subject cells adjacent in the north and the south are shifted by one column on the east side in the cell array. Then, the directed edge generation unit 114 judges whether or not the value of the variable i is equal to or smaller than colMax−1, that is, whether or not the processing subject cell reaches the east edge of the cell array (S1-5-22H). In a case where the value of the variable i is equal to or smaller than colMax−1 (S1-5-22H: Yes), the directed edge generation unit 114 sets the value of the variable j as 0 (S1-5-22I) and executes the processing in step S1-5-22B and subsequent steps. By setting the value of the variable j as 0, the processing subject north cell is shifted to the north edge in the cell array. On the other hand, in a case where the value of the variable i exceeds colMax−1 (S1-5-22H: No), the directed edge generation unit 114 ends the processing of FIGS. 32A and B. The processing result of FIGS. 32A and B are as shown in FIG. 29.

Figure 33A:
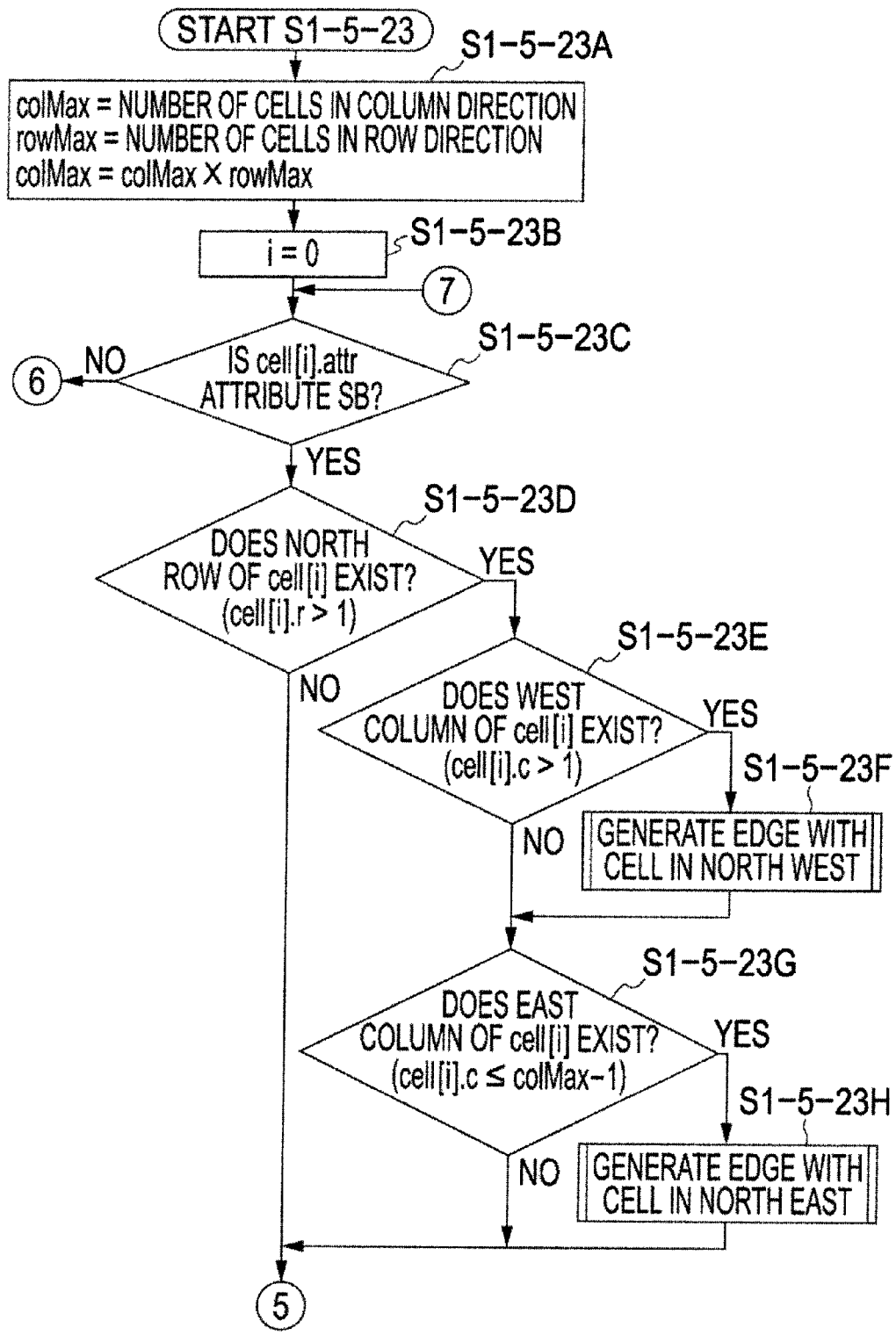
FIGS. 33A and B are flow charts for describing a processing procedure of a generation processing for a directed edge between the obliquely adjacent cells.

Then, a description will be given of a detail of step S1-5-23 in FIG. 27. FIGS. 33A and B are flow charts for describing a processing procedure of a generation processing for the directed edge between the obliquely adjacent cells.

In step S1-5-23A, the directed edge generation unit 114 substitutes the number of cells in the column direction to the variable colMax, substitutes the number of cells in the row direction to the variable rowMax, and substitutes the total number of cells to the variable cellMax (colMax×rowMax). Then, the directed edge generation unit 114 substitutes the initial value 0 to the variable i (S1-5-23B). The variable i is utilized as a suffix for the element (cell data) which is the processing subject in the cell data array cell.

Then, the directed edge generation unit 114 judges whether or not the value of the cell attribute (attr) of the processing subject cell data (cell data array cell[i]) is "SB (between the diagonal pins)" (S1-5-23C). In a case where the value of the cell attribute of the processing subject cell data is SB (S1-5-23C: Yes), the directed edge generation unit 114 judges whether or not the row number (r) of the relevant cell data is larger than 1 to judge whether or not the cell row exists further on the north side of the cell of the relevant cell data (S1-5-23D).

In a case where the cell row exists further on the north side of the cell of the relevant cell data (S1-5-23D: Yes), the directed edge generation unit 114 judges whether or not the column number (c) of the relevant cell data is larger than 1 to judge whether or not the cell column exists further on the west side of the cell of the relevant cell data (S1-5-23E). In a case where the cell column exists further on the west side of the cell of the relevant cell data (S1-5-23E: Yes), the directed edge generation unit 114 generates the directed edge between the relevant cell and the north west cell (S1-5-23F).

Following step S1-5-23F or the case of No in step S1-5-23E, the directed edge generation unit 114 judges whether or not the column number (c) of the processing subject cell data is equal to or smaller than colMax−1 to judge whether or not the cell column exists further on the east side of the cell of the relevant cell data (S1-5-23G). In a case where the cell column exists further on the east side of the cell of the relevant cell data (S1-5-23G: Yes), the directed edge generation unit 114 generates the directed edge between the relevant cell and the north east cell (S1-5-23H).

Following step S1-5-23H, the case of No in step S1-5-23G, or the case of No in step S1-5-23D, the directed edge generation unit 114 judges whether or not the row number (r) of the processing subject cell data is equal to or smaller than rowMax−1 to judge whether or not the cell row exists further on the south side of the cell of the relevant cell data (S1-5-23I). In a case where the cell row exists further on the south side of the cell of the relevant cell data (S1-5-23I: Yes), the directed edge generation unit 114 judges whether or not the column number (c) of the relevant cell data is larger than 1 to judge whether or not the cell column exists further on the west side of the cell of the relevant cell data (S1-5-23J). In a case where the cell column exists further on the west side of the cell of the relevant cell data (S1-5-23J Yes), the directed edge generation unit 114 generates the directed edge between the relevant cell and the south west cell (S1-5-23K).

Following step S1-5-3K or the case of No in step S1-5-23J, the directed edge generation unit 114 judges whether or not the column number (c) of the processing subject cell data is equal to or smaller than colMax−1 to judge whether or not the cell column exists further on the east side of the cell of the relevant cell data (S1-5-23L). In a case where the cell column exists further on the east side of the cell of the relevant cell data (S1-5-23L: Yes), the directed edge generation unit 114 generates the directed edge between the relevant cell and the south east cell (S1-5-23M).

Following step S1-5-23M, the case of No in step S1-5-23L, the case of No in step S1-5-23I, or the case of No in step S1-5-23C, the directed edge generation unit 114 increments the variable i (S1-5-23N). Then, the directed edge generation unit 114 judges whether or not the value of the variable i is smaller than cellMax (the total number of cells) to judge whether or not the unprocessed cell data remains (S1-5-23O). In a case where the unprocessed cell data remains (S1-5-23O: Yes), the directed edge generation unit 114 sets the next cell data as the processing subject and repeatedly executes the processing in step S1-5-23B and subsequent steps. In a case where the unprocessed cell data does not remain (S1-5-23O: No), the directed edge generation unit 114 ends the processing of FIGS. 33A and B. The processing result of FIGS. 33A and B are as shown in FIG. 30.

Figure 34:
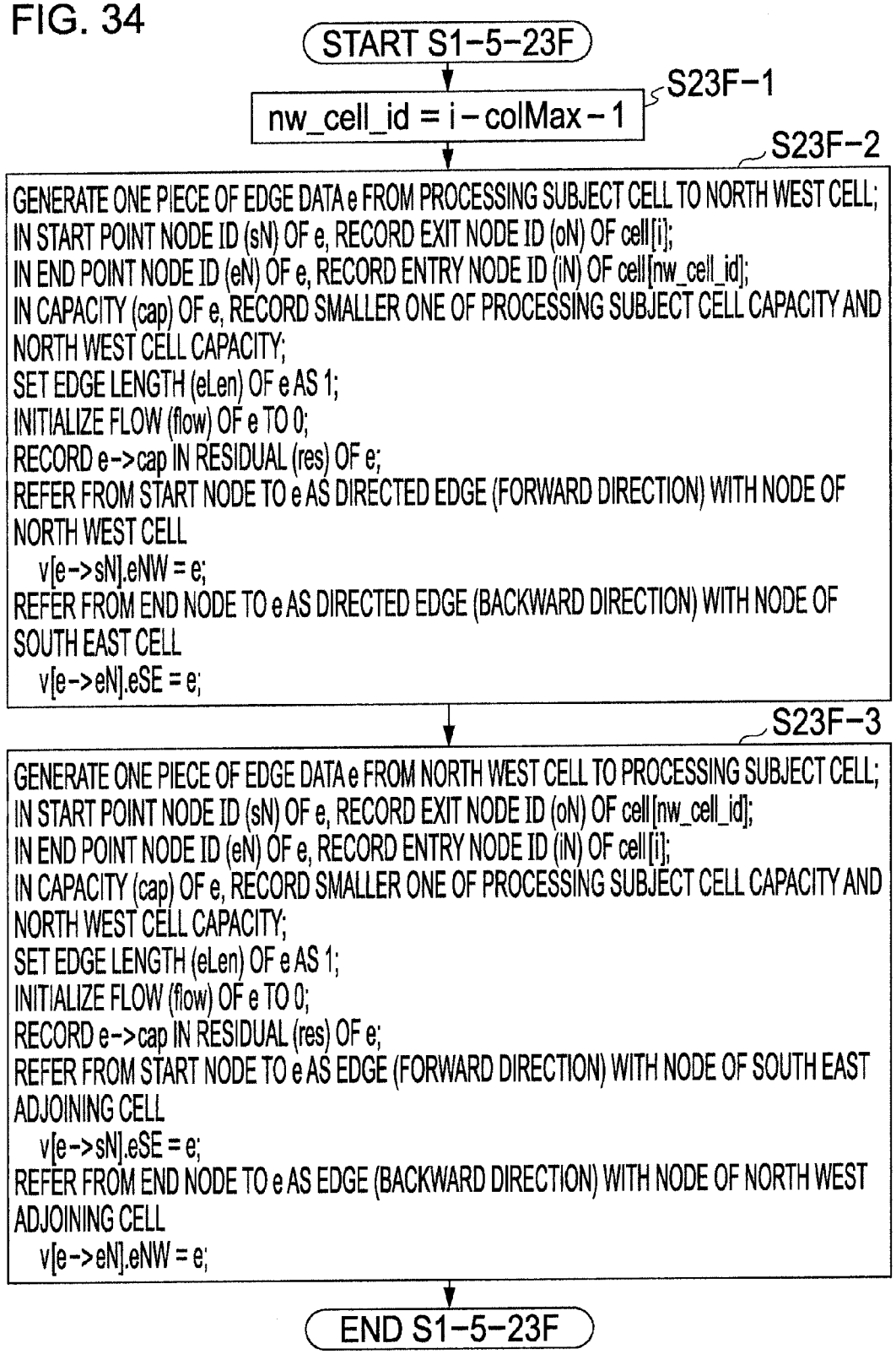
FIG. 34 is a flow chart for describing a processing procedure of a generation processing for a directed edge with the cell in the North West.

Then, a description will be given of a detail of step S1-5-23F in FIG. 33A. FIG. 34 is a flow chart for describing a processing procedure of a generation processing for the directed edge with the cell in the north west.

In step S23F-1, the directed edge generation unit 114 calculates nw_cell_id=i−colMax−1. Herein, the values of the variable i and colMax are values when step S1-5-23F is called in the processing of FIG. 33. Therefore, the calculation result nw_cell_id is a suffix with respect to the cell data on the cell in the north west (north west cell) of the cell of the cell data which is set as the processing subject in the processing of FIG. 33.

Then, the directed edge generation unit 114 generates one piece of edge data e corresponding to the directed edge from the exit node of the processing subject cell to the entry node of the north west cell in the memory apparatus 103 and records the value in the member variable of the edge data e (S23F-2). To be specific, in the start point node ID (sN) of the edge data e, the exit node ID (oN) of the cell data on the processing subject cell (cell data array cell[i]) is recorded. Also, in the end point node ID (eN) of the edge data e, the entry node ID (iN) of the cell data on the north west cell (cell data array cell[nw_cell_id]) is recorded. According to this, the edge data e is edge data corresponding to the directed edge from the exit node of the processing subject cell to the entry node of the north west cell. Also, a smaller one of the value of the capacity (cap) of the cell data on the processing subject cell and the value of the capacity of the cell data on the north west cell is recorded in the capacity (cap) of the edge data e. Also, 1 is recorded in the edge length (eLen) of the edge data e. Also, the initial value 0 is recorded in the flow (flow) of the edge data e. Also, the value of the capacity (cap) of the edge data e is recorded in the residual (res) of the edge data e.

Also, the directed edge generation unit 114 records the directed edge with the node of the north west cell (eNW) of the node data on the start point of the edge data e (node data array v[e→sN]) in the edge data e. Also, the directed edge generation unit 114 records the edge data e in the directed edge with the node of the south east cell (eSE) of the node data on the end point node of the edge data e (node data array v[e→eN]). According to this, in each of the node data on the exit node of the processing subject and the node data on the entry node of the north west cell, the edge data on the directed edge with the other node is registered.

Then, the directed edge generation unit 114 generates one piece of edge data e corresponding to the directed edge from the exit node of the north west cell to the entry node of the processing subject cell in the memory apparatus 103 and records the value in the member variable of the edge data e (S23F-3). To be specific, in the start point node ID (sN) of the edge data e, the exit node ID (oN) of the cell data on the north west cell (cell data array cell[nw_cell_id]) is recorded. Also, in the end point node ID (eN) of the edge data e, the entry node ID (iN) of the cell data (cell data array cell[i]) on the processing subject cell. According to this, the edge data e is edge data corresponding to the directed edge from the exit node of the north west cell to the entry node of the processing subject cell. Also, a smaller one of the value of the capacity (cap) of the cell data on the north west cell and the value of the capacity of the cell data on the processing subject cell is recorded in the capacity (cap) of the edge data e. Also, 1 is recorded in the edge length (eLen) of the edge data e. Also, the initial value 0 is recorded in the flow (flow) of the edge data e. Also, the value of the capacity (cap) of the edge data e is recorded in the residual (res) of the edge data e.

Also, the directed edge generation unit 114 records the edge data e in the directed edge with the node of the south east cell (eSE) of the node data on the start point of the edge data e (node data array v[e→sN]). Also, the directed edge generation unit 114 records the edge data e in the directed edge with the node of the north west cell (eNW) of the node data on the end point node of the edge data e (node data array v[e→eN]). According to this, in each of the node data on the exit node of the north west cell and the node data on the entry node of the processing subject, the edge data on the directed edge with the other node is registered.

Figure 33B:
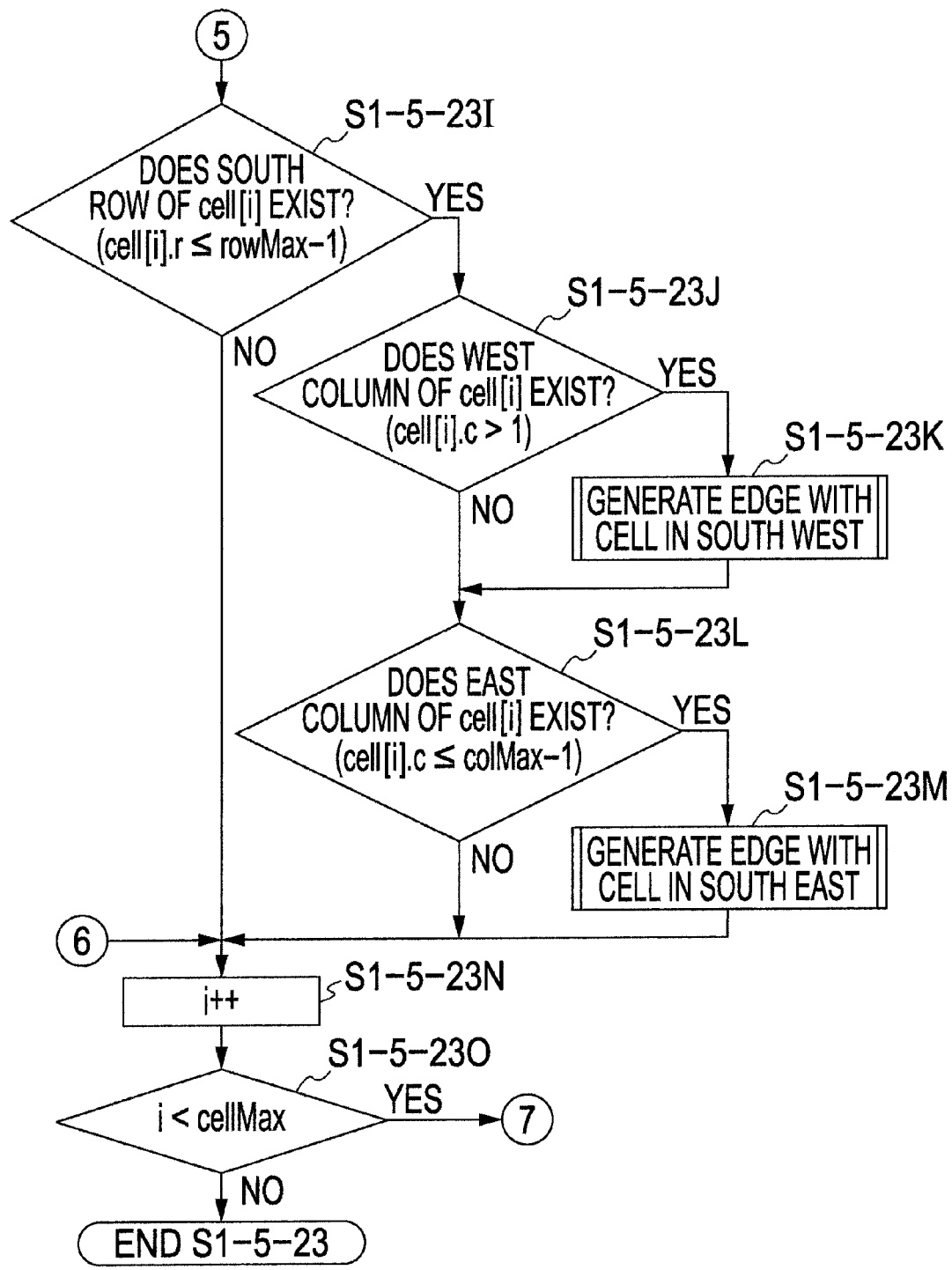
Figure 35:
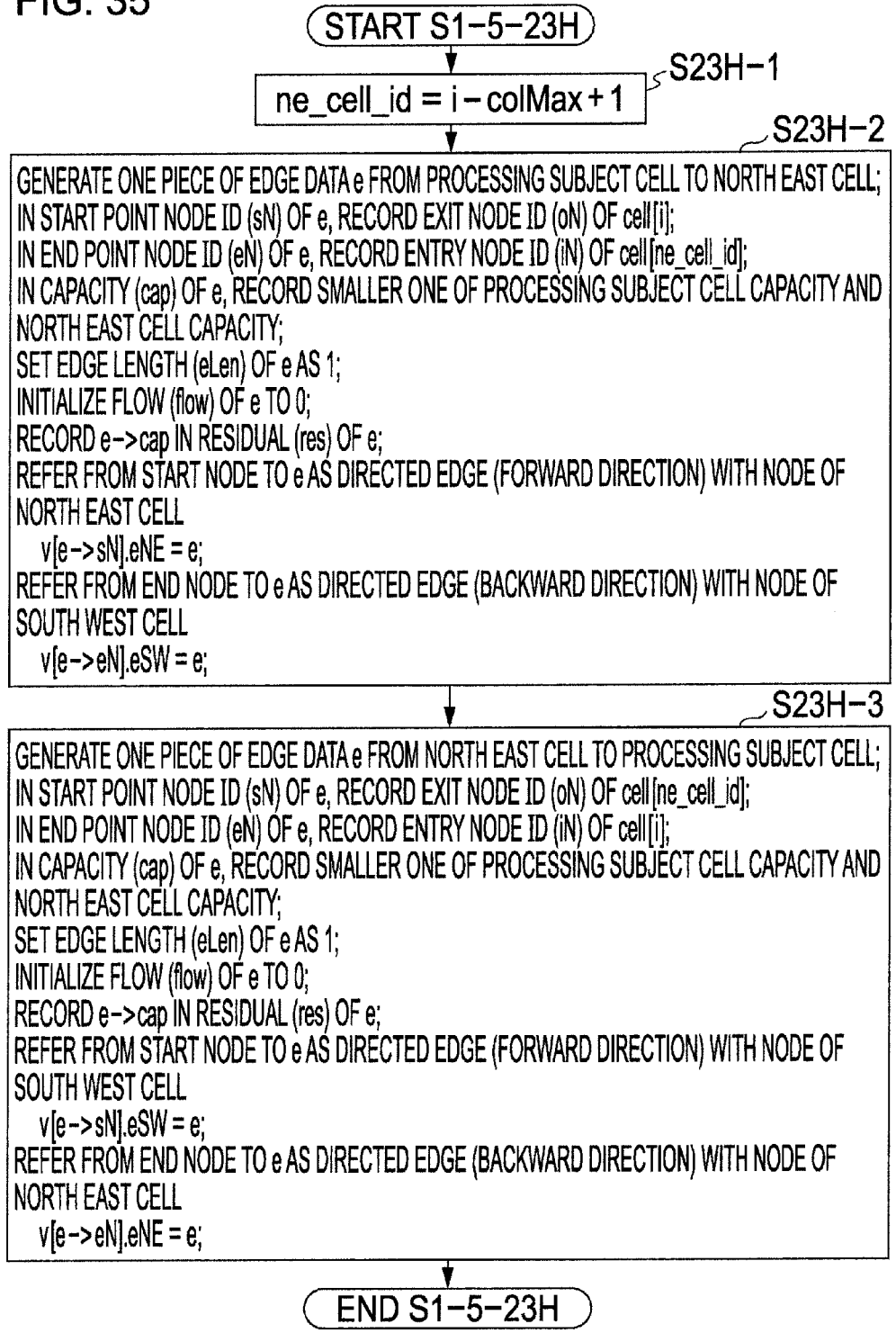
FIG. 35 is a flow chart for describing a processing procedure of a generation processing for a directed edge with the cell in the north east.

Then, a description will be given of a detail of step S1-5-23H in FIG. 33. FIG. 35 is a flow chart for describing a processing procedure of a generation processing for the directed edge with the cell in the north east.

In step S23H-1, the directed edge generation unit 114 calculates ne_cell_id=i−colMax+1. Herein, the values of the variable i and colMax are values when step S1-5-23H is called in the processing of FIG. 33. Therefore, the calculation result ne_cell_id is a suffix with respect to the cell data on the cell in the north east (north east cell) of the cell of the cell data which is set as the processing subject in the processing of FIG. 33.

Then, the directed edge generation unit 114 generates one piece of edge data e corresponding to the directed edge from the exit node of the processing subject cell to the entry node of the north east cell in the memory apparatus 103 and records the value in the member variable of the edge data e (S23H-2). To be specific, in the start point node ID (sN) of the edge data e, the exit node ID (oN) of the cell data on the processing subject cell (cell data array cell[i]) is recorded. Also, in the end point node ID (eN) of the edge data e, the entry node ID (iN) of the cell data on the north east cell (cell data array cell[ne_cell_id]) is recorded. According to this, the edge data e is edge data corresponding to the directed edge from the exit node of the processing subject cell to the entry node of the north east cell. Also, a smaller one of the value of the capacity (cap) of the cell data on the processing subject cell and the value of the capacity of the cell data on the north east cell is recorded in the capacity (cap) of the edge data e. Also, 1 is recorded in the edge length (eLen) of the edge data e. Also, the initial value 0 is recorded in the flow (flow) of the edge data e. Also, the value of the capacity (cap) of the edge data e is recorded in the residual (res) of the edge data e.

Also, the directed edge generation unit 114 records the edge data e in the directed edge with the node of the north east cell (eNE) of the node data on the start point of the edge data e (node data array v[e→sN]). Also, the directed edge generation unit 114 records the edge data e in the directed edge with the node of the south west cell (eSW) of the node data on the end point node of the edge data e (node data array v[e→eN]). According to this, in each of the node data on the exit node of the processing subject and the node data on the entry node of the north east cell, the edge data on the directed edge with the other node is registered.

Then, the directed edge generation unit 114 generates one piece of edge data e corresponding to the directed edge from the exit node of the north east cell to the entry node of the processing subject cell in the memory apparatus 103 and records the value in the member variable of the edge data e (S23H-3). To be specific, in the start point node ID (sN) of the edge data e, the exit node ID (oN) of the cell data on the north east cell (cell data array cell[ne_cell_id]) is recorded. Also, in the end point node ID (eN) of the edge data e, the entry node ID (iN) of the cell data (cell data array cell[i]) on the processing subject cell. According to this, the edge data e is edge data corresponding to the directed edge from the exit node of the north east cell to the entry node of the processing subject cell. Also, a smaller one of the value of the capacity (cap) of the cell data on the north east cell and the value of the capacity of the cell data on the processing subject cell is recorded in the capacity (cap) of the edge data e. Also, 1 is recorded in the edge length (eLen) of the edge data e. Also, the initial value 0 is recorded in the flow (flow) of the edge data e. Also, the value of the capacity (cap) of the edge data e is recorded in the residual (res) of the edge data e.

Also, the directed edge generation unit 114 records the edge data e in the directed edge with the node of the south west cell (eSW) of the node data on the start point of the edge data e (node data array v[e→sN]). Also, the directed edge generation unit 114 records the edge data e in the directed edge with the node of the north east cell (eNE) of the node data on the end point node of the edge data e (node data array v[e→eN]). According to this, in each of the node data on the exit node of the north east cell and the node data on the entry node of the processing subject, the edge data on the directed edge with the other node is registered.

Figure 36:
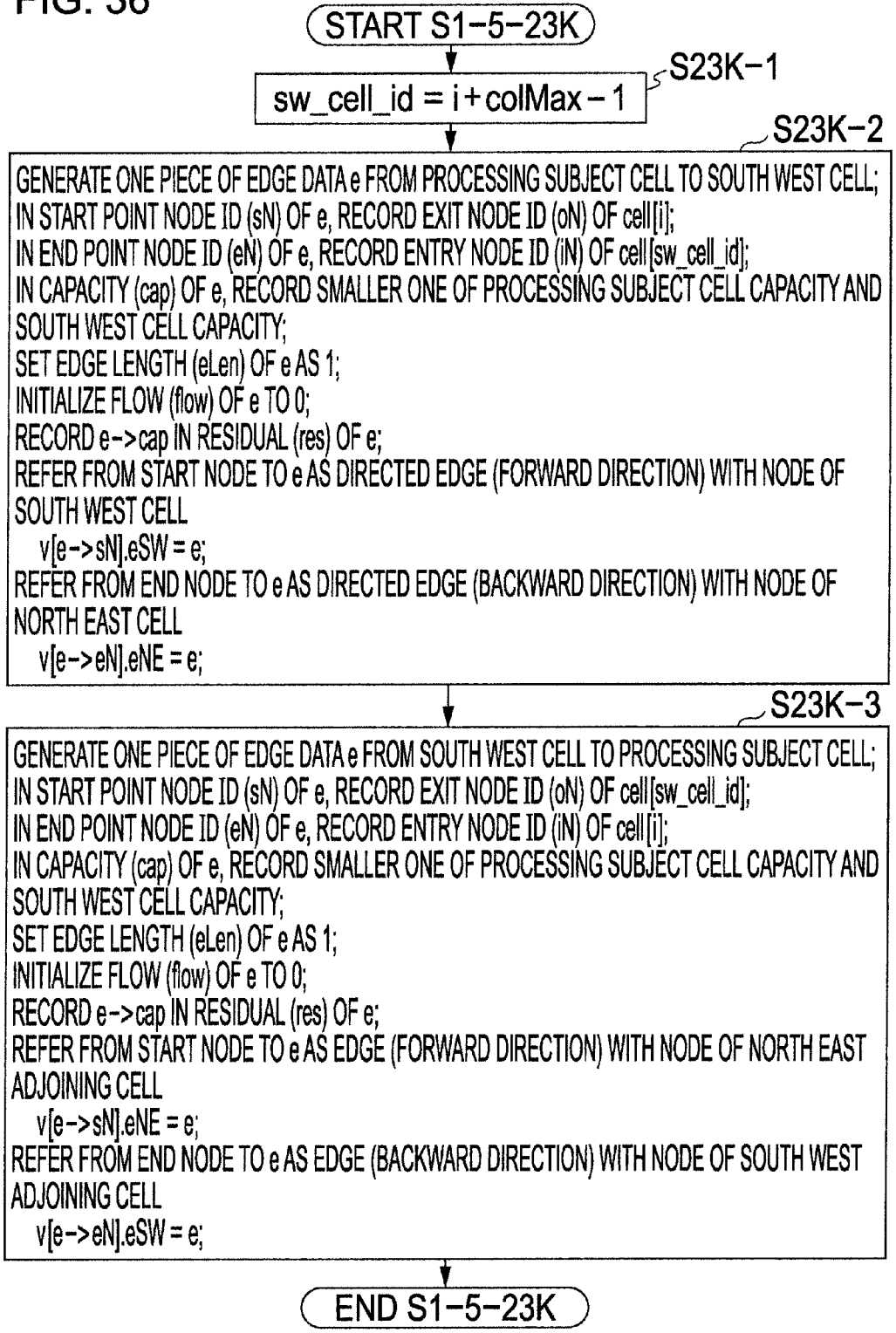
FIG. 36 is a flow chart for describing a processing procedure of a generation processing for a directed edge with the cell in the south west.

Then, a description will be given of a detail of step S1-5-23K in FIG. 33. FIG. 36 is a flow chart for describing a processing procedure of a generation processing for the directed edge with the cell in the south west.

In step S23K-1, the directed edge generation unit 114 calculates sw_cell_id=i+colMax−1. Herein, the values of the variable i and colMax are values when step S1-5-23K is called in the processing of FIG. 33. Therefore, the calculation result sw_cell_id is a suffix with respect to the cell data on the cell in the south west (south west cell) of the cell of the cell data which is set as the processing subject in the processing of FIG. 33.

Then, the directed edge generation unit 114 generates one piece of edge data e corresponding to the directed edge from the exit node of the processing subject cell to the entry node of the south west cell in the memory apparatus 103 and records the value in the member variable of the edge data e (S23K-2). To be specific, in the start point node ID (sN) of the edge data e, the exit node ID (oN) of the cell data on the processing subject cell (cell data array cell[i]) is recorded. Also, in the end point node ID (eN) of the edge data e, the entry node ID (iN) of the cell data on the south west cell (cell data array cell[sw_cell_id]) is recorded. According to this, the edge data e is edge data corresponding to the directed edge from the exit node of the processing subject cell to the entry node of the south west cell. Also, a smaller one of the value of the capacity (cap) of the cell data on the processing subject cell and the value of the capacity of the cell data on the south west cell is recorded in the capacity (cap) of the edge data e. Also, 1 is recorded in the edge length (eLen) of the edge data e. Also, the initial value 0 is recorded in the flow (flow) of the edge data e. Also, the value of the capacity (cap) of the edge data e is recorded in the residual (res) of the edge data e.

Also, the directed edge generation unit 114 records the edge data e in the directed edge with the node of the south west cell (eSW) of the node data on the start point of the edge data e (node data array v[e→sN]). Also, the directed edge generation unit 114 records the edge data e in the directed edge with the node of the north east cell (eNE) of the node data on the end point node of the edge data e (node data array v[e→eN]). According to this, in each of the node data on the exit node of the processing subject and the node data on the entry node of the south west cell, the edge data on the directed edge with the other node is registered.

Then, the directed edge generation unit 114 generates one piece of edge data e corresponding to the directed edge from the exit node of the south west cell to the entry node of the processing subject cell in the memory apparatus 103 and records the value in the member variable of the edge data e (S23K-3). To be specific, in the start point node ID (sN) of the edge data e, the exit node ID (oN) of the cell data on the south west cell (cell data array cell[sw_cell_id]) is recorded. Also, in the end point node ID (eN) of the edge data e, the entry node ID (iN) of the cell data (cell data array cell[i]) on the processing subject cell. According to this, the edge data e is edge data corresponding to the directed edge from the exit node of the south west cell to the entry node of the processing subject cell. Also, a smaller one of the value of the capacity (cap) of the cell data on the south west cell and the value of the capacity of the cell data on the processing subject cell is recorded in the capacity (cap) of the edge data e. Also, 1 is recorded in the edge length (eLen) of the edge data e. Also, the initial value 0 is recorded in the flow (flow) of the edge data e. Also, the value of the capacity (cap) of the edge data e is recorded in the residual (res) of the edge data e.

Also, the directed edge generation unit 114 records the edge data e in the directed edge with the node of the north east cell (eNE) of the node data on the start point of the edge data e (node data array v[e→sN]). Also, the directed edge generation unit 114 records the edge data e in the directed edge with the node of the south west cell (eSW) of the node data on the end point node of the edge data e (node data array v[e→eN]). According to this, in each of the node data on the exit node of the south west cell and the node data on the entry node of the processing subject, the edge data on the directed edge with the other node is registered.

Figure 37:
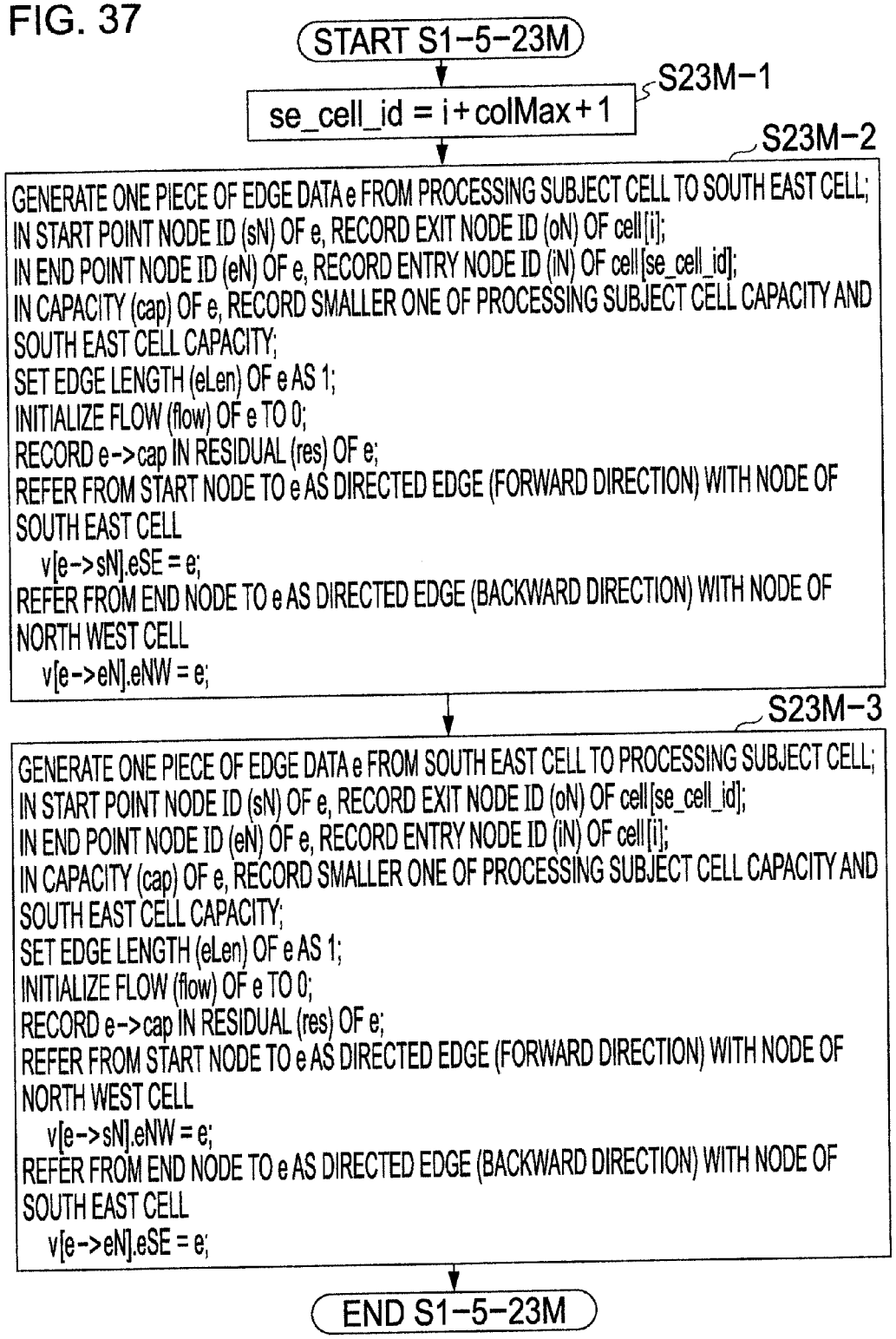
FIG. 37 is a flow chart for describing a processing procedure of a generation processing for a directed edge with the cell in the south east.

Then, a description will be given of a detail of step S1-5-23M in FIG. 33. FIG. 37 is a flow chart for describing a processing procedure of a generation processing for the directed edge with the cell in the south east.

In step S23M-1, the directed edge generation unit 114 calculates se_cell_id=i+colMax+1. Herein, the values of the variable i and colMax are values when step S1-5-23M is called in the processing of FIG. 33. Therefore, the calculation result se_cell_id is a suffix with respect to the cell data on the cell in the south east (south east cell) of the cell of the cell data which is set as the processing subject in the processing of FIG. 33.

Then, the directed edge generation unit 114 generates one piece of edge data e corresponding to the directed edge from the exit node of the processing subject cell to the entry node of the south east cell in the memory apparatus 103 and records the value in the member variable of the edge data e (S23M-2). To be specific, in the start point node ID (sN) of the edge data e, the exit node ID (oN) of the cell data on the processing subject cell (cell data array cell[i]) is recorded. Also, in the end point node ID (eN) of the edge data e, the entry node ID (iN) of the cell data on the south east cell (cell data array cell[se_cell_id]) is recorded. According to this, the edge data e is edge data corresponding to the directed edge from the exit node of the processing subject cell to the entry node of the south east cell. Also, a smaller one of the value of the capacity (cap) of the cell data on the processing subject cell and the value of the capacity of the cell data on the south east cell is recorded in the capacity (cap) of the edge data e. Also, 1 is recorded in the edge length (eLen) of the edge data e. Also, the initial value 0 is recorded in the flow (flow) of the edge data e. Also, the value of the capacity (cap) of the edge data e is recorded in the residual (res) of the edge data e.

Also, the directed edge generation unit 114 records the edge data e in the directed edge with the node of the cell adjacent in the south east (eSE) of the node data on the start point of the edge data e (node data array v[e→sN]). Also, the directed edge generation unit 114 records the edge data e in the directed edge with the node of the north west cell (eNW) of the node data on the end point node of the edge data e (node data array v[e→eN]). According to this, in each of the node data on the exit node of the processing subject the node data on the entry node of the south east cell, the edge data on the directed edge with the other node is registered.

Then, the directed edge generation unit 114 generates one piece of edge data e corresponding to the directed edge from the exit node of the south cell to the entry node of the processing subject cell and records the value in the member variable of the edge data e (S23M-3). To be specific, in the start point node ID (sN) of the edge data e, the exit node ID (oN) of the cell data on the south east cell (cell data array cell[se_cell_id]) is recorded. Also, in the end point node ID (eN) of the edge data e, the entry node ID (iN) of the cell data (cell data array cell[i]) on the processing subject cell. According to this, the edge data e is edge data corresponding to the directed edge from the exit node of the south east cell to the entry node of the processing subject cell. Also, a smaller one of the value of the capacity (cap) of the cell data on the south east cell and the value of the capacity of the cell data on the processing subject cell is recorded in the capacity (cap) of the edge data e. Also, 1 is recorded in the edge length (eLen) of the edge data e. Also, the initial value 0 is recorded in the flow (flow) of the edge data e. Also, the value of the capacity (cap) of the edge data e is recorded in the residual (res) of the edge data e.

Also, the directed edge generation unit 114 records the edge data e in the directed edge with the node of the north west cell (eNW) of the node data on the start point of the edge data e (node data array v[e→sN]). Also, the directed edge generation unit 114 records the edge data e in the directed edge with the node of the cell adjacent in the south east (eSE) of the node data on the end point node of the edge data e (node data array v[e→eN]). According to this, in each of the node data on the exit node of the south east cell and the node data on the entry node of the processing subject, the edge data on the directed edge with the other node is registered.

Figure 38:
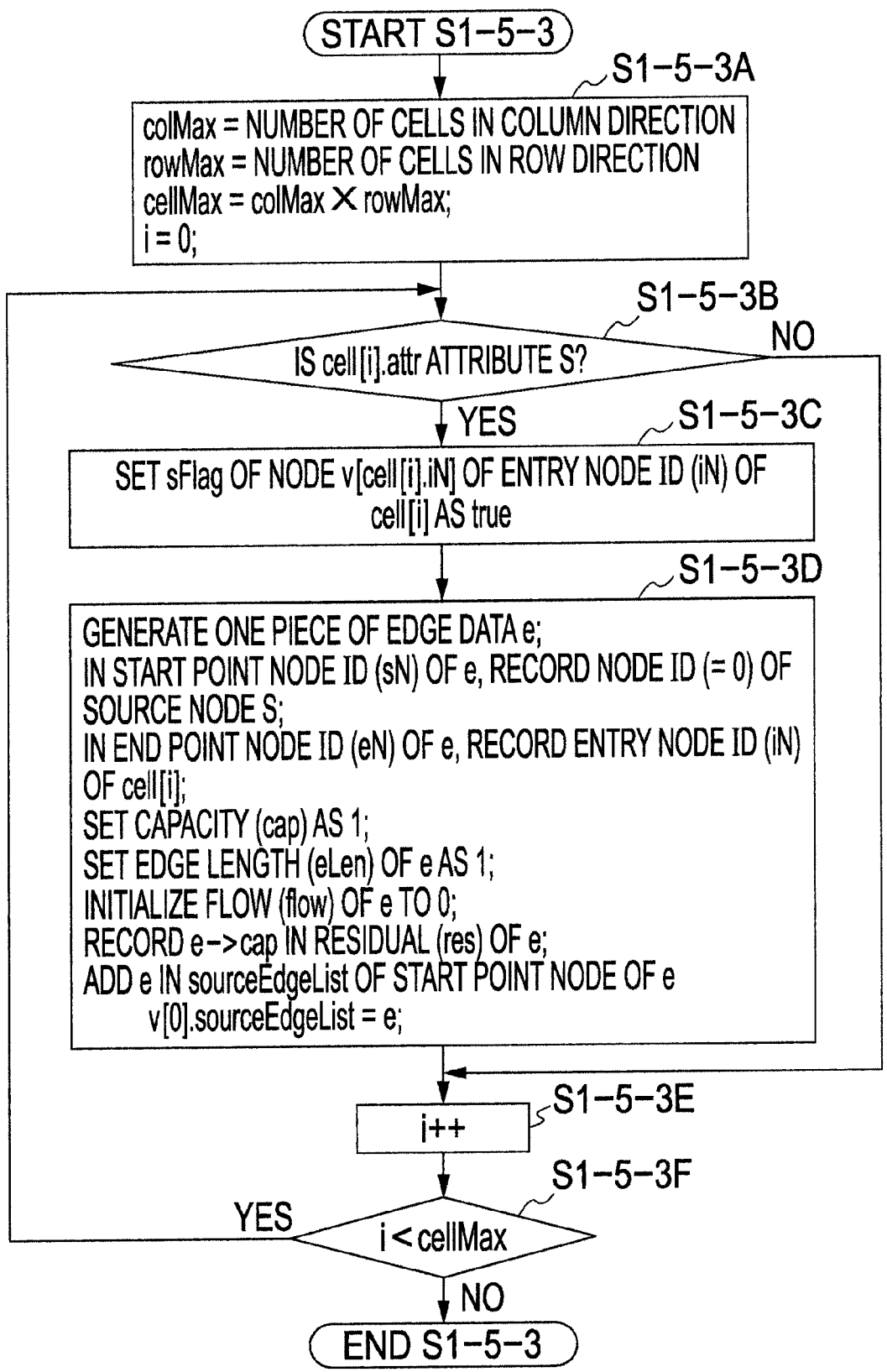
FIG. 38 is a flow chart for describing a processing procedure of a generation processing for a directed edge from the source node to a leading-out subject cell.

Then, a description will be given of a detail of step S1-5-3 in FIG. 23. FIG. 38 is a flow chart for describing a processing procedure of a generation processing for the directed edge from the source node to the leading-out subject cell.

In step S1-5-3A, the directed edge generation unit 114 substitutes the number of cells in the column direction to the variable colMax, substitutes the number of cells in the row direction to the variable rowMax, and substitutes the total number of cells to the variable cellMax (colMax×rowMax). Also, the directed edge generation unit 114 substitutes the initial value 0 to the variable i. The variable i is utilized as a suffix for the element (cell data) which is the processing subject in the cell data array cell.

Then, the directed edge generation unit 114 judges whether or not the value of the cell attribute (attr) of the processing subject cell data (cell data array cell[i]) is "S (the leading-out subject pin)" (S1-5-3B). In a case where the value of the cell attribute of the processing subject cell data is S (S1-5-3B: Yes), the directed edge generation unit 114 records true in the source flag (sFlag) of the node data (node data array v[cell[i].iN]) on the entry node of the cell of the processing subject cell data (S1-5-3C).

Then, the directed edge generation unit 114 generates one piece of edge data e corresponding to the directed edge from the source node S to the entry node of the processing subject cell and records the value in the member variable of the edge data e (S1-5-3D). To be specific, in the start point node ID (sN) of the edge data e, the node ID (0) of the source node S is recorded. Also, in the end point node ID (eN) of the edge data e, the entry node ID (iN) of the cell data (cell data array cell[i]) on the processing subject cell. According to this, the edge data e is edge data corresponding to the directed edge from the processing subject source node S to the entry node of the processing subject cell. Also, 1 is recorded in the capacity (cap) of the edge data e. That is, the capacity of the directed edge from the source node S to the entry node of the leading-out subject cell is set as 1. Also, 1 is recorded in the edge length (eLen) of the edge data e. Also, the initial value 0 is recorded in the flow (flow) of the edge data e. Also, the value of the capacity (cap) of the edge data e is recorded in the residual (res) of the edge data e.

Also, the directed edge generation unit 114 adds the edge data e to the list of the directed edges from the source node S (sourceEdgeList) of the data node (node data array v[0]) on the start point node (that is, the source node S) of the directed edge related to the edge data e.

Following step S1-5-3D or the case of No in step S1-5-3B, the directed edge generation unit 114 increments the variable i (S1-5-3E). That is, the next cell data is set as the processing subject in the cell data array cell. Then, the directed edge generation unit 114 judges whether or not the value of the variable i is smaller than cellMax (the total number of cells) to judge whether or not the unprocessed cell data exists (S1-5-3F). In a case where the unprocessed cell data exists (S1-5-3F: Yes), the directed edge generation unit 114 repeatedly executes the processing in step S1-5-3B and subsequent steps. In a case where the unprocessed cell data does not exist (S1-5-3F: No), the directed edge generation unit 114 ends the processing of FIG. 38.

Figure 39:
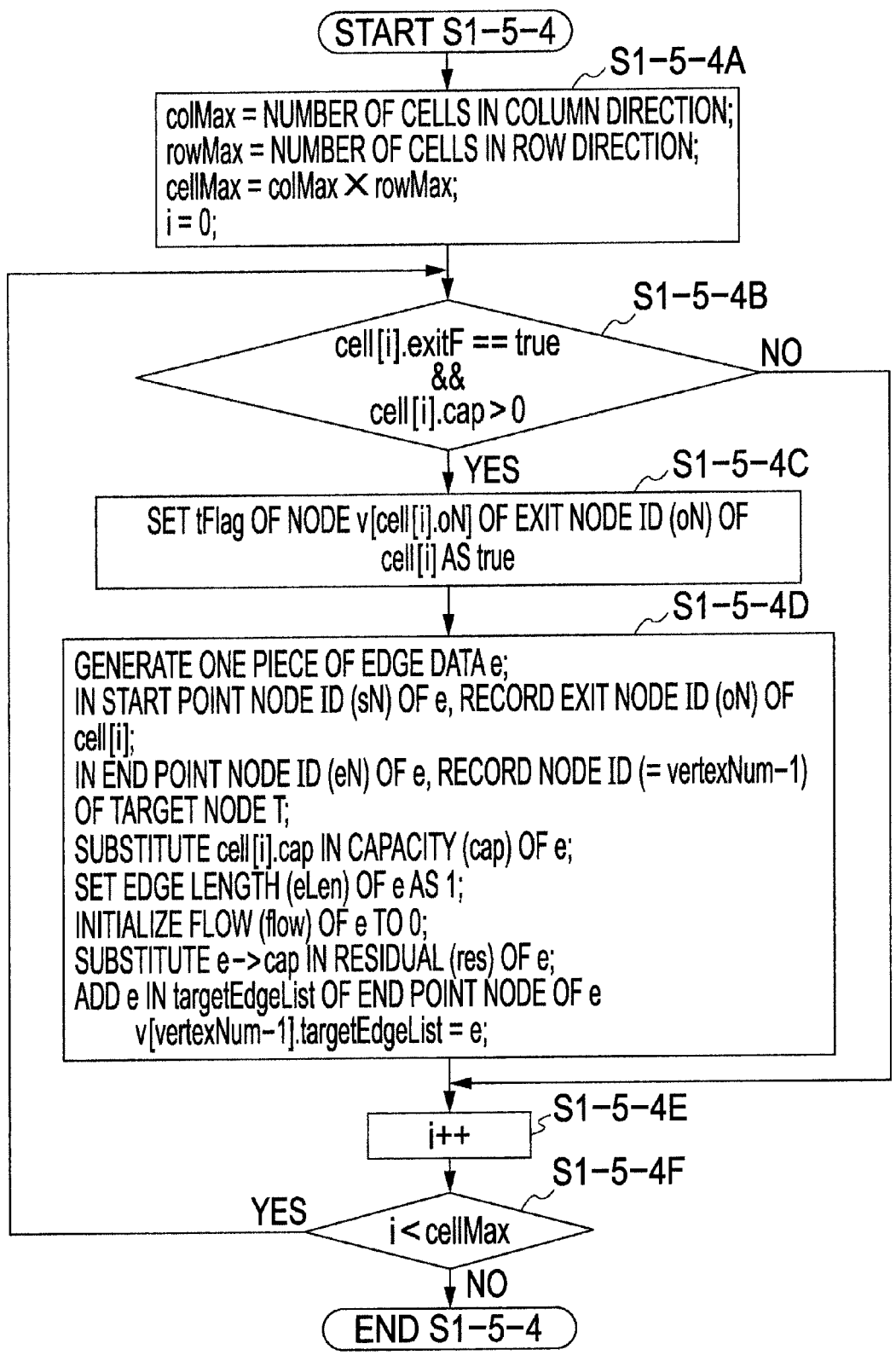
FIG. 39 is a flow chart for describing a processing procedure of a generation processing for a directed edge from an exit cell to a target node.

Then, a description will be given of a detail of step S1-5-4 in FIG. 23. FIG. 39 is a flow chart for describing a processing procedure of a generation processing for a directed edge from the exit cell to the target node.

In step S1-5-4A, the directed edge generation unit 114 substitutes the number of cells in the column direction to the variable colMax, substitutes the number of cells in the row direction to the variable rowMax, and substitutes the total number of cells to the variable cellMax (colMax×rowMax). Also, the directed edge generation unit 114 substitutes the initial value 0 to the variable i. The variable i is utilized as a suffix for the element (cell data) which is the processing subject in the cell data array cell.

Then, the directed edge generation unit 114 judges whether or not the value of the exit flag (exitF) of the processing subject cell data (cell data array cell[i]) is true and also the capacity of the processing subject cell data is larger than 0 (S1-5-4B). This judgment is equivalent to a judgment on whether or not the processing subject cell data is cell data corresponding to the exit cell. That is, the cell data whose value of the exit flag is true is cell data on the cell located on the outer circumstance in the cell array (see step S1-1-4 of FIG. 14). Also, among the cell located on the outer circumstance, the cell data whose capacity is larger than 0 is only the cell data on the exit cell (see step S1-2-6 of FIG. 16).

In the case of Yes in step S1-5-4B, that is, in a case where the processing subject cell data is the cell data on the exit cell, the directed edge generation unit 114 records true in the target flag (tFlag) of the node data on the exit node of the cell of the processing subject cell data (node data array v[cell[i].oN]) (S1-5-4C).

Then, the directed edge generation unit 114 generates one piece of edge data e corresponding to the directed edge from the processing subject cell to the entry node of the target node T and records the value in the member variable of the edge data e (S1-5-4D). To be specific, in the start point node ID (sN) of the edge data e, the exit node ID (oN) of the processing subject cell data (cell data array cell[i]) is recorded. Also, in the end point node ID (eN) of the edge data e, the node ID (vertexNum−1) of the target node T is recorded. According to this, the edge data e is edge data corresponding to the directed edge from the exit node of the processing subject cell to the target node T. Also, in the capacity (cap) of the edge data e, the capacity (cap) of the processing subject cell data is recorded. That is, the capacity of the directed edge from the exit node of the exit cell to the target node T is set as the capacity of the exit cell. Also, 1 is recorded in the edge length (eLen) of the edge data e. Also, the initial value 0 is recorded in the flow (flow) of the edge data e. Also, the value of the capacity (cap) of the edge data e is recorded in the residual (res) of the edge data e.

Also, the directed edge generation unit 114 adds the edge data e to the directed edge list (targetEdgeList) of the target node of the node data (node data array v[vertexNum−1]) on the end point node of the directed edge related to the edge data e (that is, the target node T).

Following step S1-5-4D or the case of No in step S1-5-4B, the directed edge generation unit 114 increments the variable i (S1-5-4E). That is, the next cell data is set as the processing subject in the cell data array cell. Then, the directed edge generation unit 114 judges whether or not the value of the variable i is smaller than cellMax (the total number of cells) to judge whether or not the unprocessed cell data exists (S1-5-4F). In a case where the unprocessed cell data exists (S1-5-4F: Yes), the directed edge generation unit 114 repeatedly executes the processing in step S1-5-4B and subsequent steps. In a case where the unprocessed cell data does not exist (S1-5-4F: No), the directed edge generation unit 114 ends the processing of FIG. 39.

Thus far, the description is ended with regard to step S1-5 of FIG. 9. That is, the description is ended with regard to step S1 of FIG. 5. The processing result at this time is as shown in FIG. 6.

Figure 40:
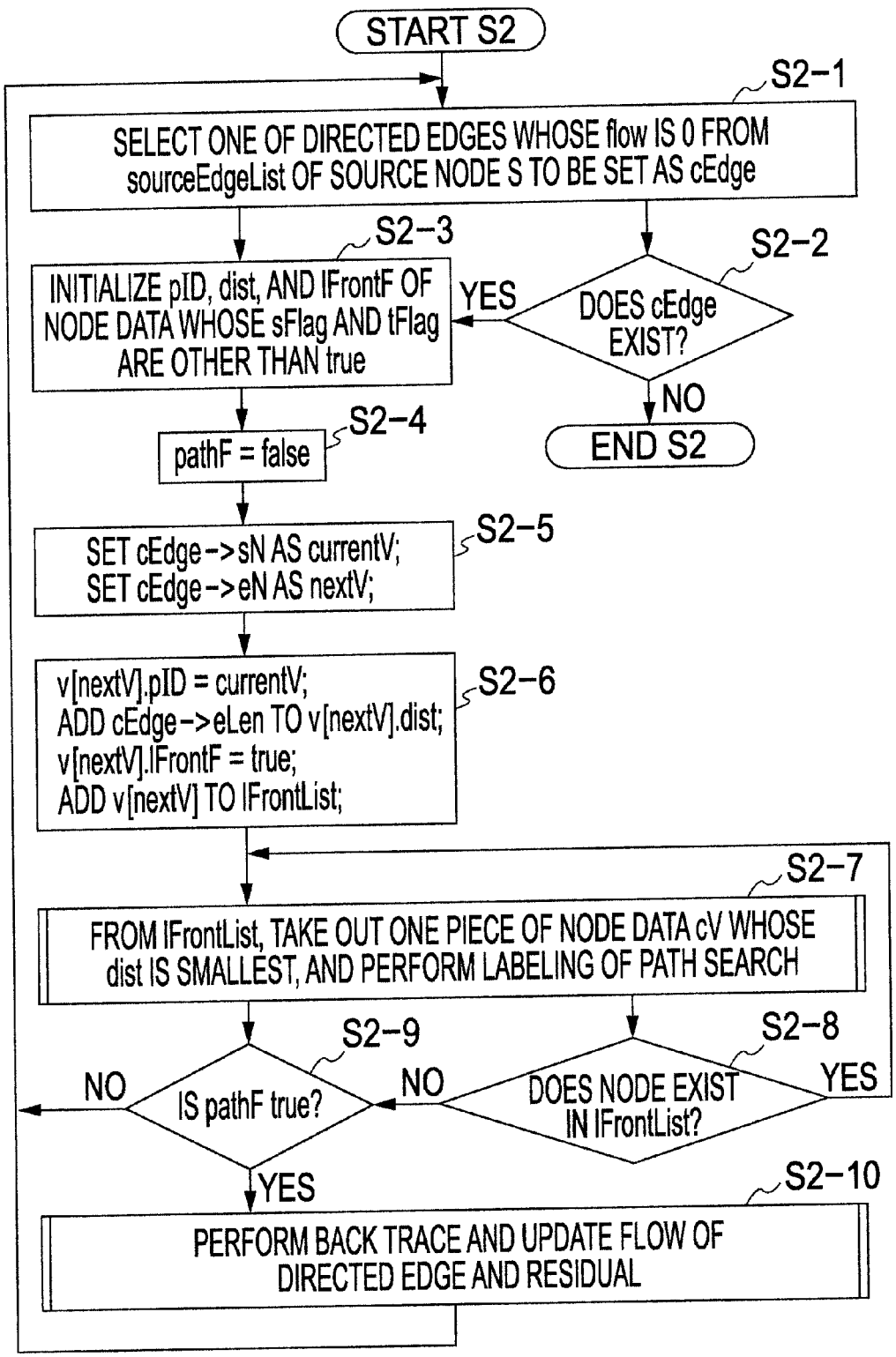
FIG. 40 is a flow chart for describing a processing procedure of a search processing of a shortest path in the directed graph (Flow network).

Then, a description will be given of a detail of step S2 in FIG. 5. FIG. 40 is a flow chart for describing a processing procedure of a search processing of a shortest path in the directed graph (Flow network). It may be noted that according to the present embodiment, as an algorithm for obtaining a shortest path, Dijkstra's Algorithm is adopted. It is however noted that another known algorithm may also be adopted.

In step S2-1, the shortest path search unit 121 obtains the edge data whose value of the flow (flow) is 0 from the list of the directed edges (sourceEdgeList) from the source node S of the node data on the source node S and substitutes a variable cEdge. In sourceEdgeList of the source node S, through the processing of FIG. 38, the edge data with respect to the directed edges from the source node S to all the entry nodes of the leading-out subject cell is recorded. In the example of FIG. 6, six lines of the relevant directed edges are illustrated. In step S2-1, one piece of the directed edge whose value of the flow (flow) is obtained among the six lines. It may be noted that at first, the value of the flow (flow) of all the edge data is 0, and the value of the flow is to be changed through the processing in a later stage. Also, the variable cEdge is a variable of an edge data type where the processing subject edge data is stored. The edge data substituted to cEdge will be hereinafter referred to as "edge data cEdge".

In a case where the edge data cEdge can be obtained, that is, a case where the edge data relevant to sourceEdgeList of the node data on the source node S exists (S2-2), among all the node data (all the elements of the node data array v), the shortest path search unit 121 initializes the values of the label propagation source node ID (pID), the shortest path length (dist), and the label front flag (IFrontF) of the data node in which the source flag (sFlag) or the target flag (tFlag) is not true (S2-3). To be specific, NULLID is substituted to pID, distMax is substituted to dist, and false is substituted to IFrontF. It may be noted that the node data whose source flag (sFlag) is true is node data on the source node S or the entry node of the leading-out subject cell. Also, the node data whose the target flag (tFlag) is true is node data on the target node T or the exit node of the exit cell. Therefore, the processing in step S2-3 is executed on all the node data on all the node except for the source node S, the entry node of the leading-out subject cell, the target node T, and the exit node of the exit cell.

Then, the shortest path search unit 121 initializes the value of the variable pathF to false (S2-4).

Then, the shortest path search unit 121 substitutes the start point node ID (sN) of the edge data cEdge to currentV and substitutes the end point node ID (eN) of the edge data cEdge to nextV (S2-5). The edge data cEdge is edge data on the directed edge from the source node S to the entry node of the leading-out subject cell. Therefore, currentV denotes the node ID of the source node S. Also, nextV denotes the node ID of the entry node of the leading-out subject cell.

Then, the shortest path search unit 121 updates the value of the member variable of the node data (node data array v[nextV]) on the entry node of the leading-out subject cell (S2-6). To be specific, the value of currentV is substituted to the label propagation source node ID (pID). Also, the edge length of the edge data cEdge (eLen=1) is substituted to the shortest path length (dist). Also, true is substituted to the label front flag (IFrontF). As IFtontF is set as true, it is identified that the relevant node data is located at the label front (forefront) in the path search. Also, the shortest path search unit 121 adds the relevant node data in the variable IFrontList. The variable IFrontList is a variable for storing a list of node data on the node located on the forefront in the path search.

Then, the shortest path search unit 121 takes out node data cv whose value of the shortest path length (dist) is smallest from the variable IFrontList and performs labeling of the path search (S2-7). It may be noted that the node data taken out from the variable IFrontList is removed from the variable IFrontList. Then, the shortest path search unit 121 judges whether or not node data remains in the variable IFrontList (S2-8). In a case where the node data remains (S2-8: Yes), the shortest path search unit 121 repeatedly executes the processing in step S2-7 until all the node data is removed from the variable IFrontList.

In a case where the node data remains does not remain in the variable IFrontList (S2-8: No), the shortest path search unit 121 judges whether or not the value of the variable pathF is true (S2-9). In a case where the node at the destination point, that is, the exit node of the exit cell is reached in the path search in step S2-7, the value of the variable pathF is set as true.

In a case where the value of the variable pathF is true (S2-9: Yes), the back trace unit 122 performs back trace on the result of the path search and updates the flow (flow) of the directed edges used in the search path and the residual (res) (S2-10). Following step S2-10 or the case of No in step S2-9, the processing in step S2-1 and subsequent steps is repeatedly executed. If in step S2-1, the flow (flow) edge data cEdge cannot be obtained (S2-2: No), the processing of FIG. 40 is ended.

Then, a description will be given of a detail of step S2-7 in FIG. 40. FIGS. 41A and B are flow charts for describing a processing procedure of a labeling processing for a path search.

In step S2-7-1, the shortest path search unit 121 initializes the variable i to 0. Then, the shortest path search unit 121 substitutes one of the edge data connected to the node data cv (one piece of the node data located at the forefront in the path search) to the edge data crrEdge. The edge data crrEdge is edge data which is set as the processing subject in FIGS. 41A and B. The edge data substituted to the edge data crrEdge varies depending on the value of the variable i. That is, when the value of the variable i is 0, the directed edge with the bro node (eBros) of the node data cv is substituted to the edge data crrEdge.

When the value of the variable i is 1, the directed edge with the node of the cell adjacent in the east (eE) of the node data cv is substituted to the edge data crrEdge. When the value of the variable i is 2, the directed edge with the node of the cell adjacent in the west (eW) of the node data cv is substituted to the edge data crrEdge. When the value of the variable i is 3, the directed edge with the node of the cell adjacent in the south (eS) of the node data cv is substituted to the edge data crrEdge. When the value of the variable i is 4, the directed edge with the node of the cell adjacent in the north (eN) of the node data cv is substituted to the edge data crrEdge.

When the value of the variable i is 5, the directed edge with the node of the north east cell (eNE) of the node data cv is substituted to the edge data crrEdge. When the value of the variable i is 6, the directed edge with the node of the north west cell (eNW) of the node data cv is substituted to the edge data crrEdge. When the value of the variable i is 7, the directed edge with the node of the south east cell (eSE) of the node data cv is substituted to the edge data crrEdge. When the value of the variable i is 7, the directed edge with the node of the south west cell (eSW) of the node data cv is substituted to the edge data crrEdge.

It may be noted that the value of the variable i is incremented each time the loop from step S2-7-2 is executed. Therefore, in step S2-7-2 and subsequent steps, the edge data crrEdge set as the processing subject is changed in turn in accordance with the number of loops.

Then, the shortest path search unit 121 judges whether or not the edge data crrEdge is empty (S2-7-3). In a case where the edge data crrEdge is not empty (S2-7-3: No), the shortest path search unit 121 substitutes a value obtained by adding the shortest path length (dist) of the node data eV with the edge length (eLen) of the edge data crrEdge to a variable D (S2-7-4). The value of the variable D denotes a path length of the node data located on the other node data cv in the edge data crrEdge. It is however noted that the relevant path length is not determined as the shortest path length.

Then, the shortest path search unit 121 judges whether or not the value of the variable D is smaller than the shortest path length (dist) of the target node T (S2-7-5). It may be noted that until the path up to the target node T is searched for, the value of the shortest path length (dist) of the target node T is distMax (maximum value).

Then, the shortest path search unit 121 judges whether or not the node related to the node data cv is the start point node of the edge data crrEdge, also, the value of the residual (res) of the edge data crrEdge is larger than 0, and also, the shortest path length (dist) of the node data on the end point node of the directed edge related to the edge data crrEdge is larger than the variable D (S2-7-6).

This judgment is equivalent to a judgment on whether or not, in a case where the node related to the node data cv is the start point node of the edge data crrEdge, the directed edge related to the edge data crrEdge can be a directed edge constructing the shortest path up to the destination point (whether or not it is worth searching for a part after the directed edge). That is, if the residual of the edge data crrEdge is 0, the relevant edge data crrEdge cannot be used as the path. Also, if the value of the shortest path length (dist) of the end point node of the edge data crrEdge is equal to or smaller than the value of the variable D, a path up to the relevant end point node to be searched for from this time is not the shortest path. It may be noted that in step S2-3 of FIG. 40, the shortest path length (dist) of the node data except for a particular node is initialized to distMax. Therefore, at least at the time of the first search, in a case where the node related to the node data cv is the start point node of the edge data crrEdge, the judgment in step S2-7-6 is Yes.

In the case of Yes in step S2-7-6, the shortest path search unit 121 updates the value of the shortest path length (dist) of the node data on the end point node of the edge data crrEdge by the value of the variable D. Also, the shortest path search unit 121 updates the value of the label propagation source node ID (pID) of the node data on the end point node of the edge data crrEdge by the node ID of the node data eV (S2-7-7).

Then, the shortest path search unit 121 judges whether or not the target flag (tFlag) of the node data on the end point node of the edge data crrEdge is true, that is, whether or not the relevant end point node is the exit node of the exit cell (the node at the destination point) (S2-7-8). In a case where the target flag (tFlag) of the node data on the end point node of the edge data crrEdge is true (S2-7-8: Yes), the shortest path search unit 121 sets the value of the variable pathF as true as the destination point is reached (S2-7-9). Also, the shortest path search unit 121 records the node ID of the end point node of the edge data crrEdge in the propagation source node ID of the node data on the target node T (S2-7-10).

Following step S2-7-10 or the case of No in step S2-7-8, the shortest path search unit 121 judges whether or not the value of the label front flag (lFrontF) of the node data on the end point node of the edge data crrEdge is false and also the target flag (tFlag) of the relevant node data is false (S2-7-11). That is, whether or not the end point node of the edge data crrEdge is not set as the forefront of the path search, and whether or not the relevant end point node is not the exit node of the exit cell (that is, the node at the destination point) are judged.

In the case of Yes in step S2-7-11, the shortest path search unit 121 adds the node data on the end point node of the edge data crrEdge in the variable lFrontList and sets the label front flag (lFrontF) of the relevant node data as true (S2-7-12). According to this, the relevant end point node is set as one of the forefront nodes in the path search.

On the other hand, in the case of No in step S2-7-6, the shortest path search unit 121 judges whether or not the node related to the node data cv is the end point node of the edge data crrEdge, also, the value of the flow (flow) of the edge data crrEdge is larger than 0, and also, the shortest path length (dist) of the node data on the start point node of the directed edge related to the edge data crrEdge is larger than the variable D (S2-7-13).

This judgment is equivalent to a judgment on whether or not, in a case where the direction from the node related to the node data eV to the end point node of the edge data crrEdge is reversed to the direction of the directed edge of the edge data crrEdge (backward flow), the directed edge related to the edge data crrEdge can be the directed edge constituting the shortest path up to the destination point (whether or not it is worth searching for a part after the directed edge). Herein, the backward move is permitted only in a case where the directed edge related to the edge data crrEdge is already utilized for the shortest path, that is, a case where the flow (flow) of the edge data crrEdge is larger than 0. A signification of the backward move and a reason why the backward move is allowed only for the directed edge already utilized for the shortest path.

In the case of Yes in step S2-7-13, the shortest path search unit 121 updates the value of the shortest path length (dist) of the node data on the start point node of the edge data crrEdge by the value of the variable D. Also, the shortest path search unit 121 updates the value of the label propagation source node ID (pID) of the node data on the start point node of the edge data crrEdge by the node ID of the node data cV (S2-7-14).

Then, the shortest path search unit 121 judges whether or not the value of the label front flag (lFrontF) of the node data on the start point node of the edge data crrEdge is false and also the target flag (tFlag) of the relevant node data is false (S2-7-15). That is, whether or not the start point node of the edge data crrEdge is set as the forefront of the path search and whether or not the relevant start point node is not the exit node of the exit cell (that is, the node at the destination point) are judged.

In the case of Yes in step S2-7-15, the shortest path search unit 121 adds the node data on the start point node of the edge data crrEdge in the variable lFrontList and sets the label front flag (lFrontF) of the relevant node data as true (S2-7-16). According to this, the relevant start point node is set as one of the nodes on the forefront of the path search.

In the case of Yes in step S2-7-15, the shortest path search unit 121 adds the node data on the start point node of the edge data crrEdge in the variable lFrontList and sets the label front flag (lFrontF) of the relevant node data as true (S2-7-16). According to this, the relevant start point node is set as one of the nodes on the forefront of the path search.

Following step S2-7-16, the case of No in step S2-7-15, the case of No in step S2-7-13, step S2-7-12, the case of No in step S2-7-11, or the case of No in step S2-7-5, the shortest path search unit 121 increments the variable i (S2-7-17). Then, the shortest path search unit 121 judges whether or not the value of the variable i reaches 9 (S2-7-18). Herein, the variable i is compared with 9 because the maximum number of directed edges that can be connected to one node is 9. To be more specific, this is because, through step S2-7-2, in a case where the processing is completed for all the edge data included as the member variable of the edge data cV, the value of the variable i is 9.

In a case where the value of the variable i is not 9 (S2-7-18: No), the shortest path search unit 121 repeatedly executes the processing in step S2-7-2 and subsequent steps. in a case where the value of the variable i is 9 (S2-7-18: Yes), the shortest path search unit 121 ends the processing of FIGS. 41A and B.

It may be noted that as the processing of FIG. 41 is executed, the forefront of the path search is moved to the next node that may be the shortest path (plural relevant next nodes may exist.) among the nodes connected to the node data cV by the directed edges. Then, the processing in FIGS. 41A and B are recursively executed while the relevant next node is set as the subject. As the processing in FIGS. 41A and B are recursively executed, the shortest path is searched for while the directed edge connected to the forefront node is traced one by one. In the node data related to the search path, the values of the label propagation source node ID (pID) and the shortest distance length (dist) are recorded.

It is however noted that the values of the member variables of the respective pieces of node data (pID, dist, IFrontF) are initialized each time the processing subject edge data cEdge is changed in step S2-1 of FIG. 40 (S2-3). Therefore, for each directed edge from the source node S to the leading-out subject cell, pID, dist, and IFrontF of the respective pieces of node data may vary.

Figure 42:
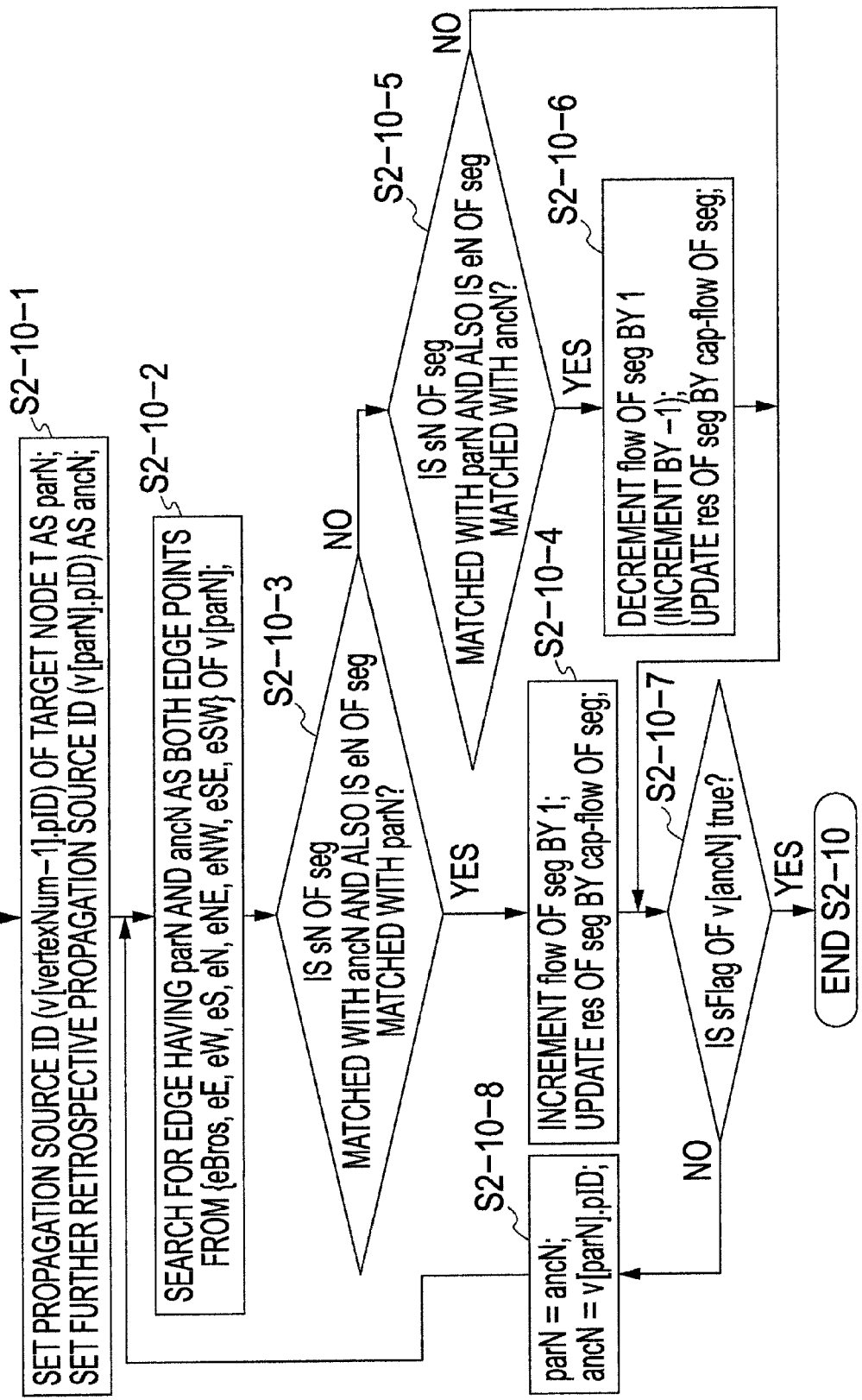
FIG. 42 is a sequence diagram for describing a processing procedure of a back trace processing.

Then, a description will be given of a detail of step S2-10 in FIG. 40. FIG. 42 is a sequence diagram for describing a processing procedure of a back trace processing. Incidentally, the processing in step S2-10 (processing in FIG. 42) is executed when the node data does not exist in the variable IFrontList (S2-8: No), and also, when the value of the variable pathF is true (in the case of Yes in S2-9). That is, the processing in step S2-10 is executed when the search for the shortest path between one entry node of the leading-out subject cell (leading-out subject node) and the exit node of the exit cell is completed. In FIG. 42, regarding the searched shortest path, by way of the back trace from the target node T, the flow (flow) and the residual (res) of the directed edges used for the relevant shortest path are updated.

In step S2-10-1, the back trace unit 122 substitutes the label propagation source node ID (pID) of the node data on the target node T (node data array v[vertexNum−1]) to a variable parN. A node in which the variable parN is set as the node ID is referred to as "parent node" in FIG. 42. Also, the back trace unit 122 substitutes the label propagation source node ID (pID) of the node data on the parent node (node data array v[parN]) to a variable ancN. A node in which the variable ancN is set as the node ID is referred to as "ancestor node" in FIG. 42.

Then, the back trace unit 122 searches for edge data where the node in which the variable parN is set as the node ID and the node in which the variable ancN is set as the node ID are set as both edge points from the respective pieces of edge data (eBros, eE, eW, eS, eN, eNE, eNW, eSE, eSW) registered in the node data on the parent node (node data array v[parN]) and sets the searched edge data as the edge data seg (S2-10-2).

Then, the back trace unit 122 judges whether or not the value of the start point node ID (sN) of the edge data seg is matched with the value of the variable ancN and also the value of the end point node ID (eN) of the edge data seg is matched with the value of the variable parN (S2-10-3). That is, whether or not the direction of the edge data seg is matched with the direction of the label propagation.

In the case of Yes in step S2-10-3, the back trace unit 122 adds 1 to the flow (flow) of the edge data seg. Also, the back trace unit 122 updates the value of the residual (res) of the edge data seg by the calculation result of {the cap (cap)−the flow (flow)} (S2-10-4). That is, a situation is recorded in which the directed edge related to the edge data seg is utilized for the shortest path.

On the other hand, in the case of No in step S2-10-3, the back trace unit 122 judges whether or not the value of the start point node ID (sN) of the edge data seg is matched with the value of the variable parN and also the value of the end point node ID (eN) of the edge data seg is matched with the value of the variable ancN (S2-10-4). That is, whether or not the direction of the label propagation is reversed to the direction of the edge data seg is judged. Such a situation (the direction of the label propagation is reversed to the direction of the edge data seg) occurs in a case where the processing in step S2-7-14 is executed in FIG. 41B.

In the case of Yes in step S2-10-6, the back trace unit 122 subtracts the flow (flow) of the edge data seg by 1. Also, the back trace unit 122 updates the value of the residual (res) of the edge data seg by the calculation result of {the cap (cap)−the flow (flow)} (S2-10-6). As a result, the value of the residual (res) is increased. That is, one record in which the directed edge related to the edge data seg is utilized for the shortest path is removed.

Following step S2-10-4, step S2-10-6, or the case of No in step S2-10-5, the back trace unit 122 judges whether or not the source flag (sFlag) of the node data on the ancestor node (node data array v[ancN]) is true, that is, whether or not the back trace is completed up to the entry node of the leading-out subject cell (S2-10-7). In a case where the back trace is not completed (S2-10-7: No), the back trace unit 122 advances the back trace by one edge (S2-10-8). To be specific, the value of the variable ancN is substituted to the variable parN. Also, the label propagation source node ID (pID) of the node data (v[parN]) that has been the ancestor node so far is substituted to the variable ancN. Then, the back trace unit 122 repeatedly executes the processing in step S2-10-2.

In a case where the back trace is completed (S2-10-7: Yes), the back trace unit 122 ends the processing of FIG. 42.

Figure 41B:
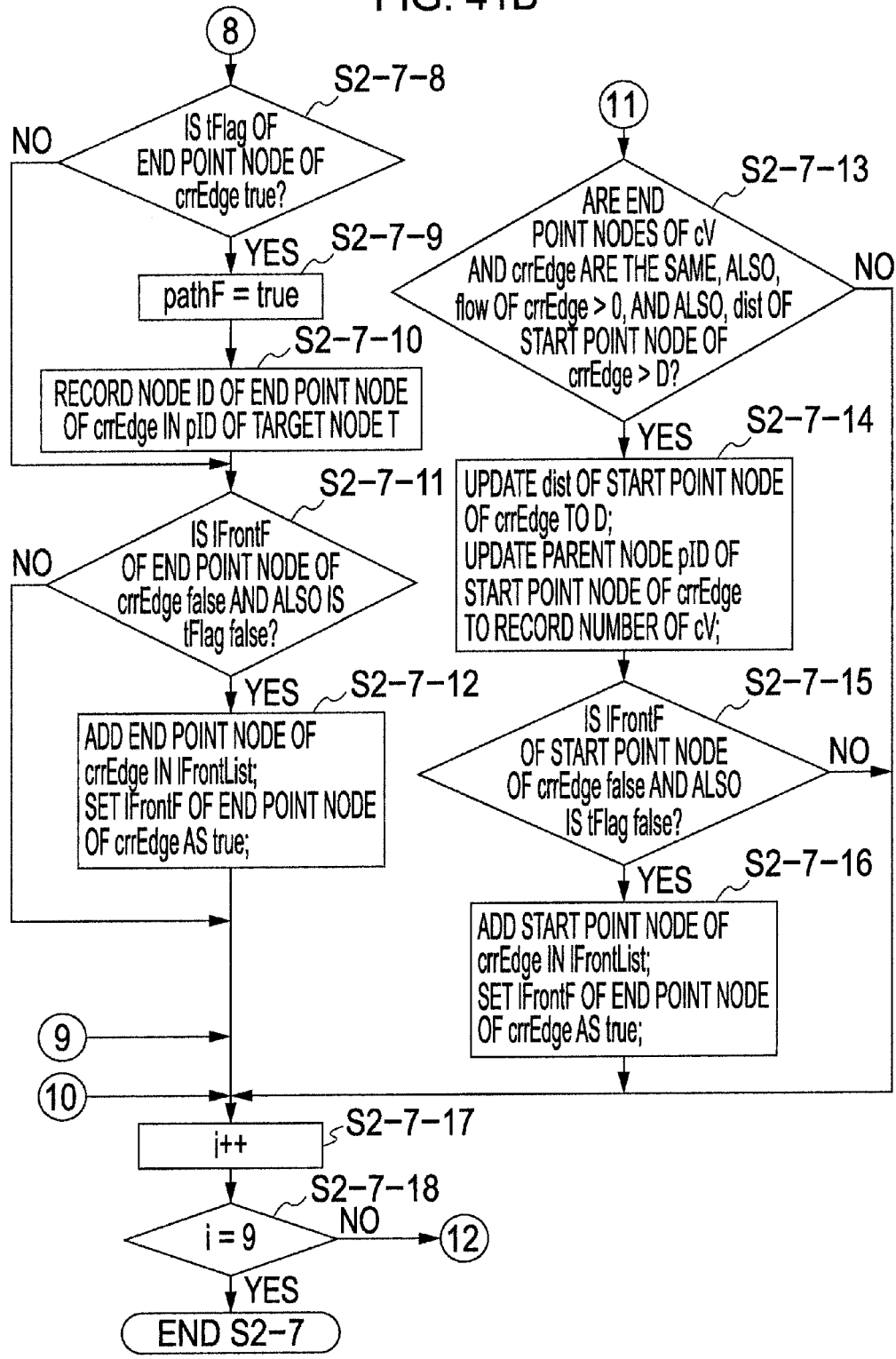
FIGS. 41A and B are flow charts for describing a processing procedure of a labeling processing for a path search.

Herein, a meaning of the processing in step S2-10-6 will be described. The processing in the relevant step is executed in a case where the path search is performed while being reverse to the direction of the directed edge (in a case where the processing in step S2-7-14 in FIG. 41B is executed).

Figure 43:
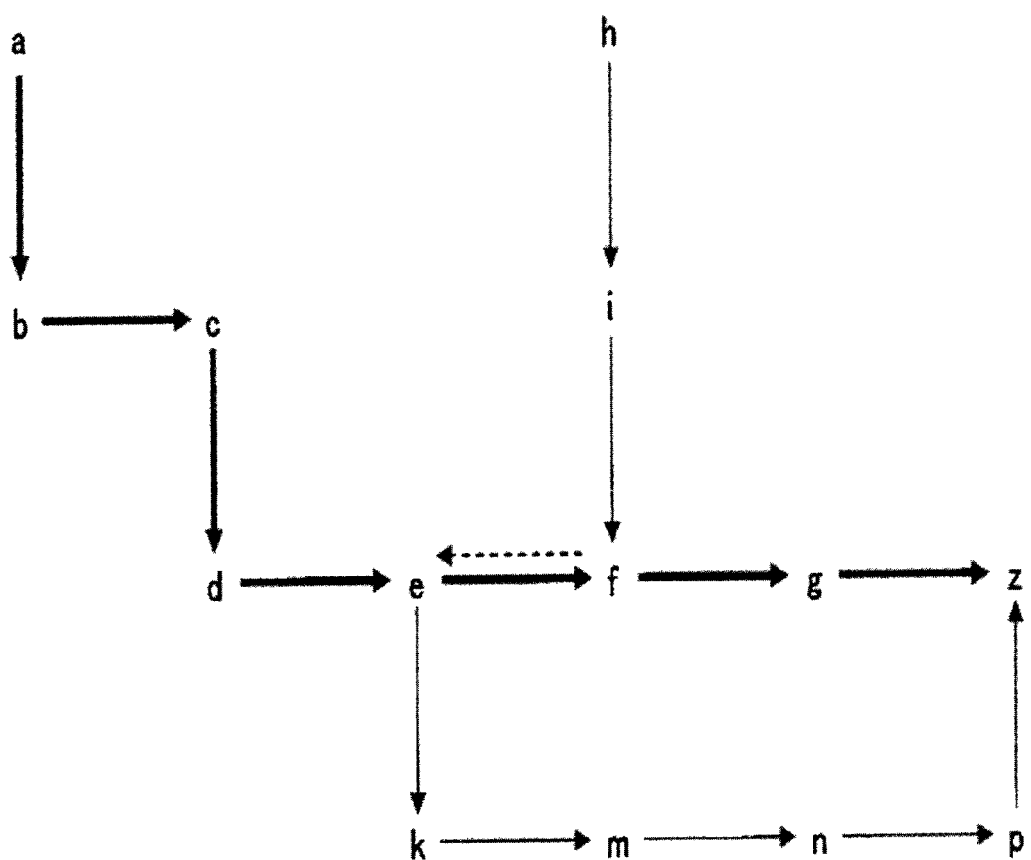
FIG. 43 is a schematic diagram showing a state in which the path search is performed in a direction reverse to the directed edge.

FIG. 43 is a schematic diagram showing a state in which the path search is performed in a direction reverse to the directed edge. In the same drawing, a solid line arrow denotes a directed edge. A lower case alphabet denotes a node. A node a and a node h are respectively nodes of the leading-out subjects. A node z is a node at the destination point. It may be noted that in the same drawing, for convenience, an inclination of the directed edge is horizontal or vertical.

A path constituted by bold line directed edges a→b→c→d→e→f→g→z (hereinafter, which will be referred to as "path a".) is a path where the back trace is already completed. Therefore, 1 is recorded in the flow (flow) of the respective directed edges utilized for the path a.

On the other hand, a path h→i→f→e→k→m→n→p→z (hereinafter, which will be referred to as "path h".) is a path searched by the processing in FIGS. 40 and 41 after the back trace on the path a. A part indicated by a broken line arrow in the path h (section f→e) is reversed to the direction of the directed edge ef.

In a case where the processing of back trace (FIG. 42) is performed on the above-mentioned path h, when the parent node is f and the ancestor node is e, the processing in step S2-10-6 is executed. In this step, the value of the flow (flow) of the directed edge ef is subtracted by 1 to become 0. As a result, the directed edge ef is not utilized by any of the path a and the path h. After that, the back trace in performed in the order of f→i→h, and the flow (flow) of the directed edge hi, the directed edge if is set as 1. At this time, the directed edges utilized by any one of the paths (the directed edge in which the value of the flow is equal to or larger than 1) are as shown in FIG. 44.

Figure 44:
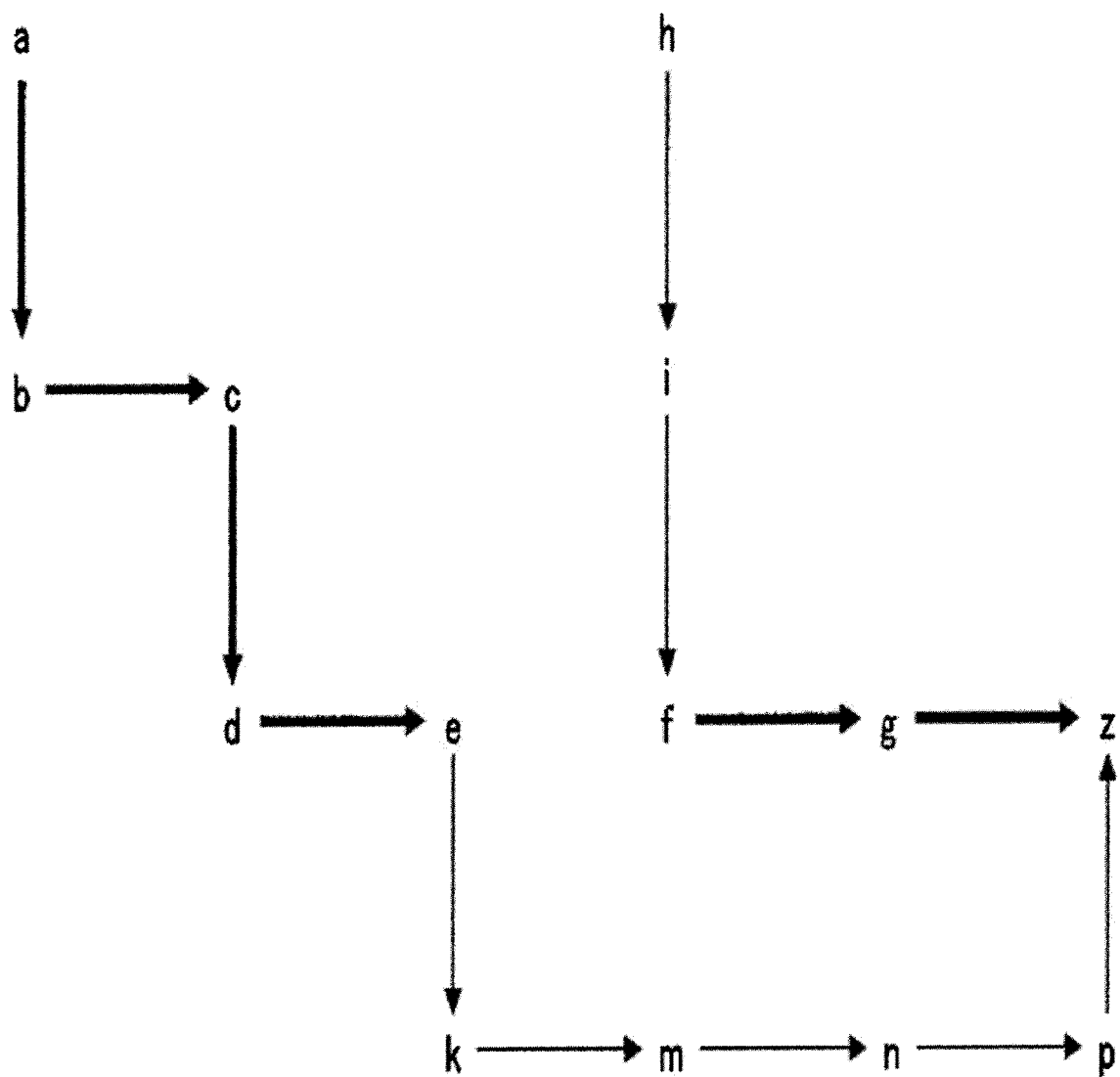
FIG. 44 is a schematic diagram showing an example of a result in which back trace is executed in a case where the path search is performed in the direction reverse to the directed edge.

FIG. 44 is a schematic diagram showing an example of a result in which back trace is executed in a case where the path search is performed in the direction reverse to the directed edge.

In the same drawing, a path from the leading-out subject node a is a→b→c→d→e→k→m→n→p→z (hereinafter, which will be referred to as "path a2".). Also, a path from the leading-out subject node h is h→i→f→g→z (hereinafter, which will be referred to as "path h2".). That is, in the course of the back trace related to the path h, the directed edge of is removed from the usage subjects, and a path after the node f of the path a is utilized by the path h. As a result, a path h2 is formed. Also, a path after the node e of the path h is utilized by the path a. As a result, a path a2 is formed.

In this manner, in a case where the path search is performed while being reverse to the direction of the directed edge, a part of the paths is replaced, and the same number of lines of the paths are secured as the number before the replacement (in the example of FIGS. 43 and 44, two lines). It is however noted that the backward move subject directed edge necessarily has the value of the flow (flow) equal to or larger than 1 (that is, already utilized by another path). Otherwise, the placement of the part of the paths cannot be performed.

Thus far, the description is ended with regard to step S2 of FIG. 5. The processing result at this time is as shown in FIG. 7. That is, six lines of the paths are secured on the directed graph (Flow network). To be specific, in the edge data on the respective directed edges utilized for the six lines of the paths, the value of the flow (flow) (number of usage) is recorded in a range of the cap (cap). It is however noted that at this time, it is not identified that the flows of the respective directed edges are allocated to which wirings. That is, the global path of the leading-out wiring is not determined yet. Subsequently, in step S3, the flows of the respective directed edges are distributed to the wirings, and thus the global path is determined.

Figure 45:
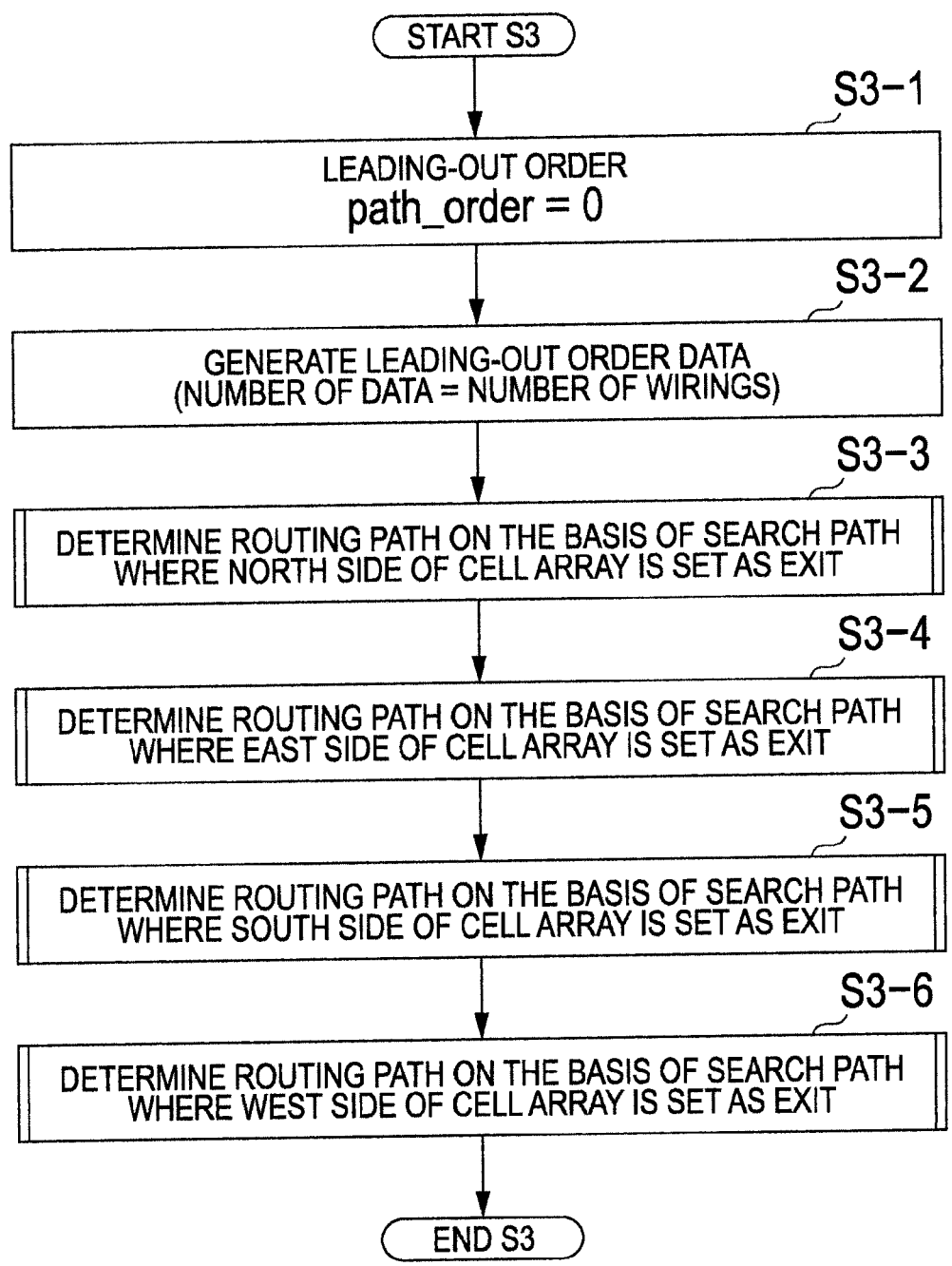
FIG. 45 is a flow chart for describing a determination processing for the global routing.

Then, a description will be given of a detail of step S3 in FIG. 5. FIG. 45 is a flow chart for describing a determination processing for the global routing.

In step S3-1, the global path determination unit 130 initializes a leading-out order path_order to 0. The leading-out order path_order is a variable for managing the leading-out orders for the respective wirings. Then, the global path determination unit 130 generates the leading-out order data by the number of wirings in the auxiliary storage apparatus 102 (S3-2). The number of wirings is judged on the basis of the net list 141, for example. That is, in the net list 141, a list of the pin IDs of the leading-out subject pins is included. Therefore, the number of relevant pin IDs can be utilized as the number of wirings.

FIG. 46 illustrates a configuration example of leading-out order data. As shown in the same drawing, one piece of the leading-out order data has member variables such as the net ID (netID) and the leading-out order (order) (data items). The net ID (netID) is a net ID of the wiring. The leading-out order (order) is a leading-out order (order) for the wiring identified by the net ID. In this manner, in one piece of the leading-out order data, the leading-out order for one line of wiring can be managed by. Therefore, as the leading-out order data by the number of wirings is generated, the leading-out orders for the respective wirings are managed by the respective pieces of leading-out order data.

Then, the global path determination unit 130 distributes the flows (flow) of the respective directed edges of the search path where the north side in the cell array is set as the exit (path searched for in step S2) to the wirings so that the global path of the relevant wiring is determined (S3-3).

Then, the global path determination unit 130 distributes the flows (flow) of the respective directed edges of the search path where the east side in the cell array is set as the exit to the wirings so that the global path of the relevant wiring is determined (S3-4).

Then, the global path determination unit 130 distributes the flows (flow) of the respective directed edges of the search path where the south side in the cell array is set as the exit to the wirings so that the global path of the relevant wiring is determined (S3-5).

Then, the global path determination unit 130 distributes the flows (flow) of the respective directed edges of the search path where the west side in the cell array is set as the exit to the wirings so that the global path of the relevant wiring is determined (S3-6).

Incidentally, according to the present embodiment, the exit of the search path is limited to the east side. Therefore, according to the present embodiment, no global path determined in steps S3-3, S3-5, and S3-6 exits. In view of the above, a description will be given of a detail of step S3-4.

Figure 47:
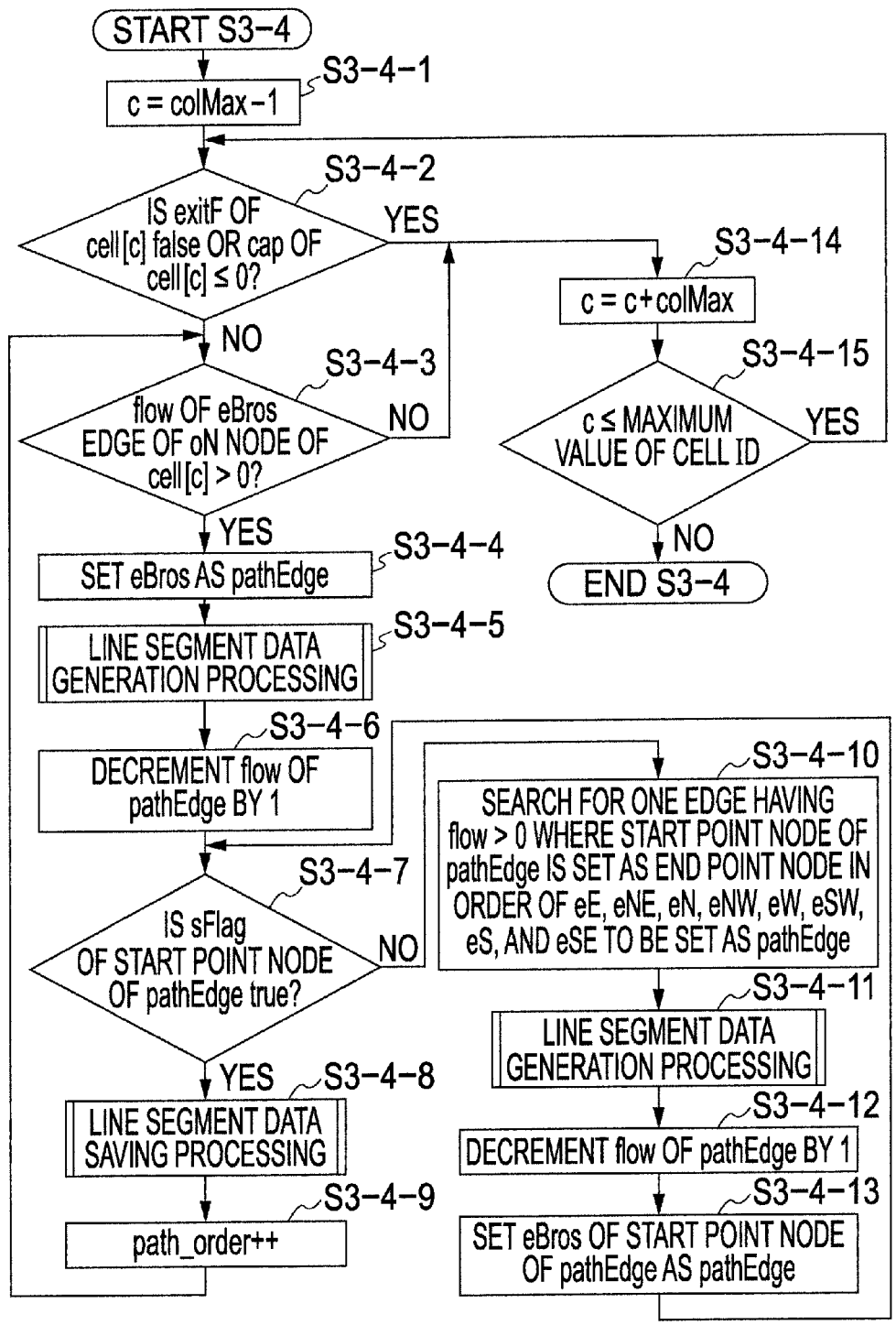
FIG. 47 is a flow chart for describing a processing procedure of the determination processing for the global routing on the basis of the search path where the east side of the cell matrix is set as the exit.

FIG. 47 is a flow chart for describing a processing procedure of the determination processing for the global routing on the basis of the search path where the east side of the cell matrix is set as the exit. The processing procedure of FIG. 47 will be described with reference to FIG. 8. It may be noted that according to the present embodiment, the exit of the search path is searched for in the clockwise direction in the outer circumference of the cell array. Therefore, as to the east side, regarding the cell belonging to the east edge of the cell array, the exit of the search path is searched for from the north edge row towards the south edge row.

In step S3-4-1, the global path determination unit 130 initializes a value of a variable c by colMax−1. The variable c is a suffix with respect to the element (cell data) that is the processing subject in the cell data array cell. Also, colMax denotes the number of columns of the cells. Therefore, the cell data (cell[c]) in which the initial value of the variable c (colMax−1) is used as the suffix in the cell data array cell is the cell data on the cell of the north edge row in the east edge column.

Then, in steps S3-4-2, S3-4-3, S3-4-14, and S3-4-15, the cell functioning as the exit of the search path is searched for.

That is, in step S3-4-2, the global path determination unit 130 judges whether or not the exit flag (exitF) of the processing subject cell data is false (that is, the relevant cell data is not the outer circumferential cell) or whether or not the value of the capacity (cap) of the relevant cell data is equal to or smaller than 0.

In the case of No in step S3-4-2, the global path determination unit 130 judges whether or not the flow (flow) of the directed edge with the bro node (eBros) of the node data on the exit node of the relevant cell data is larger than 0 (S3-4-3).

In the case of Yes in step S3-4-2 or the case of No in step S3-4-3, the cell data on the cell where the processing subject cell data is not the exit of the search path. Therefore, the global path determination unit 130 adds colMax to the value of the variable c and sets the cell data on the cell in the next row of the east edge column as the processing subject (S3-4-14). Then, the global path determination unit 130 judges whether or not the value of the variable c is equal to or smaller than the maximum value of the cell ID, that is, whether or not an unprocessed row in the east edge column remains (S3-4-15). In a case where the unprocessed row remains (S3-4-15: Yes), the global path determination unit 130 repeatedly executes the processing in step S3-4-2.

In the case of Yes in step S3-4-3, the processing subject cell data is the cell data on the cell functioning as the exit of the search path. In view of the above, the global path determination unit 130 refers to the directed edge with the bro node (eBros) of the node data on the exit node of the relevant cell data by the variable pathEdge (S3-4-4). It may be noted that in the case of FIG. 8, a reference is made on edge data on directed edge e1 in the cell of cell E1 at column 7 by pathEdge at first. Hereinafter, the edge data on which the reference is made by pathEdge is referred to as "edge data pathEdge". It may be noted that a change on the edge data pathEdge means a change into the edge data on which the reference is made by pathEdge (herein, the directed edge with the bro node (eBros) of the node data on the exit node of the processing subject cell data).

Then, the global path determination unit 130 generates line segment data corresponding to the flow (flow) of the edge data pathEdge (S3-4-5).

FIG. 48 is a flow chart for describing a processing procedure of a generation processing for line segment data.

In step S4-1, the global path determination unit 130 generates one piece of the line segment data seg in the memory apparatus 103.

FIG. 49 illustrates a configuration example of the line segment data. As shown in the same drawing, one piece of line segment data is data representing the line segments constituting the global path and includes member variables (data items) such as the start point node ID (sN), the end point node ID (eN), the net ID (netID), and the leading-out order (order).

The start point node ID (sN) is a node ID of the start point node of the line segment data. The end point node ID (eN) is a node ID of the end point node of the line segment data. The net ID (netID) is a net ID the wiring corresponded by the global path to which the line segment data belongs. The leading-out order (order) is a leading-out order for the wiring corresponded by the global path to which the line segment data belongs.

Then, the global path determination unit 130 records the value of the start point node ID (sN) of the edge data pathEdge in the start point node ID (sN) of the line segment data seg (S4-2). Then, the global path determination unit 130 records the value of the end point node ID (eN) of the edge data pathEdge in the end point node ID (eN) of the line segment data seg (S4-3). Then, the global path determination unit 130 adds the line segment data seg in the currentSeg list (S4-4). The currentSeg list is data or a record for storing the aggregate of the line segment data constituting one line of the global path (list) and is generated, for example, in the memory apparatus 103.

The description will be back on FIG. 47. Following step S3-4-5, the flow advances to step S3-4-6, where the global path determination unit 130 decreases the value of the flow (flow) of the edge data pathEdge by 1. In steps S3-4-5 and S3-4-6, the flow (flow) of the edge data pathEdge is separated by the directed edge as the line segment of the global path.

Then, the global path determination unit 130 judges whether or not the source flag (sFlag) of the node data on the start point node of the edge data pathEdge is true (S3-4-7). That is, whether or not the trace is performed up to the entry node of the leading-out subject cell (origination of the wiring). According to the present embodiment, in the stage where the processing in step S3-4-7 is executed at first, the tracing is performed up to the start point node of the directed edge e1, this judgment is No.

In the case of No in step S3-4-7, the global path determination unit 130 searches for one line of the directed edge from the directed edges in which the start point node of the edge data pathEdge is set as the end point node and also which are connected to the relevant start point node with the edge data indicating that the value of the flow (flow) is larger than 0 and newly refers to the searched directed edge by pathEdge (S3-4-10). Herein, in the search for the directed edge, in a case where the plural directed edges exist as the candidates, a directed edge located on the right side of the traveling direction of the trace of the directed edge is selected with priority. To be specific, the search is performed in the order of the directed edge with the node of the cell adjacent in the east (eE), the directed edge with the node of the north east cell (eNE), the directed edge with the node of the cell adjacent in the north (eN), the directed edge with the node of the north west cell (eNW), the directed edge with the node of the cell adjacent in the west (eW), the directed edge with the node of the south west cell (eSW), the directed edge with the node of the cell adjacent in the south (eS), and the directed edge with the node of the south east cell (eSE).

A reason why the directed edge located on the right side of the traveling direction of the trace of the directed edge is selected with priority is to guarantee that the wiring does not intersect with another wiring. That is, according to the present embodiment, the search for the exit of the search path is performed in the clockwise direction on the outer circumference of the cell array. On such premise, if the directed edge located on the right side of the traveling direction of the trace is selected with priority, no global path further on the right side of the relevant global path is not generated. Therefore, for example, in a case where the search for the exit of the search path is performed in the counterclockwise direction on the outer circumference of the cell array, a directed edge located on the left side of the traveling direction of the trace may be selected with priority.

It may be noted that in the stage where the processing in step S3-4-10 is executed at first in FIG. 8, the directed edge e2 is searched for, and a reference is made by pathEdge.

Then, the global path determination unit 130 generates line segment data on the flow (flow) of the new edge data pathEdge (S3-4-11). The processing content in the relevant step is as described in FIG. 48. Then, the global path determination unit 130 decreases the value of the flow (flow) of the edge data pathEdge by 1 (S3-4-12). Then, the global path determination unit 130 newly refers to the directed edge with the bro node (eBros) of the start point node of the edge data pathEdge by pathEdge (S3-4-13). In the stage where the processing in step S3-4-13 is executed at first in FIG. 8, a reference is made on the directed edge e3 by pathEdge.

After that, until the start point node of the edge data pathEdge reaches the entry node of the leading-out subject cell, the processing in step S3-4-10 to S3-4-13 is repeatedly performed. As a result, in FIG. 8, following the directed edges e1 and e2 where the line segment data is already generated, the line segment data is generated on the basis of the flows (flow) of e3, e4, e5, e6, e7, e8, e9, e10, e11, e12, e13, e14, e15, and e16 and registered in the currentSeg list.

When the directed edge e17 is set as the edge data pathEdge, a state of Yes occurs in step S3-4-7. In the case of Yes in step S3-4-7, the global path determination unit 130 executes a saving processing for the line segment data (S3-4-8).

Figure 50:
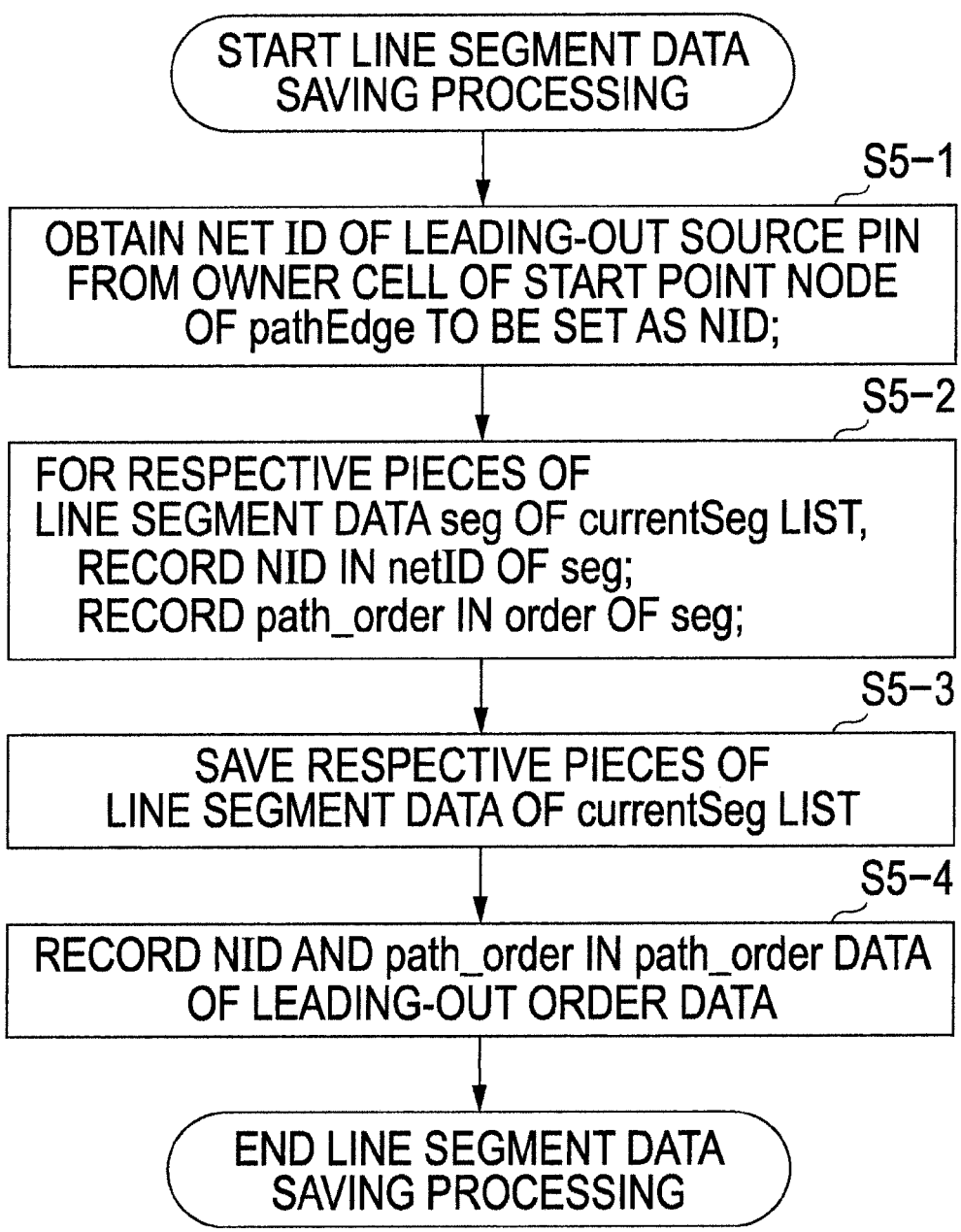
FIG. 50 is a flow chart for describing a processing procedure of a saving processing for the line segment data.

FIG. 50 is a flow chart for describing a processing procedure of a saving processing for the line segment data.

In step S5-1, the global path determination unit 130 obtains a value of the net ID (netID) of the cell data on the owner cell of the node data on the start point node of the edge data pathEdge and substitutes a variable NID (S5-1). In the stage where the processing in step S5-1 is executed at first in FIG. 8, the net ID (netID) of the cell data on the cell S1 is substituted to the variable NID.

Then, the global path determination unit 130 records the value of NID in the net IDs (netID) of the respective pieces of line segment data seg registered in the currentSeg list and records the value of path_order (initial value is 0) in the leading-out order (order) (S5-2).

Then, the global path determination unit 130 saves the respective pieces of line segment data registered in the currentSeg list in the auxiliary storage apparatus 102 (S5-3).

Then, the global path determination unit 130 records the value of NID in the net ID (netID) of the path_order-th leading-out order data and records the value of path_order in the leading-out order (order).

Through the processing in FIG. 50, the line segment data and the leading-out order related to one line of the global path are saved in the auxiliary storage apparatus 102. It may be noted that the line segment data is information indicating between which pins the wiring passes, and the leading-out order is information indicating a relative positional relation of the respective wirings.

The description will be back on FIG. 47. While following step S3-4-8, the flow advances to step S3-4-9, the global path determination unit 130 increments the value of path_order. Then, the global path determination unit 130 executes the processing in step S3-4-3. Herein, a reason why without searching for the next cell which is set as the exit of the search path, the processing in step S3-4-3 is executed again on the cell data currently set as the processing subject is that the flow (flow) may remain in the directed edge (the directed edge e1 in FIG. 8) in the cell related to the current processing subject cell data. In a case where the flow remains in the relevant directed edge (S3-4-3: Yes), the processing in step S3-4-4 and subsequent steps is executed. As a result, in FIG. 8, on the basis of the flows of the directed edges e1, e2, e3, e4, e5, e6, e7, e8, e9, e10, e11, e12, e13, e14, e15, e21, e22, and e23, the line segment data is generated and saved. That is, the global path for the wiring that may be secondly led out is determined.

In a case where the flow (flow) does not remain in the directed edge e1 of the cell E1 (S3-4-3: No), the cell E2 in the next row is set as the processing subject (S3-4-14). As the processing in step S3-4-4 and subsequent steps is executed on the cell E2, on the basis of the flows of the directed edges e31, e32, e33, e34, e35, e36, e5, e37, e38, e39, e40, and e41, the line segment data is generated and saved. That is, the global path for the wiring that may be thirdly led out is determined.

After that, as the processing in step S3-4-2 and subsequent steps is repeatedly executed, according to the present embodiment (FIG. 8), total six lines of global paths are generated. That is, the global routing according to the present embodiment is completed. In the stage of the detailed routing, physical positions for the respective wirings may be decided on the basis of the line segment data and the leading-out order.

It may be noted that the processing procedure of steps S3-3, S3-5, and S3-6 in FIG. 45 is obvious from step S3-4, and therefore only a flow chart is shown, and a detailed description will be omitted.

Figure 51:
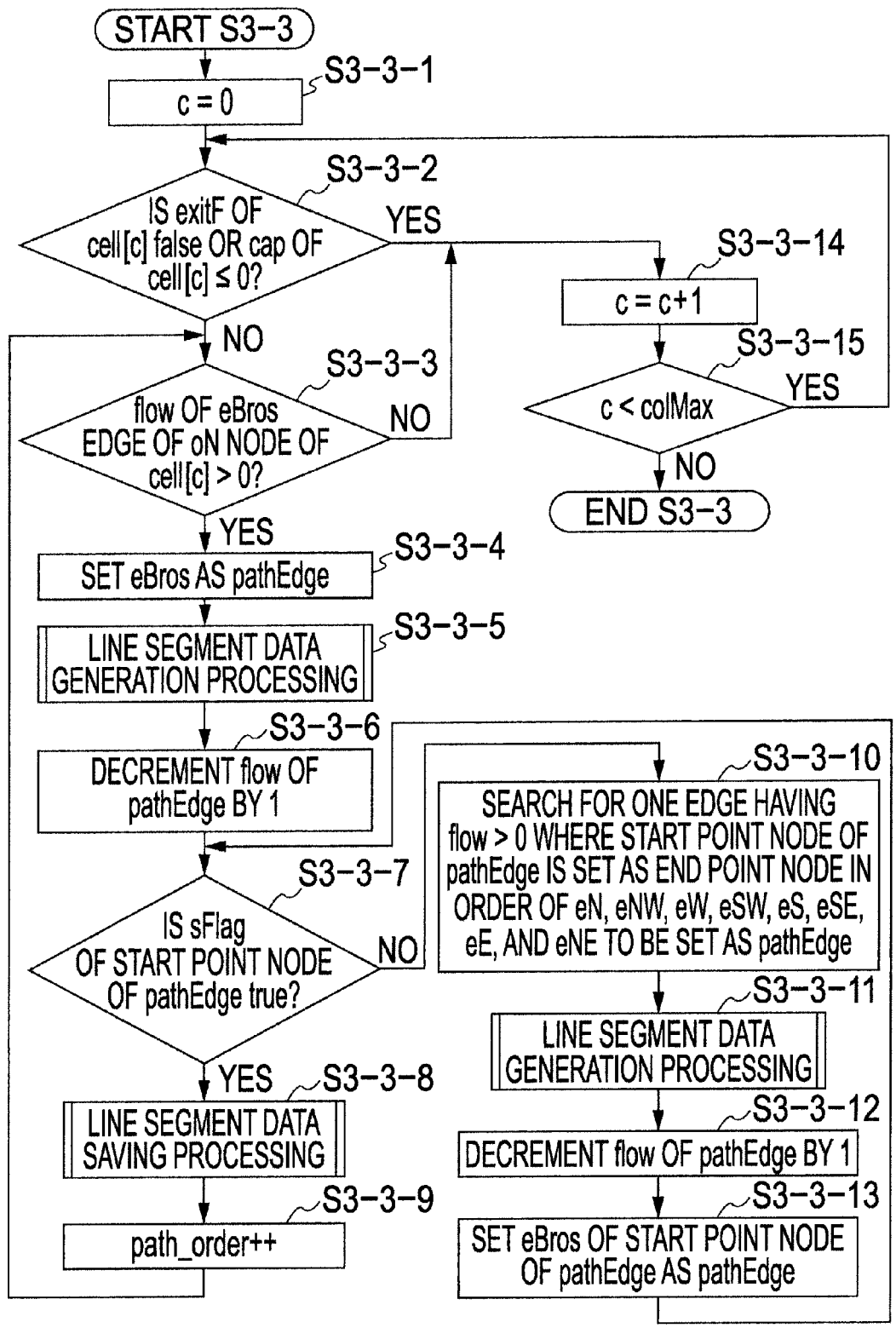
FIG. 51 is a flow chart for describing a processing procedure of the determination processing for the global routing on the basis of the search path where the north side of the cell matrix is set as the exit.

FIG. 51 is a flow chart for describing a processing procedure of the determination processing for the global routing on the basis of the search path where the north side of the cell matrix is set as the exit. That is, FIG. 51 is a flow chart for describing step S3-3 in detail. In FIG. 51, for the cells belonging to the north edge row on the cell array, from the west edge column towards the east edge column (that is, in the clockwise direction), the exit of the search path is searched for (see S3-3-1, S3-3-14, and S3-3-15).

Also, in step S3-3-10, as the directed edge located on the right side of the traveling direction of the trace is selected with priority, the directed edge is searched for in the order of the directed edge with the node of the cell adjacent in the north (eN), the directed edge with the node of the north west cell (eNW), the directed edge with the node of the cell adjacent in the west (eW), the directed edge with the node of the south west cell (eSW), the directed edge with the node of the cell adjacent in the south (eS), the directed edge with the node of the south east cell (eSE), the directed edge with the node of the cell adjacent in the east (eE), and the directed edge with the node of the north east cell (eNE).

Figure 52:
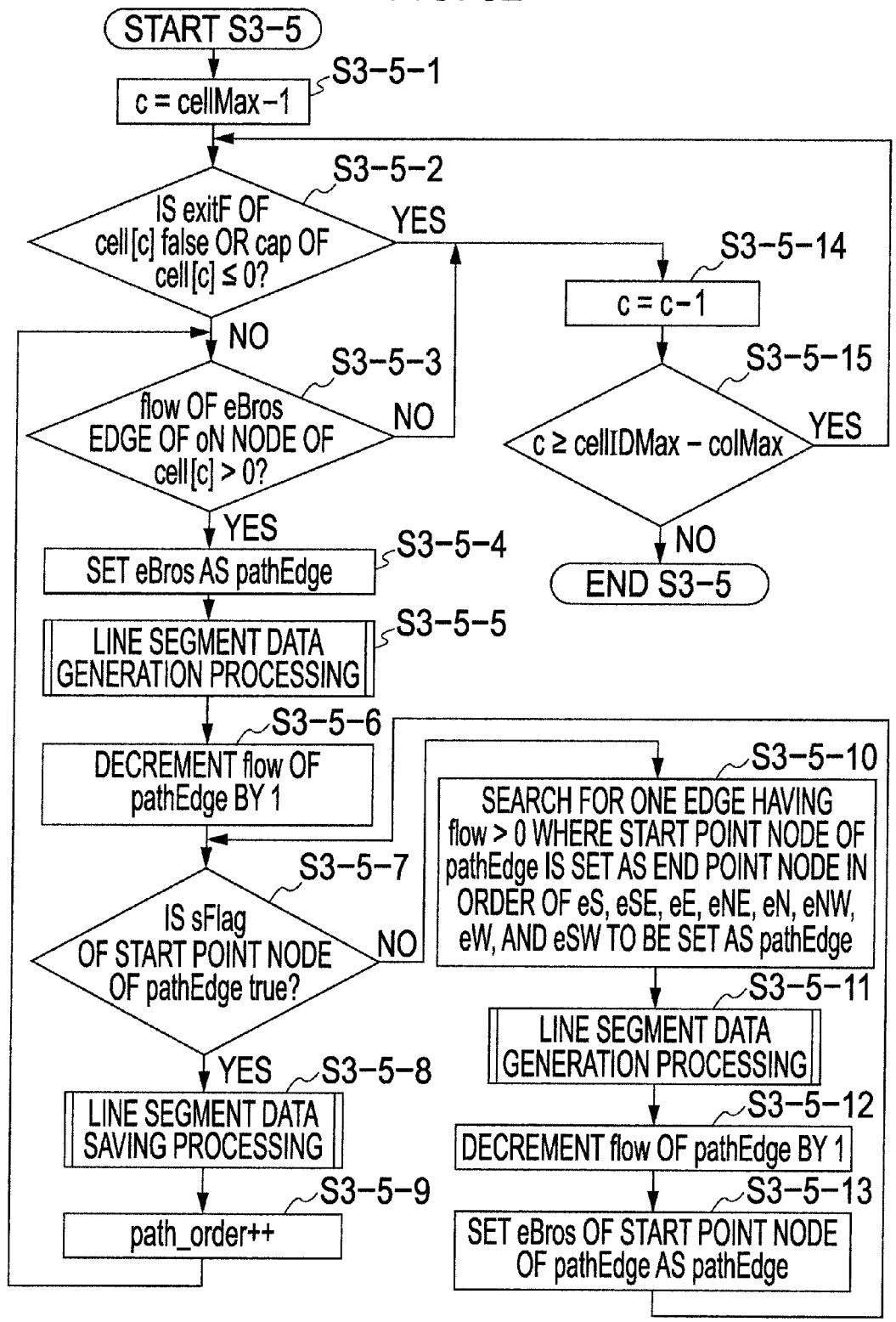
FIG. 52 is a flow chart for describing a processing procedure of the determination processing for the global routing on the basis of the search path where the south side of the cell matrix is set as the exit.

Also, FIG. 52 is a flow chart for describing a processing procedure of the determination processing for the global routing on the basis of the search path where the south side of the cell matrix is set as the exit. That is, FIG. 52 is a flow chart for describing step S3-5 in detail. In FIG. 52, for the cells belonging to the south edge row on the cell array, from the east edge column towards the west edge column (that is, in the clockwise direction), the exit of the search path is searched for (see S3-5-1, S3-5-14, and S3-5-15).

Also, in step S3-5-10, as the directed edge located on the right side of the traveling direction of the trace is selected with priority, the directed edge is searched for in the order of the directed edge with the node of the cell adjacent in the south (eS), the directed edge with the node of the south east cell (eSE), the directed edge with the node of the cell adjacent in the east (eE), the directed edge with the node of the north east cell (eNE), the directed edge with the node of the cell adjacent in the north (eN), the directed edge with the node of the north west cell (eNW), the directed edge with the node of the cell adjacent in the west (eW), and the directed edge with the node of the south west cell (eSW).

Figure 53:
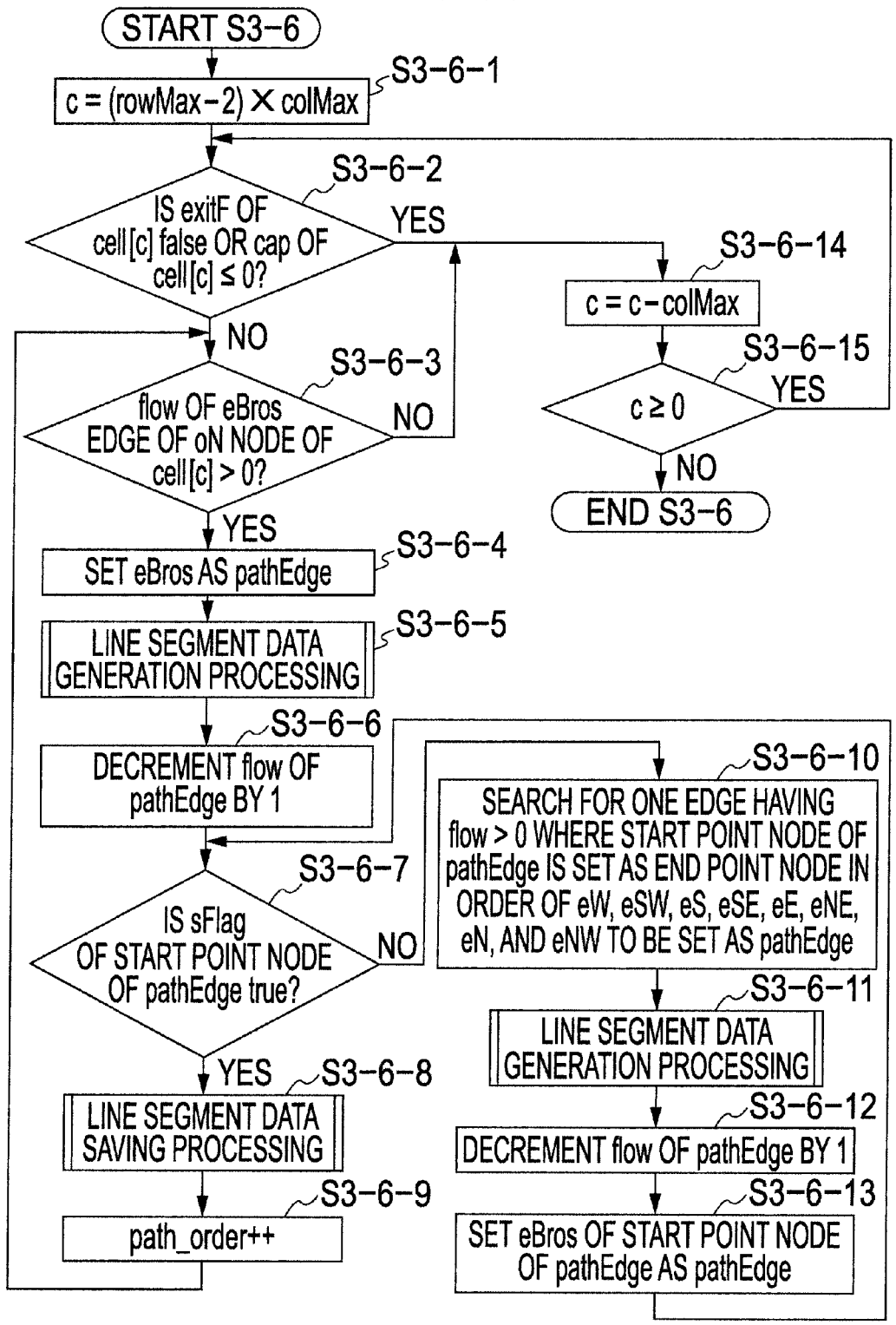
FIG. 53 is a flow chart for describing a processing procedure of the determination processing for the global routing on the basis of the search path where the west side of the cell matrix is set as the exit.

Also, FIG. 53 is a flow chart for describing a processing procedure of the determination processing for the global routing on the basis of the search path where the west side of the cell matrix is set as the exit. That is, FIG. 53 is a flow chart for describing step S3-6 in detail. In FIG. 53, for the cells belonging to the west edge column on the cell array, from the south edge row towards the north edge row (that is, in the clockwise direction), the exit of the search path is searched for (see S3-6-1, S3-6-14, and S3-6-15).

Also, in step S3-6-10, as the directed edge located on the right side of the traveling direction of the trace is selected with priority, the directed edge is searched for in the order of the directed edge with the node of the cell adjacent in the west (eW), the directed edge with the node of the south west cell (eSW), the directed edge with the node of the cell adjacent in the south (eS), the directed edge with the node of the south east cell (eSE), the directed edge with the node of the cell adjacent in the east (eE), the directed edge with the node of the north east cell (eNE), the directed edge with the node of the cell adjacent in the north (eN), and the directed edge with the node of the north west cell (eNW).

It may be noted that in the above, the example has been illustrated where all the outer circumferential cells on the cell array are scanned to search for the exit of the search path. However, the node connected by the target node T and the directed edge is set as the exit of the search path, and the trace of the directed edge may be performed from the relevant node. The relevant node can be identified on the basis of the edge data registered in tagetEdgeList of the node data on the target node T. In a case where the plural relevant nodes exist, while following a certain direction on the outer circumference of the cell array (clockwise direction according to the present embodiment), the nodes to be traced may be selected in order.

Also, according to the present embodiment, the description has been given while the saving destination for the cell data, the node data, the line segment data, the leading-out order data and the like is the auxiliary storage apparatus 102, but the saving mode is not limited to a particular mode. This may be a simple file or database. Also, the respective pieces of data may be saved in an apparatus connected to the routing path creation supporting apparatus 10 via a network.

Also, according to the present embodiment, the BGA is utilized as a specific example of the integrated circuit package. It is however noted that the present embodiment can be similarly applied to another integrated circuit package.

As described above, with the routing path creation supporting apparatus 10 according to the present embodiment, for the global routing of the integrated circuit package such as the BGA where the pins are arranged in a high density, it is possible to generate the directed graph (Flow network) constituted by the directed edges having a capacity guaranteeing an accommodation property of the leading-out routing path. Therefore, the path search is performed on the basis of such a directed graph (Flow network), and further the global path is determined, so that it is possible to correctly represent the upper limit of the wiring accommodating lines between the pins. Thus, it is possible to avoid generation of more than the allowable number of the global paths at the time of the global routing and also prevent occurrence of a situation where the routing cannot be performed owing to a rule violation when the global path is put in detail. In particular, by arranging the bottlenecks between horizontal pins or vertical pins as well as between the diagonal pins, the accommodation property of the routing path between the diagonal pins can also be appropriately guaranteed. Similarly, by arranging the bottlenecks for the empty pins, the accommodation of the routing path can also be appropriately guaranteed for the empty pin locations. Also, in a case where the exit of the wiring is limited to a particular location, by setting the capacity of the bottleneck location (cell) related to the exit of the wiring as 0, the exit of the global routing can be appropriately limited.

Also, the leading-out order is assigned to the respective global paths as the information indicating the relative positional relation between the respective wirings. That is, by deciding the positions for the wiring between the pins or the like while following the leading-out order, it is possible to prevent intersection (short circuit) of the respective wirings between the pins or the like. To be specific, in the case according to the present embodiment, the wiring with a smaller leading-out order may be affixed on the north side or the east side. With this configuration, the cross of the respective wirings can be prevented.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A wiring design apparatus for designing a plurality of wiring lines of a printed circuit board including a plurality of connection posts arranged in a matrix, comprising:
  a memory for storing information of locations of both ends of each of the wiring lines; and
  a processor for determining the design of the wiring lines by carrying out a process comprising:
    providing an orthogonal grid including a plurality of rows and columns running over and between the connection posts;
    providing a plurality of diagonal paths each connecting at least one of the rows with at least one of the columns, wherein each diagonal path of the plurality of diagonal paths runs between each of adjacent pairs of the connection posts; and
    determining a route for each of the wiring lines by exclusively allocating to each of the wiring lines a selected part of the rows, the columns and the paths so that the selected part connects both ends of each of the wiring lines.

2. A wiring design apparatus for designing a plurality of wiring lines of a printed circuit board including a plurality of connection posts arranged in a matrix, comprising:
  a memory for storing information of locations of both ends of each of the wiring lines; and
  a processor for determining the design of the wiring lines by carrying out a process comprising:
    providing an orthogonal grid including a plurality of rows and columns running over and between the connection posts;
    providing a plurality of diagonal paths each connecting at least one of the rows with at least one of the columns each running between each of adjacent pairs of the connection posts; and
    determining a route for each of the wiring lines by exclusively allocating to each of the wiring lines a selected part of the rows, the columns and the paths so that the selected part connects both ends of each of the wiring lines,
  wherein the processor determines the route for each of the wiring lines so that the number of wiring lines running over each of the paths become below a predetermined number.

3. A wiring design apparatus for designing a plurality of wiring lines of a printed circuit board including a plurality of connection posts arranged in a matrix, comprising:
  a memory for storing information of locations of both ends of each of the wiring lines; and
  a processor for determining the design of the wiring lines by carrying out a process comprising:

providing an orthogonal grid including a plurality of rows and columns running over and between the connection posts;

providing a plurality of diagonal paths each connecting at least one of the rows with at least one of the columns each running between each of adjacent pairs of the connection posts; and determining a route for each of the wiring lines by exclusively allocating to each of the wiring lines a selected part of the rows, the columns and the paths so that the selected part connects both ends of each of the wiring lines, wherein the memory further stores a first number and a second number, and the processor determines the route for each of the wiring lines, so that the number of wiring lines running over the selected each of the paths is below the first number and the number of wiring lines running over the selected each of the rows and columns is below the second number.

4. The wiring design apparatus according to claim 3, wherein the memory further stores a first number and a second number, the processor determines the route for each of the wiring lines, so that the number of wiring lines running over the selected each of the paths is below the first number and the number of wiring lines running over the selected each of the rows and columns is below the second number.

5. A wiring design apparatus for designing a plurality of wiring lines of a printed circuit board including a plurality of connection posts arranged in a matrix, comprising:

a memory for storing information of locations of both ends of each of the wiring lines; and a processor for determining the design of the wiring lines by carrying out a process comprising:

providing an orthogonal grid including a plurality of rows and columns running over and between the connection posts;

providing a plurality of diagonal paths each connecting at least one of the rows with at least one of the columns each running between each of adjacent pairs of the connection posts; and determining a route for each of the wiring lines by exclusively allocating to each of the wiring lines a selected part of the rows, the columns and the paths so that the selected part connects both ends of each of the wiring lines, wherein the processor makes the wiring line allowance map of the printed circuit board, the wiring allowance map being a map which defines an allowable number of wiring lines running over in each of the rows, the columns, and the paths, and the processor determines the route for each of the wiring lines on the basis of the wiring line allowance map.

6. A wiring design method by using a computer for designing a plurality of wiring lines of a printed circuit board including a plurality of connection posts arranged in a matrix, the computer allowing access to a memory for storing information of locations of both ends of each of the wiring lines, the method comprising:

providing, using the computer, an orthogonal grid including a plurality of rows and columns running over and between the connection posts;

providing, using the computer, a plurality of diagonal paths each connecting at least one of the rows with at least one of the columns, wherein each diagonal path of the plurality of diagonal paths runs between each of adjacent pairs of the connection posts;

determining, using the computer, a route for each of the wiring lines by exclusively allocating to each of the wiring lines a selected part of the rows, the columns and the paths so that the selected part connects both ends of each of the wiring lines.

7. A non-transitory computer-readable medium for storing instructions, which, when executed by a processor, perform designing a plurality of wiring lines of a printed circuit board, the printed circuit board including a plurality of connection posts arranged in a matrix for managing a plurality of nodes, the processor allowing access to a memory for storing information of locations of both ends of each of the wiring lines, the computer readable medium comprising instructions for:

providing an orthogonal grid including a plurality of rows and columns running over and between the connection posts;

providing a plurality of diagonal paths each connecting at least one of the rows with at least one of the columns, wherein each diagonal path of the plurality of diagonal paths runs between each of adjacent pairs of the connection posts; and determining a route for each of the wiring lines by exclusively allocating to each of the wiring lines a selected part of the rows, the columns and the paths so that the selected part connects both ends of each of the wiring lines.

* * * * *